United States Patent
Ju et al.

(10) Patent No.: US 9,059,395 B2
(45) Date of Patent: Jun. 16, 2015

(54) RESISTIVE RANDOM ACCESS MEMORY DEVICES HAVING VARIABLE RESISTANCE LAYERS AND RELATED METHODS

(71) Applicants: Hyunsu Ju, Hwaseong-si (KR); Eunmi Kim, Hwaseong-si (KR); Yoocheol Shin, Hwaseong-si (KR); Min Kyu Yang, Hwaseong-si (KR); Jungdal Choi, Hwaseong-si (KR)

(72) Inventors: Hyunsu Ju, Hwaseong-si (KR); Eunmi Kim, Hwaseong-si (KR); Yoocheol Shin, Hwaseong-si (KR); Min Kyu Yang, Hwaseong-si (KR); Jungdal Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/090,803

(22) Filed: Nov. 26, 2013

(65) Prior Publication Data
US 2014/0145137 A1    May 29, 2014

(30) Foreign Application Priority Data

Nov. 28, 2012  (KR) .......................... 10-2012-0136333

(51) Int. Cl.
*H01L 29/02*   (2006.01)
*H01L 45/00*   (2006.01)
*H01L 27/24*   (2006.01)

(52) U.S. Cl.
CPC ............ *H01L 45/08* (2013.01); *H01L 45/1233* (2013.01); *H01L 45/146* (2013.01); *H01L 27/2454* (2013.01); *H01L 27/2481* (2013.01)

(58) Field of Classification Search
CPC ....... H01L 45/00; H01L 27/115; H01L 27/24; H01L 29/792; H01L 29/66
USPC ................... 257/2, 324, 5, E29.309; 438/478
See application file for complete search history.

(56) References Cited

U.S. PATENT DOCUMENTS

| | | | |
|---|---|---|---|
| 7,742,331 B2 | 6/2010 | Watanabe | |
| 7,995,374 B2 * | 8/2011 | Komura et al. | 365/148 |
| 8,115,245 B2 * | 2/2012 | Yoshimizu et al. | 257/315 |
| 8,143,146 B2 * | 3/2012 | Kiyotoshi | 438/482 |
| 8,154,004 B2 * | 4/2012 | Seyyedy et al. | 257/4 |
| 8,299,571 B2 | 10/2012 | Ozawa et al. | |

(Continued)

FOREIGN PATENT DOCUMENTS

| | | |
|---|---|---|
| JP | 2010-251479 | 11/2010 |
| JP | 2012-028590 | 2/2012 |

(Continued)

OTHER PUBLICATIONS

Kinoshita et al., "Sealable 3-D vertical chain-cell-type phase-change memory with $4F^2$ poly-Si diodes," 2012 Symposium on VLSI Technology Digest of Technical Papers, pp. 35-36.

*Primary Examiner* — Caleb Henry
(74) *Attorney, Agent, or Firm* — Myers Bigel Sibley & Sajovec

(57) ABSTRACT

Resistive memory devices are provided having a gate stack including insulating layers and gates stacked on a substrate in a vertical direction, a channel penetrating the gate stack in the vertical direction to be electrically connected to the substrate, a gate insulating layer provided between the channel and the gates, and a variable resistance layer disposed along an extending direction of the channel. The gate stack may include an alcove formed by recessing the gate in a horizontal direction. The variable resistance layer may extend toward the alcove in the horizontal direction and be overlapped with at least one of the gates in the horizontal direction. Related methods are also provided.

12 Claims, 60 Drawing Sheets

(56) References Cited

U.S. PATENT DOCUMENTS

| | | | |
|---|---|---|---|
| 8,374,033 B2 * | 2/2013 | Kito et al. | 365/185.18 |
| 8,441,040 B2 * | 5/2013 | Minemura et al. | 257/210 |
| 8,546,780 B2 * | 10/2013 | Iijima et al. | 257/2 |
| 8,565,007 B2 * | 10/2013 | Murooka | 365/148 |
| 8,569,731 B2 * | 10/2013 | Konno et al. | 257/4 |
| 8,575,589 B2 * | 11/2013 | Nagashima et al. | 257/5 |
| 8,649,225 B2 * | 2/2014 | Nagadomi | 365/185.29 |
| 8,654,586 B2 * | 2/2014 | Kito et al. | 365/185.18 |
| 2007/0158736 A1 * | 7/2007 | Arai et al. | 257/315 |
| 2009/0121208 A1 * | 5/2009 | Nagashima et al. | 257/2 |
| 2009/0283737 A1 * | 11/2009 | Kiyotoshi | 257/2 |
| 2010/0054040 A1 * | 3/2010 | Song | 365/185.18 |
| 2010/0061145 A1 * | 3/2010 | Weis | 365/163 |
| 2010/0078622 A1 * | 4/2010 | Yoshimizu et al. | 257/4 |
| 2011/0069525 A1 * | 3/2011 | Fukumizu et al. | 365/63 |
| 2011/0101443 A1 * | 5/2011 | Huo et al. | 257/324 |
| 2011/0122676 A1 * | 5/2011 | Murooka et al. | 365/148 |
| 2011/0199813 A1 | 8/2011 | Yoo et al. | |
| 2011/0204309 A1 * | 8/2011 | Nitta | 257/2 |
| 2011/0235408 A1 * | 9/2011 | Minemura et al. | 365/163 |
| 2011/0241225 A1 * | 10/2011 | Nagashima et al. | 257/786 |
| 2011/0303958 A1 * | 12/2011 | Matsuo et al. | 257/314 |
| 2011/0303971 A1 * | 12/2011 | Lee et al. | 257/324 |
| 2011/0305074 A1 * | 12/2011 | Lung et al. | 365/163 |
| 2011/0306199 A1 * | 12/2011 | Nojiri et al. | 438/618 |
| 2012/0061637 A1 * | 3/2012 | Cai et al. | 257/1 |
| 2012/0112156 A1 * | 5/2012 | Park et al. | 257/5 |
| 2012/0161094 A1 * | 6/2012 | Huo et al. | 257/4 |
| 2013/0032875 A1 * | 2/2013 | Yun et al. | 257/324 |
| 2013/0056820 A1 * | 3/2013 | Jeong | 257/324 |
| 2013/0334594 A1 * | 12/2013 | Imonigie et al. | 257/326 |
| 2014/0035026 A1 * | 2/2014 | Jang et al. | 257/324 |
| 2014/0070302 A1 * | 3/2014 | Yoo et al. | 257/324 |
| 2014/0097484 A1 * | 4/2014 | Seol et al. | 257/324 |
| 2015/0001460 A1 * | 1/2015 | Kim et al. | 257/5 |
| 2015/0008506 A1 * | 1/2015 | Yang et al. | 257/324 |

FOREIGN PATENT DOCUMENTS

| | | |
|---|---|---|
| JP | 2012-074542 | 4/2012 |
| KR | 1020120073435 A | 7/2012 |

\* cited by examiner

RESISTIVE RANDOM ACCESS MEMORY DEVICES HAVING VARIABLE RESISTANCE LAYERS AND RELATED METHODS

CROSS-REFERENCE TO RELATED APPLICATION

This U.S. non-provisional patent application claims priority under 35 U.S.C. §119 to Korean Patent Application No. 10-2012-0136333, filed on Nov. 28, 2012, in the Korean Intellectual Property Office, the entire contents of which is hereby incorporated herein by reference as if set forth in its entirety.

FIELD

The present inventive concept relates generally to semiconductor devices and, more particularly, to resistive memory devices and methods of fabricating the same.

BACKGROUND

When a variable resistance layer is applied with a voltage, resistance of the variable resistance layer may be significantly changed depending on the polarity of the applied voltage. This effect may be utilized to store data in a memory device. For example, the variable resistance layer may be used to realize resistive memory devices with a nonvolatile property.

SUMMARY

Some embodiments of the inventive concept provide a resistive memory device with improved electric characteristics and a method of fabricating the same.

According to some embodiments of the inventive concept, gates may be vertically stacked and horizontally recessed, and a variable resistance layer is formed to have protrusions extending toward the recessed gates.

According to some embodiments of the inventive concept, a channel is formed to extend vertically and horizontally along the recessed gates, and the protrusion of the variable resistance layer is formed to cross a portion of the channel extending along the vertical direction.

According to some embodiments of the inventive concept, a filament may be formed in the protrusion of the variable resistance layer. The filament makes it possible to form a vertical current path.

According to some embodiments of the inventive concepts, a resistive memory device may include a gate stack including insulating layers and gates stacked on a substrate in a vertical direction, a channel penetrating the gate stack in the vertical direction to be electrically connected to the substrate, a gate insulating layer provided between the channel and the gates, and a variable resistance layer disposed along an extending direction of the channel. The gate stack may include an alcove formed by recessing the gate in a horizontal direction, and the variable resistance layer extends toward the alcove in the horizontal direction and is overlapped with at least one of the gates in the horizontal direction.

In some embodiments, the variable resistance layer may include a vertical layer extending along the channel in the vertical direction, and a protrusion extending from the vertical layer in the horizontal direction.

In some embodiments, the channel may include a first channel portion extending along the insulating layer in the vertical direction to be overlapped with the protrusion in the vertical direction, a second channel portion extending along the gate in the vertical direction to be overlapped with the gate in the horizontal direction, the second channel portion being located in the alcove, and a third channel portion provided in the alcove to connect the first channel portion with the second channel portion along the horizontal direction. The channel extends continuously along the vertical direction in the gate stack.

In some embodiments, the vertical layer of the variable resistance layer extends along the first channel portion in the vertical direction, and the protrusion of the variable resistance layer may be inserted into the alcove to have a length greater than a thickness of the first channel portion.

In some embodiments, the vertical layer of the variable resistance layer extends along the first channel portion in the vertical direction, and the protrusion of the variable resistance layer may be not inserted into the alcove and has a length that may be equivalent to or smaller than a thickness of the first channel portion.

In some embodiments, the second channel portion may have a thickness smaller than those of the first and third channel portions.

In some embodiments, the gate has a length greater than that of the second channel portion.

In some embodiments, the gate insulating layer may be provided to have one of a continuous structure and an island-shaped structure.

In some embodiments, the gate insulating layer of the continuous structure may include a first gate insulating layer disposed between a side surface of the insulating layer and the first channel portion, a second gate insulating layer disposed in the alcove and between the gate and the second channel portion, and a third gate insulating layer disposed in the alcove to connect the first gate insulating layer with the second gate insulating layer in the horizontal direction. The second gate insulating layer may have a thickness greater than those of the first and third gate insulating layers.

In some embodiments, the gate insulating layer of the island-shaped structure may be inserted between the gate and the second channel portion.

In some embodiments, the variable resistance layer may include a plurality of protrusions to be inserted into the alcove, and the protrusions may be discontinuously arranged along the extending direction of the channel in the vertical direction.

According to some embodiments of the inventive concepts, a method of fabricating a resistive memory device may include stacking insulating layers and sacrificial layers on a substrate, forming a vertical hole vertically penetrating the insulating and sacrificial layers, horizontally recessing the sacrificial layers to form an alcove around the vertical hole, forming a channel curvedly extending along an inner surface of the alcove, forming a variable resistance layer extending toward the alcove and horizontally crossing the channel, and replacing the sacrificial layers with gates. The variable resistance layer may be horizontally overlapped with at least one of the gates.

In some embodiments, the forming of the variable resistance layer may include filling the vertical hole including the channel with a transition metal oxide to form a vertical layer vertically extending along the vertical hole and a protrusion extending from the vertical layer and protruding toward the alcove. The variable resistance layer may be provided in the vertical hole to extend vertically along a stacking direction of the gates and to have a cup-shaped structure with a closed bottom and an open top or a pillar-shaped structure completely filling the vertical hole.

In some embodiments, the forming of the variable resistance layer may include filling the vertical hole including the channel with a transition metal oxide to form a vertical layer vertically extending along the vertical hole and a protrusion extending from the vertical layer and protruding toward the alcove, and selectively removing the vertical layer. The variable resistance layer may be a plurality of protrusions that may be discontinuously arranged along a stacking direction of the gates in the vertical hole.

In some embodiments, the replacing of the sacrificial layer with the gates may include patterning the sacrificial layers and the insulating layers to form a trench exposing the substrate, selectively removing the sacrificial layers exposed by the trench to form spaces between the insulating layers; and filling the spaces with a conductive layer to form the gates.

In some embodiments, the method may further include a gate insulating layer between the channel and the gates.

In some embodiments, the forming of the gate insulating layer may include forming a deposition layer covering an inner sidewall of the vertical hole and the substrate, before the formation of the channel, and then, selectively etching the deposition layer from the substrate.

In some embodiments, the forming of the gate insulating layer may include thermally oxidizing a side surface of the channel exposed by the spaces.

In some embodiments, the forming of the gate insulating layer may include forming a deposition layer covering an inner sidewall of the vertical hole and the substrate, before the formation of the channel, and then, selectively etching the deposition layer from the substrate. Further, after the formation of the spaces, the gate insulating layer exposed by the spaces may be removed to expose the channel, and a thermal oxidation process may be performed to the exposed channel.

BRIEF DESCRIPTION OF THE DRAWINGS

Some embodiments will be more clearly understood from the following brief description taken in conjunction with the accompanying drawings. The accompanying drawings represent non-limiting, some embodiments as described herein.

Figure 1:
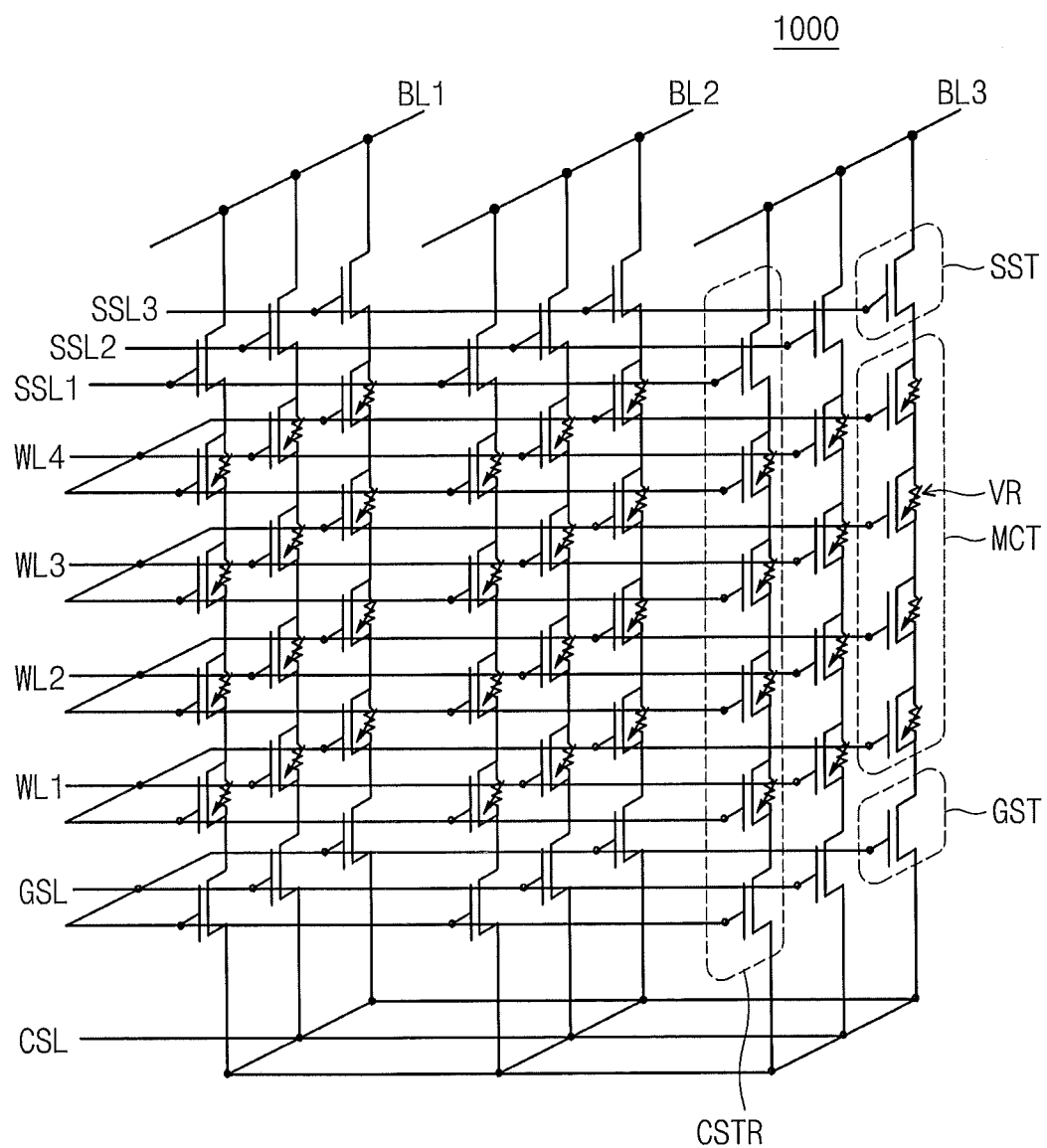
FIG. 1 is an equivalent circuit diagram of a resistive memory device according to some embodiments of the present inventive concept.

It should be noted that these figures are intended to illustrate the general characteristics of methods, structure and/or materials utilized in certain some embodiments and to supplement the written description provided below. These drawings are not, however, to scale and may not precisely reflect the precise structural or performance characteristics of any given embodiment, and should not be interpreted as defining or limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EMBODIMENTS

Some embodiments of the inventive concepts will now be described more fully with reference to the accompanying drawings, in which some embodiments are shown. Some embodiments of the inventive concepts may, however, be embodied in many different forms and should not be construed as being limited to the embodiments set forth herein; rather, these embodiments are provided so that this disclosure will be thorough and complete, and will fully convey the concept of some embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of some embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of some embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Some embodiments of the inventive concepts are described herein with reference to cross-sectional illustrations that are schematic illustrations of idealized embodiments (and intermediate structures) of some embodiments. As such, variations from the shapes of the illustrations as a result, for example, of manufacturing techniques and/or tolerances, are to be expected. Thus, some embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of some embodiments.

Unless otherwise defined, all terms (including technical and scientific terms) used herein have the same meaning as commonly understood by one of ordinary skill in the art to which some embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Referring now to FIG. 1, an equivalent circuit diagram of a resistive memory device according to some embodiments of the inventive concept will be discussed. As illustrated in FIG. 1, a semiconductor memory device 1000 may include a common source line CSL, a plurality of bit lines BL1, BL2, and BL3, and a plurality of cell strings CSTR provided between the common source line CSL and the bit lines BL1-BL3.

The bit lines BL1-BL3 may be two-dimensionally arranged on a substrate and a plurality of the cell strings CSTR may be connected in parallel to each of the bit lines BL1-BL3. The cell strings CSTR may be connected in common to the common source line CSL. In some embodiments, the common source line CSL may include a plurality of lines two-dimensionally arranged on the substrate.

Each of the cell strings CSTR may include a ground selection transistor GST connected to the common source line CSL, a string selection transistor SST electrically connected to the corresponding one of the bit lines BL1-BL3, and a plurality of memory cell transistors MCT vertically arranged between the ground and string selection transistors GST and SST. The ground selection transistor GST, the string selection transistor SST, and the memory cell transistors MCT may be connected in series. The common source line CSL may be electrically connected in common to a plurality of the ground selection transistors GST.

In some embodiments, the semiconductor memory device 1000 may include a plurality of string selection lines SSL1, SSL2, and SSL3, whose electrical operations are controlled independently. Each of the string selection lines SSL1-SSL3 may be provided to serve as a gate electrode of the string selection transistor SST. A ground selection line GSL may be provided to serve as a gate electrode of the ground selection transistor UST. Word lines WL1, WL2, WL3, and WL4 may be provided to serve as gate electrodes of the memory cell transistors MCT. In some embodiments, the ground selection line GSL may include a plurality of lines that can be controlled independently, like the string selection lines SSL1-SSL3.

In some embodiments, the semiconductor memory device 1000 may be a vertical resistive RAM device including the memory cell transistors MCT, which are vertically stacked on the substrate, and each of which includes a variable resistor VR as a data storage element.

Figure 2:
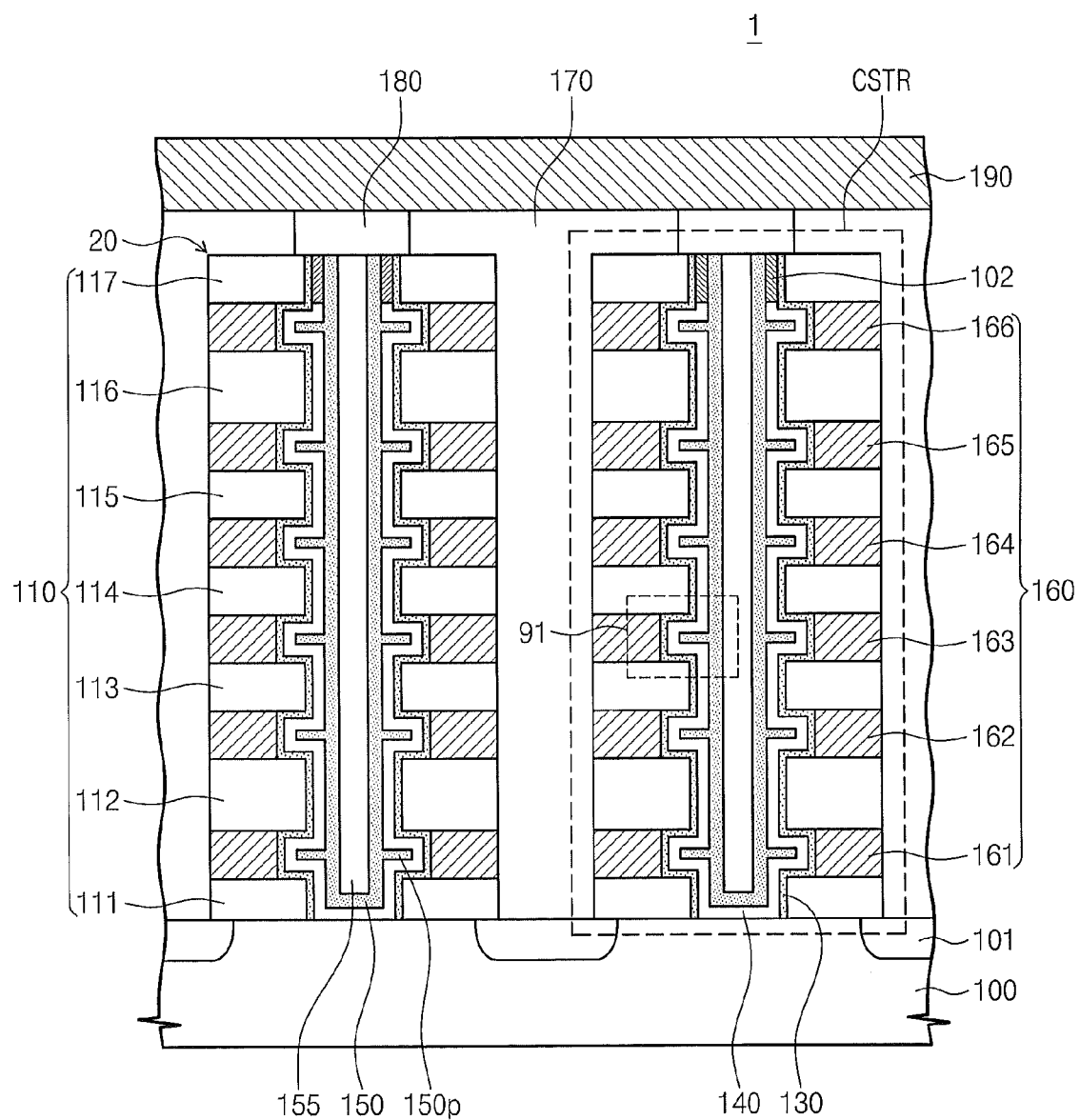
FIG. 2 is a cross section illustrating a resistive memory device according to some embodiments of the inventive concept.

Several resistive memory devices corresponding to the equivalent circuit diagram of FIG. 1 will be discussed below. Referring first to FIG. 2, a cross section illustrating a resistive memory device according to some embodiments of the inventive concept will be discussed. As illustrated in FIG. 2, a first resistive memory device 1 may include at least one gate stacks 20 provided on a substrate 100, at least one channel 140 which penetrates the gate stack 20 to be electrically connected to the substrate 100, at least one variable resistance layer 150 which extends along the channel 140 and contacts the channel 140, and at least one bit line 190 electrically connected to the channel 140. The first resistive memory device 1 may further include an interlayered insulating layer 170 which may be provided between adjacent ones of the gate stacks 20 and between the gate stack 20 and the bit line 190, and at least one plug 180 penetrating the interlayered insulating layer 170 to electrically connect the channel 140 with the bit line 190.

The substrate 100 may include a single crystalline silicon wafer having a first conductivity type (e.g., P-type). The substrate 100 may include a common source electrode 101 provided between adjacent ones of the gate stacks 20. The common source electrode 101 may be doped to have a different conductivity type (e.g., a second conductivity type or N-type) from that of the substrate 100. The common source electrode 101 may extend substantially perpendicular to a longitudinal direction of the bit line 190 or along a front-back direction. For example, the common source electrode 101 may extend in a front-back direction and the bit line 190 may extend in a left-right direction. In FIG. 2, the front-back direction is out of and into the page.

The gate stack 20 may include insulating mold layers 110 and gates 160, which may be sequentially stacked along a longitudinal direction (e.g., vertical direction) of the channel 140. The gate stack 20, the channel 140 penetrating the gate stack 20, and the variable resistance layer 150 in contact with the channel 140 may constitute the cell string CSTR. Two or more cell strings CSTR may be connected in parallel to each bit line 190 as shown in FIG. 2, but some embodiments of the inventive concepts may not be limited thereto.

A first gate 161, which is the lowermost one of the gates 160, may be used for the ground selection line GSL which controls an electrical connection between the common source electrode 101 and the channel 140, and a sixth gate 166, which is the uppermost one of the gates 160, may be used for the string selection lines SSL1-SSL3 which controls an electrical connection between the bit line 190 and the channel 140. Second to fifth gates 162-165, which are intermediate layers of the gates 160, may be used as word lines WL1-WL4 which are substantially engaged in storing information. The gates 160 may extend along a first horizontal direction (e.g., front-back direction) and the bit line 190 may extend along a second horizontal direction (e.g., left-right direction) that is substantially perpendicular to the first horizontal direction. The gates 160 may have the same or similar thickness (e.g., vertical length). The second to fifth gates 162-165 may constitute memory cells and the first and sixth gates 161 and 166 may constitute non-memory cells (e.g., selection devices). Each of the first and sixth gates 161 and 166 may include one conductive layer or multiple conductive layers (e.g., two conductive layers).

The insulating mold layers 110 may include a first insulating mold layer 111 between the substrate 100 and the first gate 161, second to sixth insulating mold layers 112-116 between the first gate 161 and the sixth gate 166, and a seventh insulating mold layer 117 provided on the sixth gate 166. In some embodiments, the insulating mold layers 110 may be formed to have the same or similar thickness. In some embodiments, at least one of the insulating mold layers 110 may have a different thickness from the others. For example, the second and sixth insulating mold layers 112 and 116 may have a relatively greater thickness, compared to the others.

Referring again to FIG. 1, the bit line 190 may correspond to one of the bit lines BL1-BL3, and the variable resistance layer 150 and the common source electrode 101 may correspond to the variable resistor VR and the common source line CSL, respectively. For example, in the cell string CSTR presented in the right-side of FIG. 2, the bit line 190, the first gate 161, the sixth gate 166, and the second to fifth gates 162-165 may correspond to elements of BL1, GSL, SSL1, and WL1-WL4 (provided between GSL and SSL1). In the cell string CSTR presented in the left-side of FIG. 2, the bit line 190, the first gate 161, the sixth gate 166, and the second to fifth gates 162-165 may correspond to elements of BL2, GSL, SSL2, and WL1-WL4 (provided between GSL and SSL2).

The channel 140 may include a bottom end portion electrically connected to the substrate 100 and a top end portion electrically connected to the bit line 190. The channel 140 may be shaped like a cup with a closed bottom and an open top. For example, the channel 140 may include a single-crystalline or poly-crystalline silicon layer, which may be undoped or doped to have the same conductivity type as the substrate 100 (e.g., P-type). The top end portion of the channel 140 may be electrically connected to the bit line 190 through the plug 180 and serve as a drain electrode 102. The drain electrode 102 may be doped to have the second conductivity type (e.g., N-type) that is the same as that of the common source electrode 101. A gate insulating layer 130 (e.g., silicon oxide) may be provided between the channel 140 and the gates 160. For example, the gate insulating layer 130 may be provided to protrude the gate stack 20 continuously and vertically.

The variable resistance layer 150 may be shaped like a cup with a closed bottom and an open top, like the channel 140. In these embodiments, an insulating gap-fill layer 155 may be provided in an internal space of the variable resistance layer 150. The insulating gap-fill layer 155 may include a silicon oxide layer. In other embodiments, the variable resistance layer 150 may be shaped like a solid pillar, and in this case, the formation of the insulating gap-fill layer 155 may be omitted. The variable resistance layer 150 may include a transition metal oxide, whose resistance is changed depending on polarity and/or intensity of electric field applied thereto or a voltage difference between both end portions thereof. For example, the variable resistance layer 150 may include at least one selected from the group consisting of oxides of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), and praseodymium (Pr).

According to the some embodiments, the gates 160 may be recessed laterally (i.e., in a direction parallel to the top surface of the substrate 100). The gate insulating layer 130 and the channel 140 may extend meanderingly due to the recessed profile of the gates 160. The variable resistance layer 150 may include at least one protrusion 150p protruding toward the gates 160. Hereinafter, a cell 91 of the first resistive memory device 1 will be described in more detail with reference to FIG. 3A.

Figure 3A:
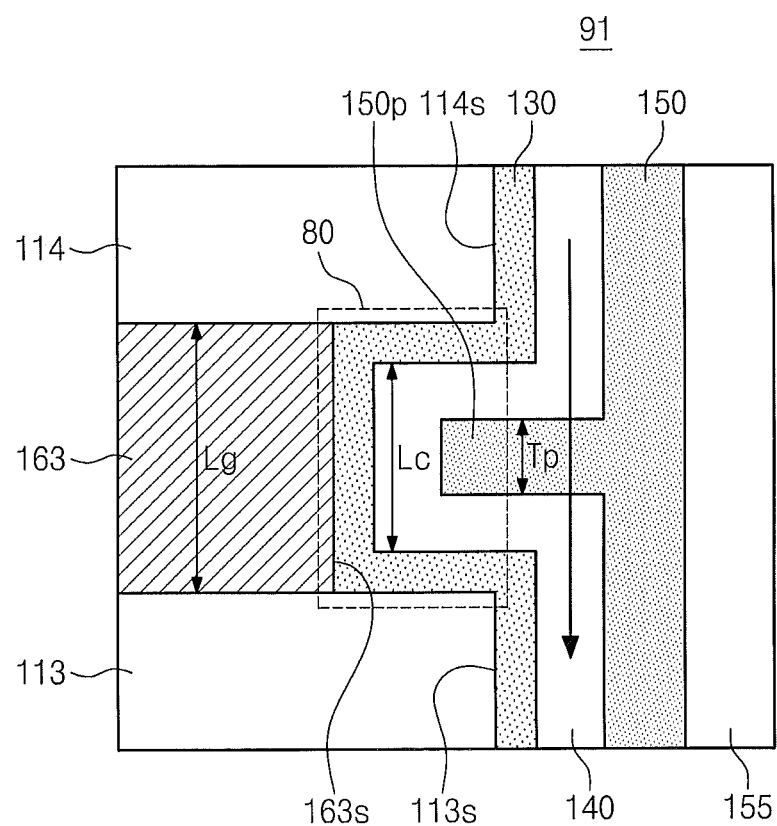
FIG. 3A is an enlarged cross section illustrating a portion of a memory cell of a resistive memory device according to some embodiments of the inventive concept.
Figure 3B:
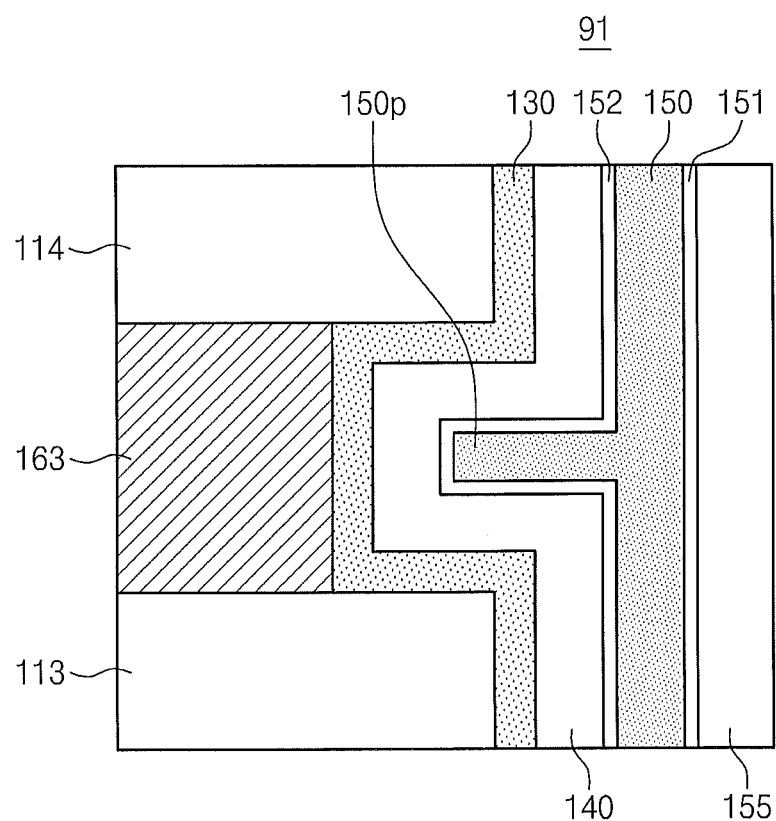
FIGS. 3B through 3D are cross sections illustrating modifications of FIG. 3A.
Figure 3C:
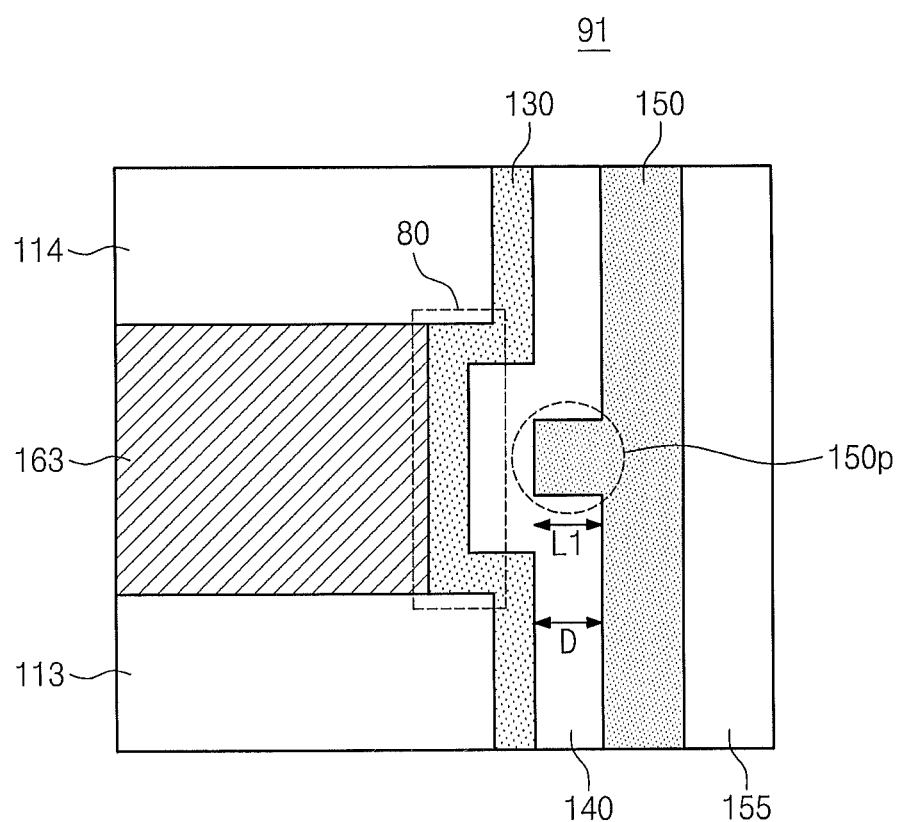
Figure 3D:
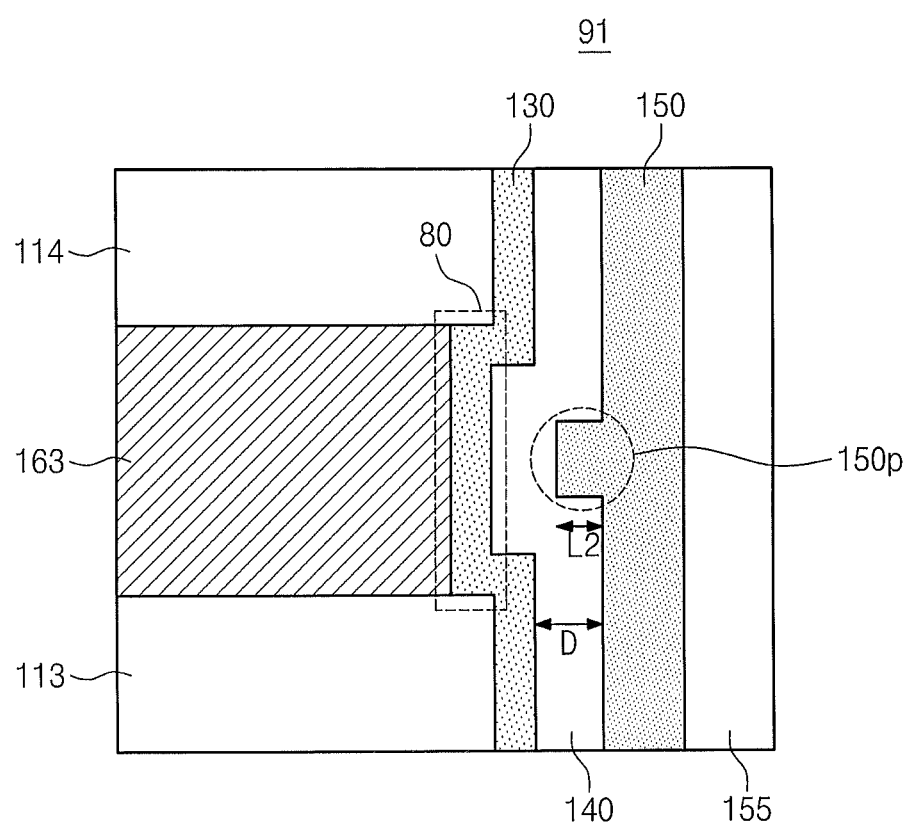

FIG. 3A is an enlarged cross section illustrating a portion of a memory cell of a resistive memory device according to some embodiments of the inventive concept. FIGS. 3B through 3D are cross sections illustrating modifications of FIG. 3A according to various embodiments of the inventive concept. Hereinafter, a memory cell associated with a third gate 163 will be described as an example of the memory cells of the resistive memory device, and it may be applied for other memory cells.

Referring now to FIG. 3A in conjunction with FIG. 2, the third gate 163 may be recessed in the direction (e.g., left-right direction) parallel to the top surface of the substrate 100, and thus, a side surface 163s of the third gate 163 may not be coplanar with a side surface 113s of a third insulating mold layer 113 and a side surface 114s of a fourth insulating mold layer 114. In other words, the side surface 163s of the third gate 163 may not be vertically aligned with the side surfaces 113s and 114s of the third and fourth insulating mold layers 113 and 114.

As the result of the recess of the third gate 163, an alcove 80 may be formed between the third and fourth insulating mold layers 113 and 114. The gate insulating layer 130 may extend alternatingly in the vertical and horizontal directions. For example, the gate insulating layer 130 may include vertical portions extending along the side surfaces 113s and 114s of the third and fourth insulating mold layers 113 and 114, and a bracket-shaped portion connecting the vertical portions to each other and covering an inner surface of the alcove 80. The gate insulating layer 130 may be conformally formed to have substantially the same deposition thickness. In other embodiments, the deposition thickness of the gate insulating layer 130 may be greater on the side surface 163s of the third gate 163 than on the other portions.

The channel 140 may have a shape alternatingly extending along the vertical and horizontal directions, similar or identical to the gate insulating layer 130. For example, the channel 140 may include vertical portions extending along the side surfaces 113s and 114s of the third and fourth insulating mold layers 113 and 114, and a bracket-shaped portion covering an inner surface of the alcove 80. Accordingly, the third gate 163 may be wider than a length Lc of the channel 140. Even if a space between the insulating mold layers 113 and 114 and the length Lc of the channel 140 are reduced, it is possible to obtain a relatively large gate length Lg such that transistor reliability may be improved. The channel 140 may be conformally formed to have substantially the same deposition thickness. In some embodiments, the deposition thickness of the channel 140 may be greater on the side surface 163s of the third gate 163 than on the other portions.

The variable resistance layer 150 may extend vertically along the side surfaces 113s and 114s of the third and fourth insulating mold layers 113 and 114. According to some embodiments, the variable resistance layer 150 may include the protrusion 150p protruding toward the alcove 80. The protrusion 150p of the variable resistance layer 150 may cross the vertical portions of the channel 140 to be inserted into the alcove 80. The protrusion 150p may be vertically overlapped with the third and fourth insulating mold layers 113 and 114. In this case, a length of the protrusion 150p may be greater than the thickness of the channel 140. According to some embodiments, although the channel 140 is not vertically extended, an electric current may flow vertically along the channel 140 through the protrusion 150p, as depicted by a solid arrow.

As will be discussed with reference to FIG. 4B, a filament 150f may be formed in the protrusion 150p to serve as an electric path. By changing a direction of an electric field applied to the protrusion 150p, it is possible to switch a resistance state of the cell 91 or to store/erase data in/from the cell 91. In some embodiments, a thickness Tp of the protrusion 150p may be scaled down to facilitate the formation of the filament 150f and realize easy switching operations. Further, a uniform electric field may be applied to the protrusion 150p, and thus, it is possible to improve electric characteristics of the device 1.

Referring to FIG. 3B, at least one of an oxygen exchange layer 151 and a barrier layer 152 may be further provided. The oxygen exchange layer 151 may be an oxide layer containing the same transition metal element as that in the variable resistance layer 150. The oxygen exchange layer 151 may be configured to exchange oxygen atoms with the variable resistance layer 150. For example, during writing operations, some of oxygen atoms bonded with transition metal atoms may be exhausted from the variable resistance layer 150 (i.e., reduction of the transition metal). Accordingly, the variable resistance layer 150 may vary from a high resistance state to a low resistance state. Here, the oxygen atoms to be exhausted from the variable resistance layer 150 may be moved into the oxygen exchange layer 151. During erase operations, oxygen atoms may be moved from the oxygen exchange layer 151 to the variable resistance layer 150 and be bonded with transition metals in the variable resistance layer 150 (i.e., oxidation of the transition metal). Accordingly, the variable resistance layer 150 may vary from the low resistance state to the high resistance state. The barrier layer 152 may be an oxide layer containing a transition metal element different from that in the variable resistance layer 150. Due to the presence of the barrier layer 152, it is possible to reduce the likelihood that oxygen atoms in the variable resistance layer 150 will move to the channel 140. The barrier layer 152 may be provided between the channel 140 and the variable resistance layer 150, and the oxygen exchange layer 151 may be provided between the variable resistance layer 150 and the insulating gap-fill layer 155 or between the barrier layer 152 and the variable resistance layer 150.

Referring to FIG. 3C, the protrusion 150p may cross the vertical portions of the channel 140 but not be inserted into the alcove 80. For example, the protrusion 150p may have a length L1 that is equivalent or similar to a deposition thickness D of the vertical portion of the channel 140. In some embodiments, the protrusion 150p may not be vertically overlapped with the third and fourth insulating mold layers 113 and 114.

Referring to FIG. 3D, the protrusion 150p may not be inserted into the alcove 80 and cross partially the vertical portion of the channel 140. For example, the protrusion 150p may have a length L2 that is smaller than the thickness D of the vertical portion of the channel 140.

The structure of the cell 91 may not be limited to those illustrated in FIGS. 3A through 3D and be variously modified as will be described below.

Figure 4A:
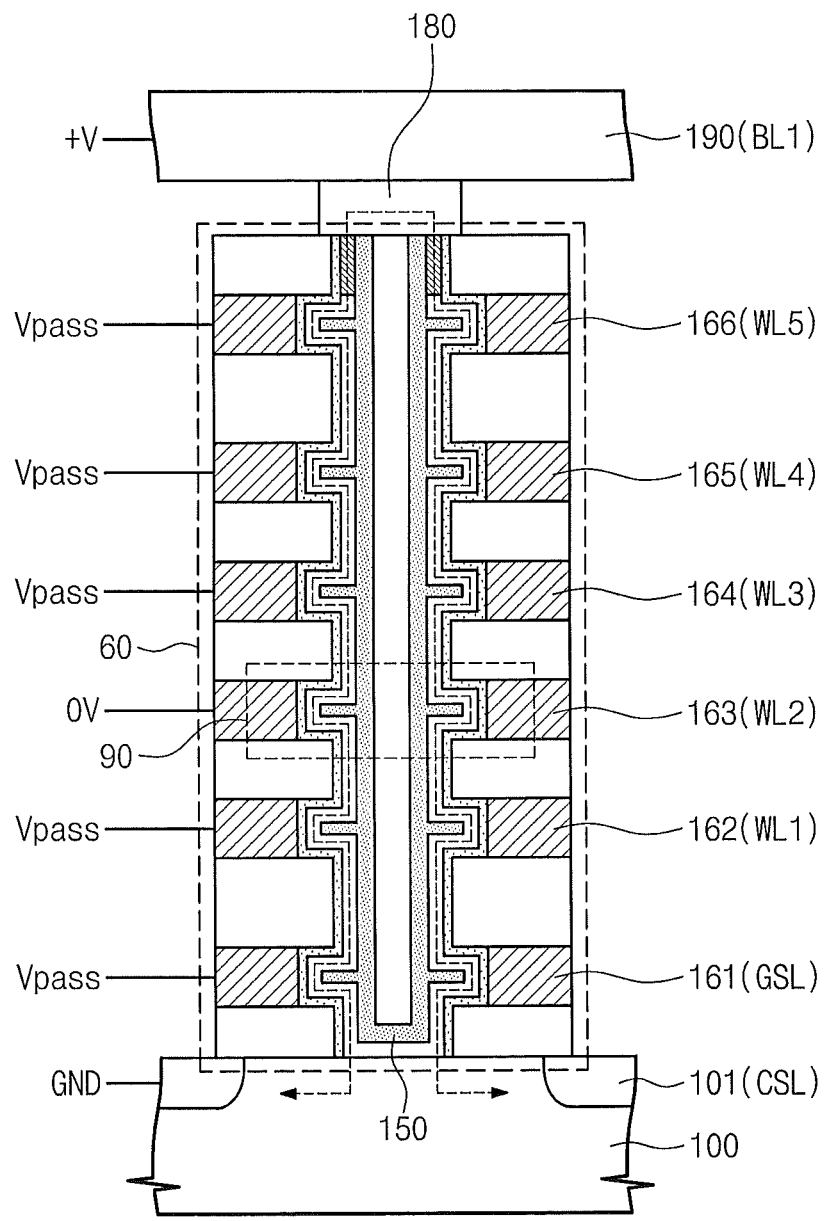
FIG. 4A is a cross section illustrating a portion of a resistive memory device according to some embodiments of the inventive concept.

FIG. 4A is a cross section illustrating a portion of a resistive memory device according to some embodiments of the inventive concept. FIG. 4B is a cross section illustrating a portion of a selected cell of a resistive memory device according to some embodiments of the inventive concept. FIG. 4C is a cross section illustrating a structure equivalent to that of FIG. 4B.

Referring to FIG. 4A in conjunction with FIG. 1, assume that a cell string 60 between the bit line BL1 and the common source line CSL is selected and a cell 90 controlled by a second word line WL2 is selected in the cell string 60. Write and erase operations may be performed to change resistance of the selected cell 90, and reading operations may be performed to read out an electric current, whose intensity is dependent on the resistance of the selected cell 90.

In the write operations, the selected cell 90 may be applied with a voltage (e.g., 0V) lower than a threshold voltage Vth to be turned off, while non-selected cells may be applied with a voltage Vpass that is greater than the threshold voltage to be turned on. In the write operations, the common source electrode 101 may be grounded, and the bit line 190 may be applied with a voltage (+V) capable of changing the selected cell 90 to the low resistance state. The bit lines BL2 and BL3 electrically connected to the non-selected cell strings may be applied with the same voltage (e.g., 0V) as that applied to the common source electrode 101. Some embodiments of the inventive concept may not be limited to the afore-described write voltage condition.

Figure 4B:
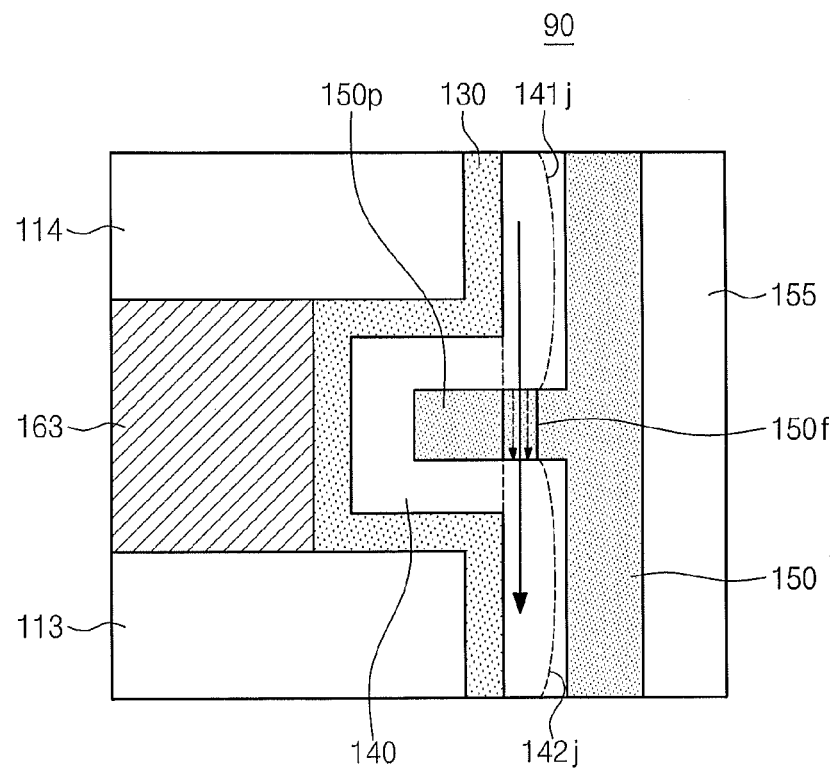
FIG. 4B is a cross section illustrating a portion of a selected cell of a resistive memory device according to some embodiments of the inventive concept.
Figure 4C:
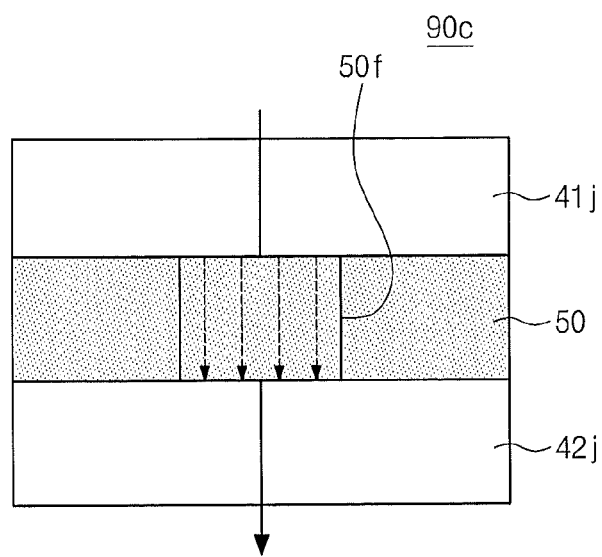
FIG. 4C is a cross section illustrating a structure equivalent to that of FIG. 4B.

Referring to FIG. 4B, as the result of the write voltage condition, junction regions 141*j* and 142*j* may be formed at the channel 140 adjacent to the third gate 163 by electric field (e.g., fringe field between the third gate 163 and the second and fourth gates 162 and 164 adjacent thereto). The voltage +V to be applied to the bit line 190 may be applied to the first junction region 141*j*, and the voltage 0V to be applied to the common source electrode 101 may be applied to the second junction region 142*j*. An electric field (dotted arrow) may be generated in the protrusion 150*p* by a voltage difference between the first and second junction regions 141*j* and 142*j*. Oxygen atoms in the protrusion 150*p* may be moved away by the electric field, and thus, the protrusion 150*p* may be reduced to transition metal. Due to the reduction, an electric path, such as the filament 150*f*, may be formed to penetrate vertically the protrusion 150*p*. The selected cell 90 with the filament 150*f* may be referred to '1' data or 'ON' state.

The current flow (solid arrow) in the selected cell string 60 may be meanderingly formed along the bracket-shaped channel 140 at the non-selected cells, as shown in FIG. 4A, and be vertically formed through the filament 150*f* of the protrusion 150*p* at the selected cell 90, as shown in FIG. 4B.

Even if the variable resistance layer 150 is disposed on side surfaces of the junction regions 141*j* and 142*j*, the filament 150*f* may be formed within the protrusion 150*p* between the first and second junction regions 141*j* and 142*j*. Accordingly, in the aspect of circuit, the selected cell 90 is equivalent to a cell 90*c* of FIG. 4C, in which a filament 50*f* may be produced by an electric field (dotted arrow) perpendicular to a variable resistance layer 50 between an upper electrode 41*j* and a lower electrode 42*j* and consequently a perpendicular current flow (solid arrow) may be formed.

In the erase operations, the selected cell 90 may be applied with a voltage (e.g., 0V) required for turning off the selected cell 90, and the non-selected cells may be applied with a voltage (Vpass) required for turning on the non-selected cells. In addition, the bit line 190 may be grounded, and the common source electrode 101 may be applied with the voltage (+V) capable of changing the selected cell 90 into the high resistance state. The bit lines BL2 and BL3 electrically connected to the non-selected cell strings may be applied with the same voltage (e.g., +V) as that applied to the common source electrode 101. Some embodiments of the inventive concept may not be limited to the afore-described erase voltage condition.

Under the erase voltage condition, the voltage (e.g., 0V) applied to the bit line 190 may be applied to the first junction region 141*j*, and the voltage (e.g., +V) applied to the common source electrode 101 may be applied to the second junction region 142*j*. A direction of the electric field may be changed by a voltage difference between the first and second junction regions 141*j* and 142*j*, and thus, oxygen atoms may be moved into the filament 150*f* to oxidize transition metals. Accordingly, the filament 150*f* in the protrusion 150*p* may vanish. The selected cell 90 without the filament 150*f* may be referred to '0' data or 'OFF' state.

In the reading operations, the selected cell 90 may be applied with a voltage (e.g., 0V) required for turning off the selected cell 90, and the non-selected cells may be applied with a voltage (Vpass) required for turning on the non-selected cells. In addition, the common source electrode 101 may be grounded, and the bit line 190 may be applied with a voltage (e.g., Vread) for detecting a resistance state of the selected cell 90. The bit lines BL2 and BL3 electrically connected to the non-selected cell strings may be applied with the same voltage (e.g., 0V) as that applied to the common source electrode 101. Some embodiments of the inventive concept may not be limited to the afore-described read voltage condition.

Under the read voltage condition, if the filament 150*f* is formed in the selected cell 90, a current flow (solid arrow) can be detected. In these embodiments, the selected cell 90 may be evaluated to store '1' data. By contrast, if the filament 150*f* is not formed in the selected cell 90, the current flow may not be detected. In this case, the selected cell 90 may be evaluated to store '0' data.

According to some embodiments, the selected cell 90 may be configured to realize a bipolar switching operation. For example, if polarities of voltages applied to the common source electrode 101 and the bit line 190 are reversed, write and erase operations can be operated. By contrast, for a unipolar switching resistive memory device, switching operations can be achieved by changing a magnitude of a voltage difference. Accordingly, the bipolar switching resistive memory device can be operated with a relatively small current, compared with a unipolar switching resistive memory device.

Figure 5A:
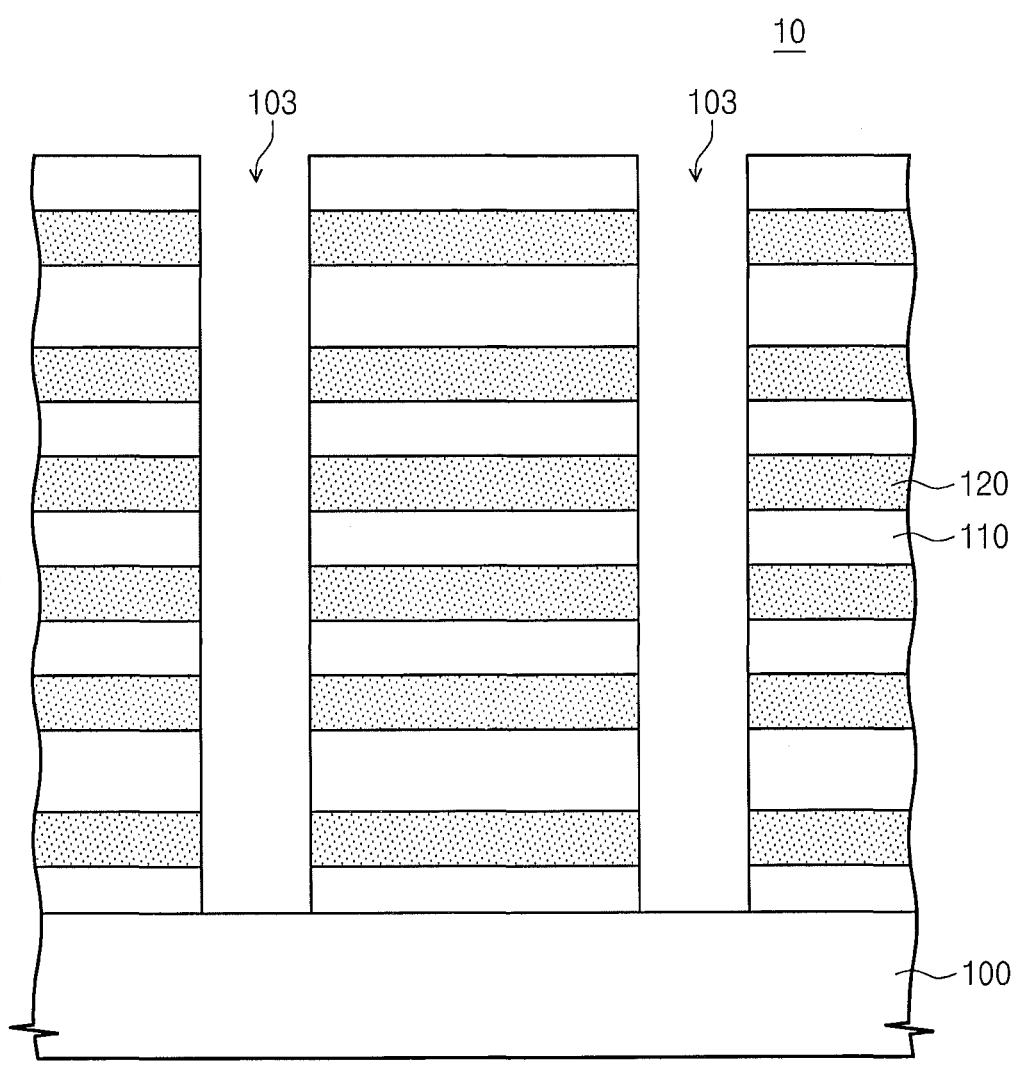
FIGS. 5A through 5J are cross sections illustrating processing steps in the fabrication of resistive memory devices according to some embodiments of the inventive concept.

FIGS. 5A through 5J are cross sections illustrating processing steps in the fabrication of a resistive memory device according to some embodiments of the inventive concept. Referring to FIG. 5A, a mold stack 10 may be formed on a substrate 100 to have a vertical hole 103. In some embodiments, the substrate 100 may include a single crystalline silicon wafer having a first conductivity type (e.g., P-type). The mold stack 10 may be formed by alternatingly stacking insulating mold layers 110 and sacrificial mold layers 120 that have etch selectivity different from each other. For example, the insulating mold layers 110 may be formed by depositing a silicon oxide layer (e.g., SiOx), and the sacrificial mold layers 120 may be formed by depositing a silicon nitride layer (e.g., SiNx). The mold stack 10 may be anisotropically etched to form the vertical hole 103 exposing the substrate 100.

Figure 5B:
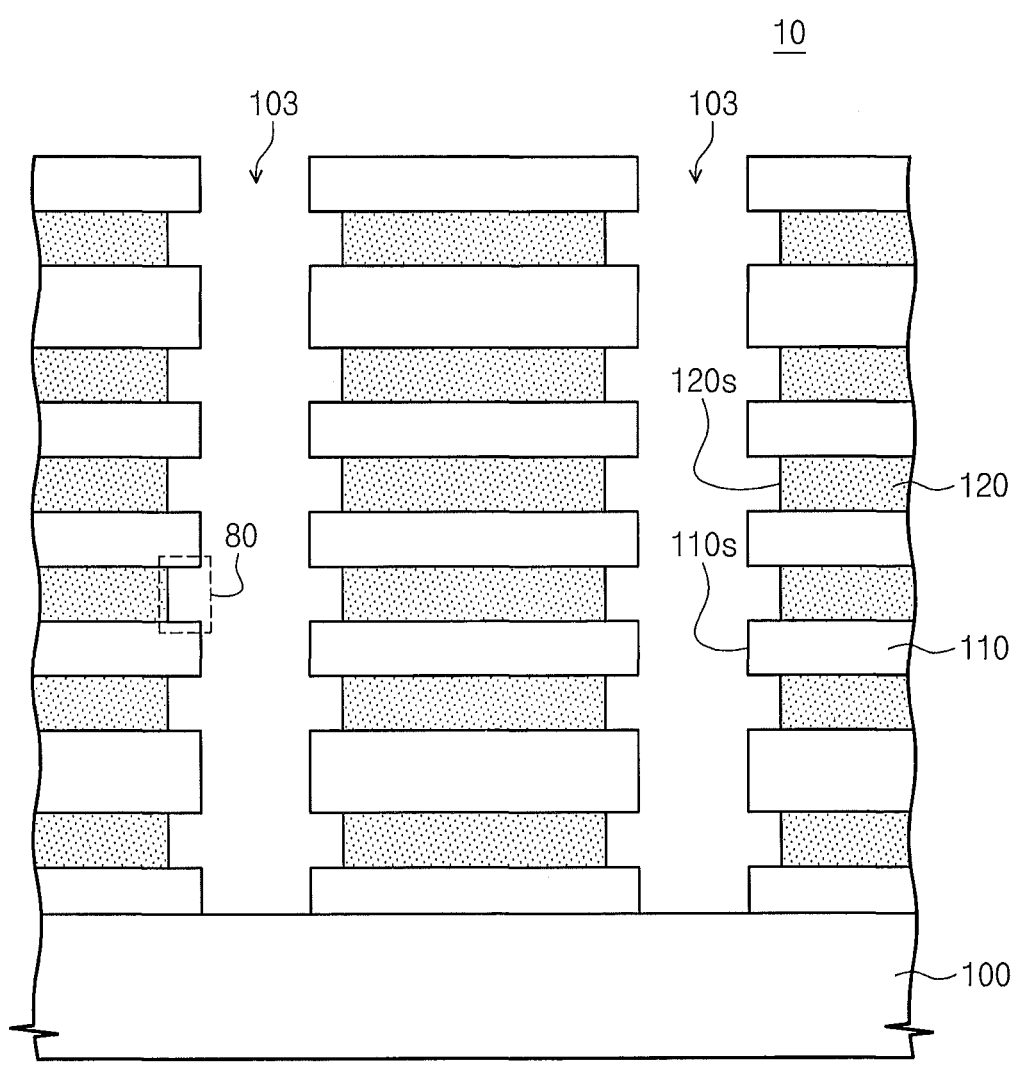

Referring to FIG. 5B, the sacrificial mold layers 120 may be recessed along a direction (e.g., left-right direction) parallel to the top surface of the substrate 100. For example, by providing etchant capable of selectively removing the sacrificial mold layers 120, side surfaces 120*s* of the sacrificial mold layers 120 exposed by the vertical hole 103 may be etched. Accordingly, the side surfaces 120*s* of the sacrificial mold layers 120 exposed by the vertical hole 103 may not be coplanar with side surfaces 110*s* of the insulating mold layers 110. Due to the presence of the alcove 80 that is formed by the recess of the sacrificial mold layers 120, the vertical hole 103 may be formed to have a meandering inner surface.

Figure 5C:
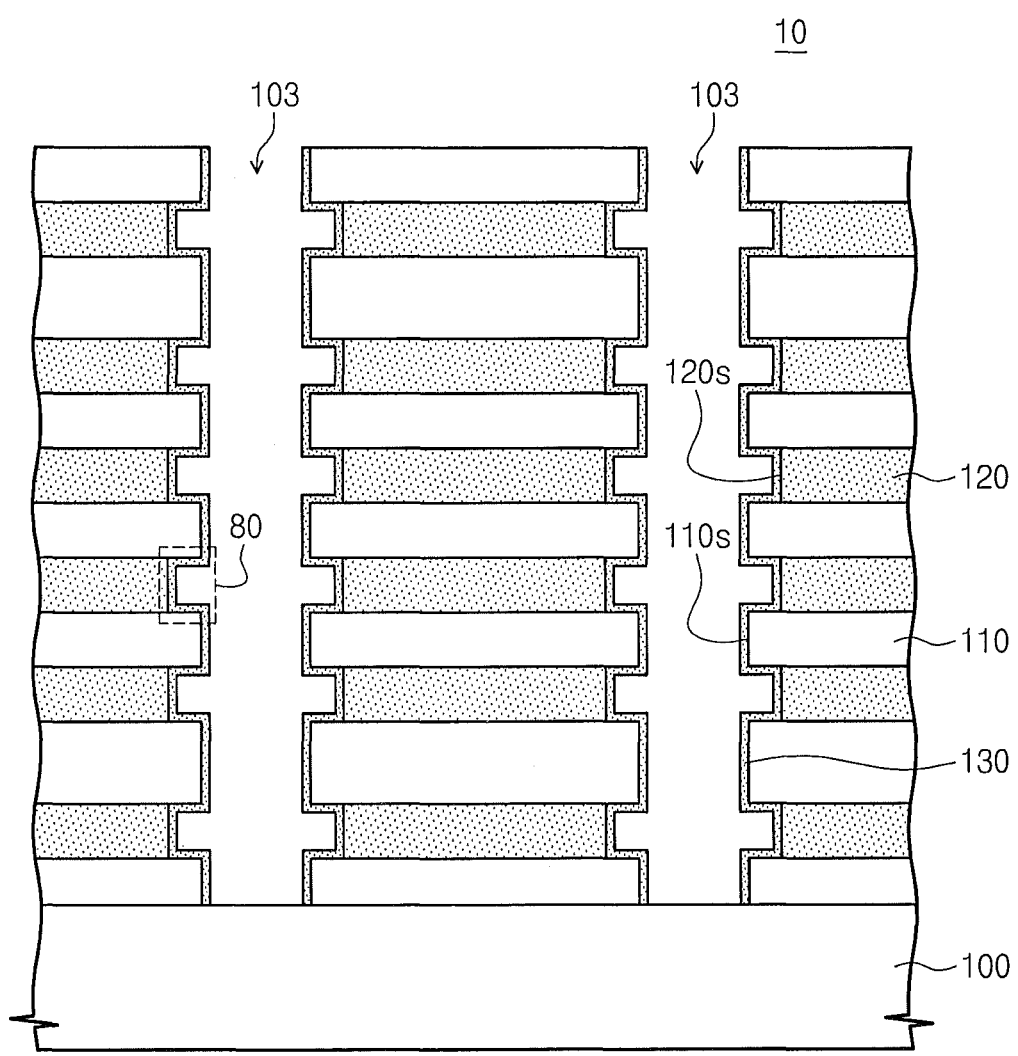

Referring to FIG. 5C, the gate insulating layer 130 may be formed. The gate insulating layer 130 may be formed by depositing and selectively etching an insulating material. In some embodiments, the gate insulating layer 130 may extend along an inner surface of the vertical hole 103. For example, the formation of the gate insulating layer 130 may include depositing a silicon oxide layer using a CVD process to cover the mold stack 10 and then anisotropically etching the silicon oxide layer to expose the top surface of the substrate 100. As the result of the anisotropic etching, the silicon oxide layer may be removed from a top surface of the uppermost layer of the insulating mold layers 110. Since the inner surface of the vertical hole 103 defines the alcove 80, the gate insulating layer 130 may have a meandering profile or conformally cover the inner surface of the vertical hole 103.

Figure 5D:
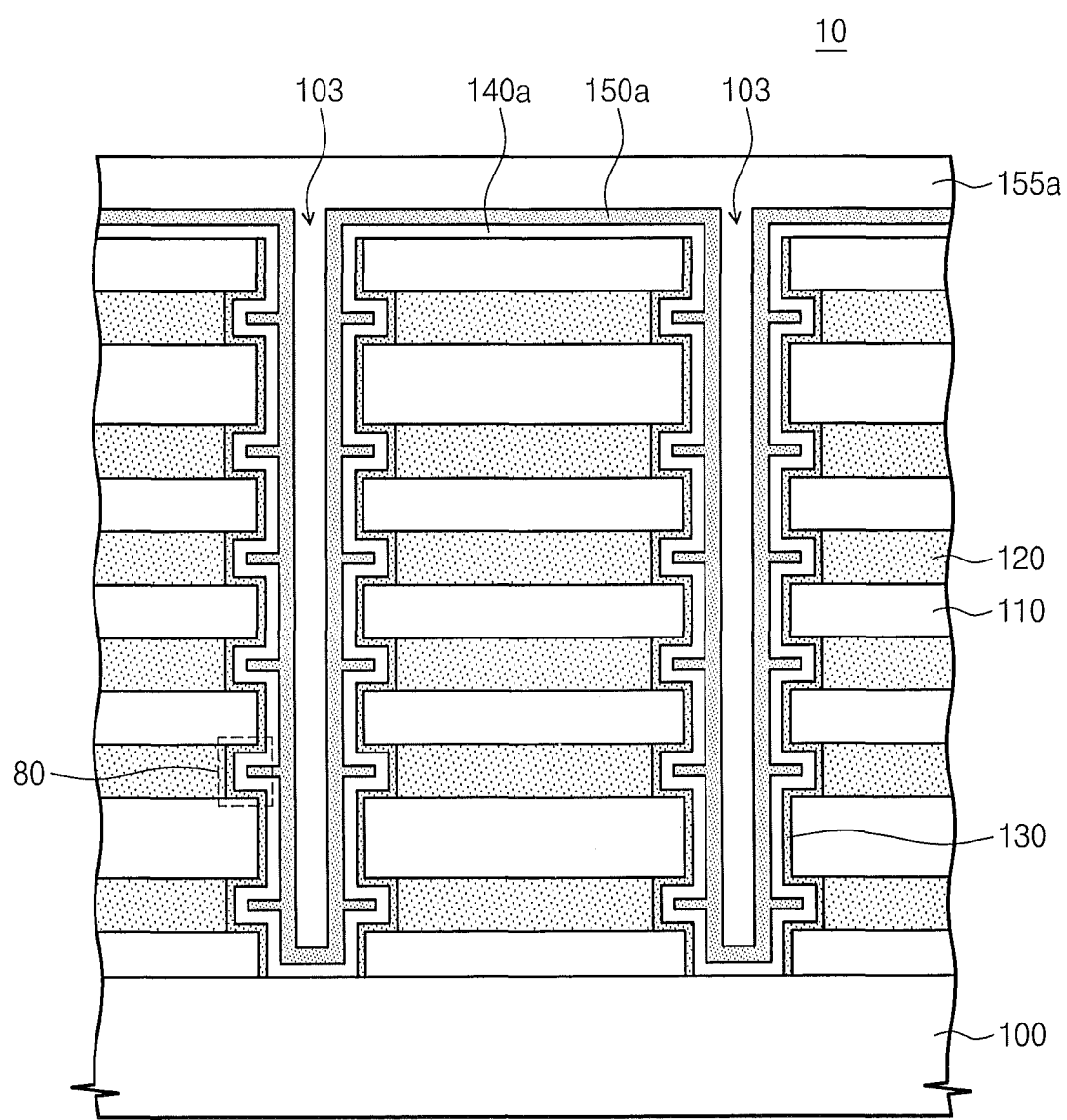

Referring to FIG. 5D, a semiconductor layer 140a and a transition metal oxide 150a may be formed in the vertical hole 103. For example, the semiconductor layer 140a may be formed by depositing a single-crystalline or poly-crystalline silicon layer, which may be undoped or doped to have the same conductivity type (e.g., P-type) as the substrate 100. The transition metal oxide 150a may be formed by depositing at least one selected from the group consisting of oxides of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), and praseodymium (Pr). The semiconductor layer 140a and the transition metal oxide 150a may be conformally formed on the mold stack 10 to cover the uppermost one of the insulating mold layers 110.

Alternatively, the transition metal oxide 150a may not completely fill the vertical hole 103. For example, the transition metal oxide 150a may be formed to have a cup-shaped structure. In these embodiments, an insulating layer 155a may be additionally formed to fill an inner space of the transition metal oxide 150a. The insulating layer 155a may be formed by depositing a silicon oxide layer to cover the transition metal oxide 150a. In some embodiments, the transition metal oxide 150a may be formed to fill the vertical hole 103 and have a pillar structure. In these embodiments, the formation of the insulating layer 155a may be omitted.

Figure 5E:
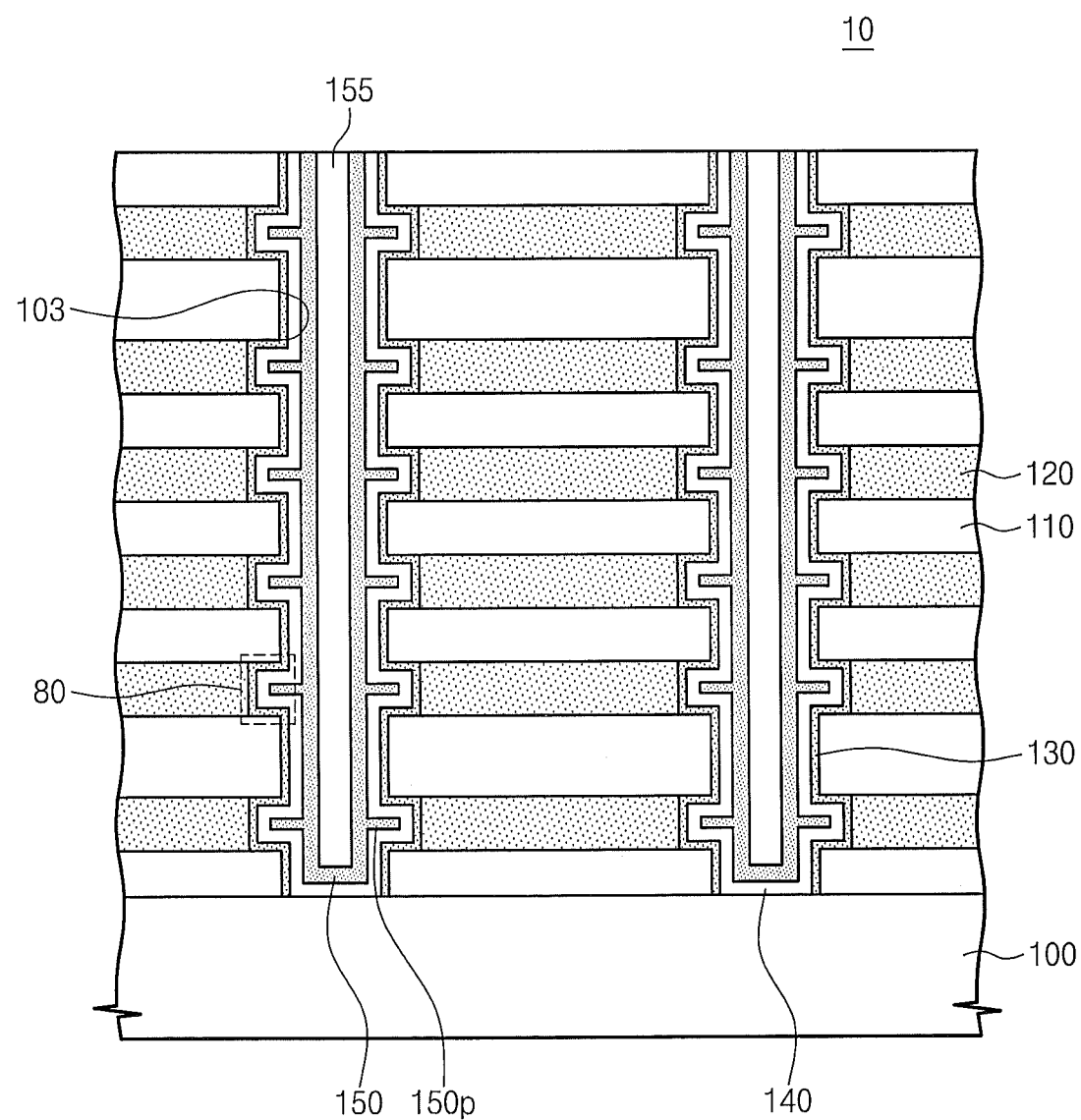

Referring to FIG. 5E, a planarization process may be performed to form the channel 140 and the variable resistance layer 150. For example, the insulating layer 155a, the transition metal oxide 150a, and the semiconductor layer 140a may be planarized, by using a chemical-mechanical polishing or etching-back process, to expose the uppermost layer of the insulating mold layers 110. Accordingly, the gate insulating layer 130, the channel 140, and the variable resistance layer 150 may be formed in the vertical hole 103. In some embodiments, the gate insulating layer 130 may be vertically formed through the mold stack 10 to be in contact with the sacrificial mold layers 120 and the insulating mold layers 110, the channel 140 may be shaped like a cup with a closed bottom and an open top and be electrically connected to the substrate 100, and the variable resistance layer 150 may be shaped like a cup, whose inner space is filled with the insulating gap-fill layer 155. In some embodiments, since the alcove 80 is formed between the insulating mold layers 110, the channel 140 may include a bracket shaped portion extending along inner surface of the alcove 80, and the variable resistance layer 150 may include the protrusion 150p laterally extending toward the alcove 80.

Figure 5F:
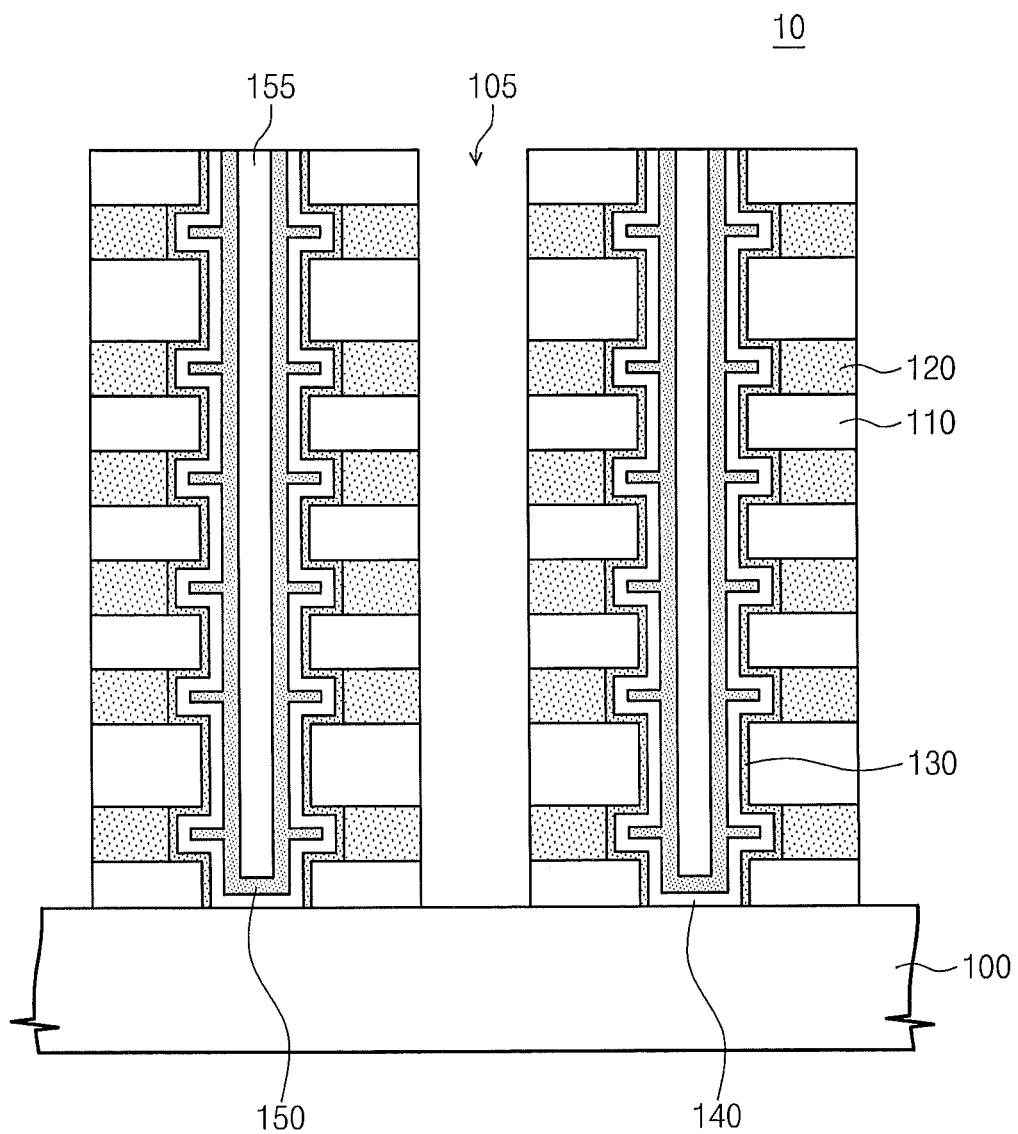

Referring to FIG. 5F, a trench 105 may be formed through the mold stack 10. For example, an anisotropic etching may be performed to pattern the mold stack 10 and form the trench 105 exposing the substrate 100. The trench 105 may be formed to expose sidewalls of the insulating mold layers 110 and the sacrificial mold layers 120. The trench 105 may be formed to have a linear shape extending to cross the substrate 100 or extending along the front-back direction. The mold stack 10 may have a line shape extending parallel to the trench 105 or extending along the front-back direction.

Figure 5G:
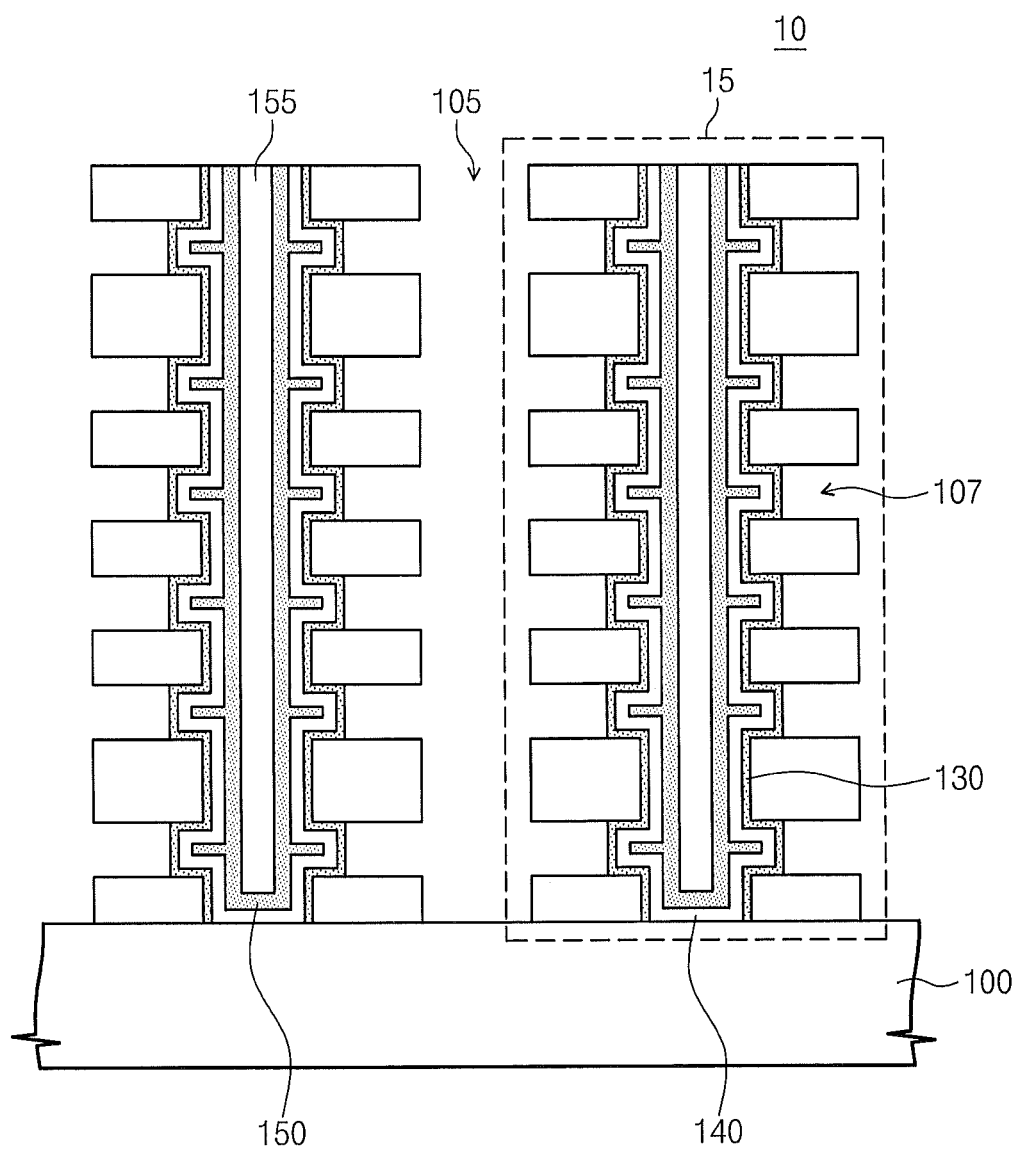

Referring to FIG. 5G, a mold wing 15 may be formed. The mold wing 15 may include the insulating mold layers 110 that are arranged vertically spaced apart from each other along the variable resistance layer 150. In some embodiments, the formation of the mold wing 15 may include selectively and isotropically removing the sacrificial mold layers 120 with etchant, which may be supplied through the trench 105. If the insulating mold layers 110 are a silicon oxide layer and the sacrificial mold layers 120 are a silicon nitride layer, the selective and isotropic removal of the sacrificial mold layers 120 may be performed using etchant containing phosphoric acid ($H_3PO_4$). As the result of the selective etching of the sacrificial mold layers 120, spaces 107 may be formed between the insulating mold layers 110 to expose the gate insulating layer 130.

Figure 5H:
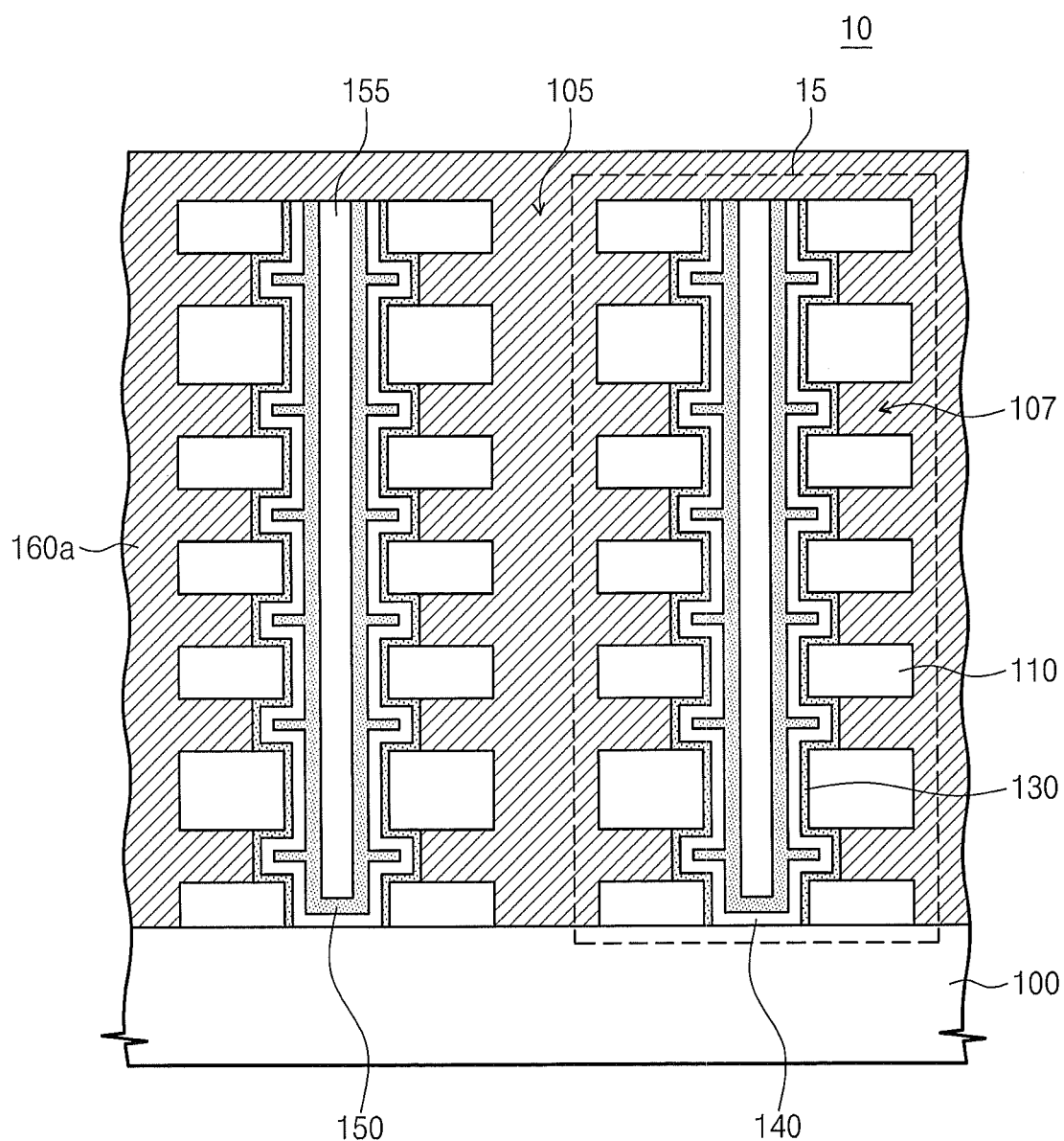

Referring to FIG. 5H, a conductive layer 160a may be formed to cover the mold wing 15. For example, the conductive layer 160a may be formed by depositing a conductive layer (e.g., of silicon, metal, metal nitride, and metal silicide) on the substrate 100. The conductive layer 160a may be formed to fill the trench 105 and the spaces 107.

Figure 5I:
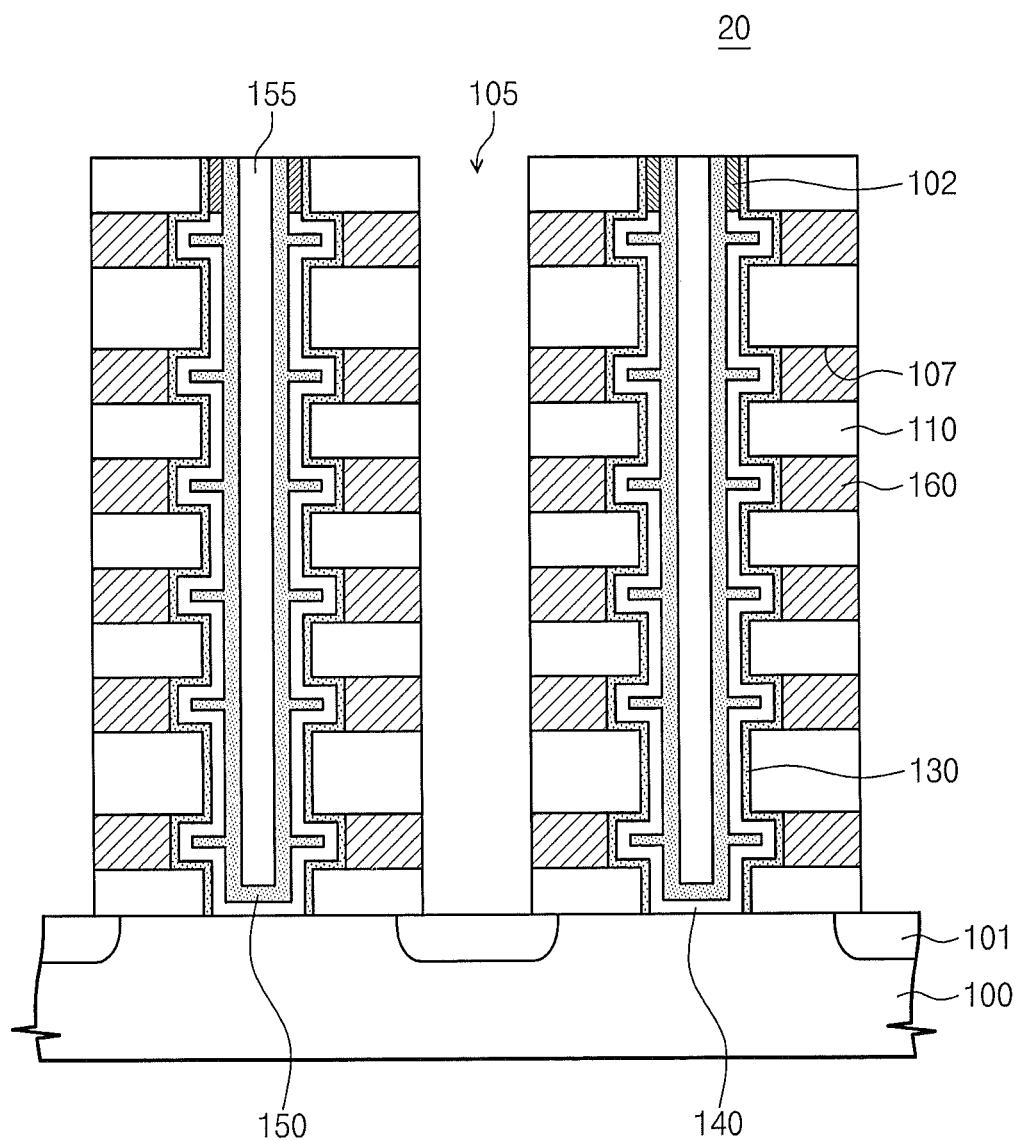

Referring to FIG. 5I, the gate stack 20 with the gates 160 may be formed between the insulating mold layers 110. For example, the conductive layer 160a may be planarized and be anisotropically etched to form the gates 160 filling the spaces 107. The substrate 100 exposed by the trench 105 may be doped with impurities having the second conductivity type (e.g., N-type) different from that of the substrate 100 to form the common source electrode 101. The top portion of the channel 140 may be doped to have the same second conductivity type (e.g., N-type) as the common source electrode 101, thereby forming the drain electrode 102. The common source electrode 101 and the drain electrode 102 may be formed simultaneously. A plurality of the common source electrodes 101 may be electrically connected to each other, to have an equipotential state. The gates 160 and the common source electrode 101 may extend to be parallel to the trench 105 or along the front-back direction.

Figure 5J:
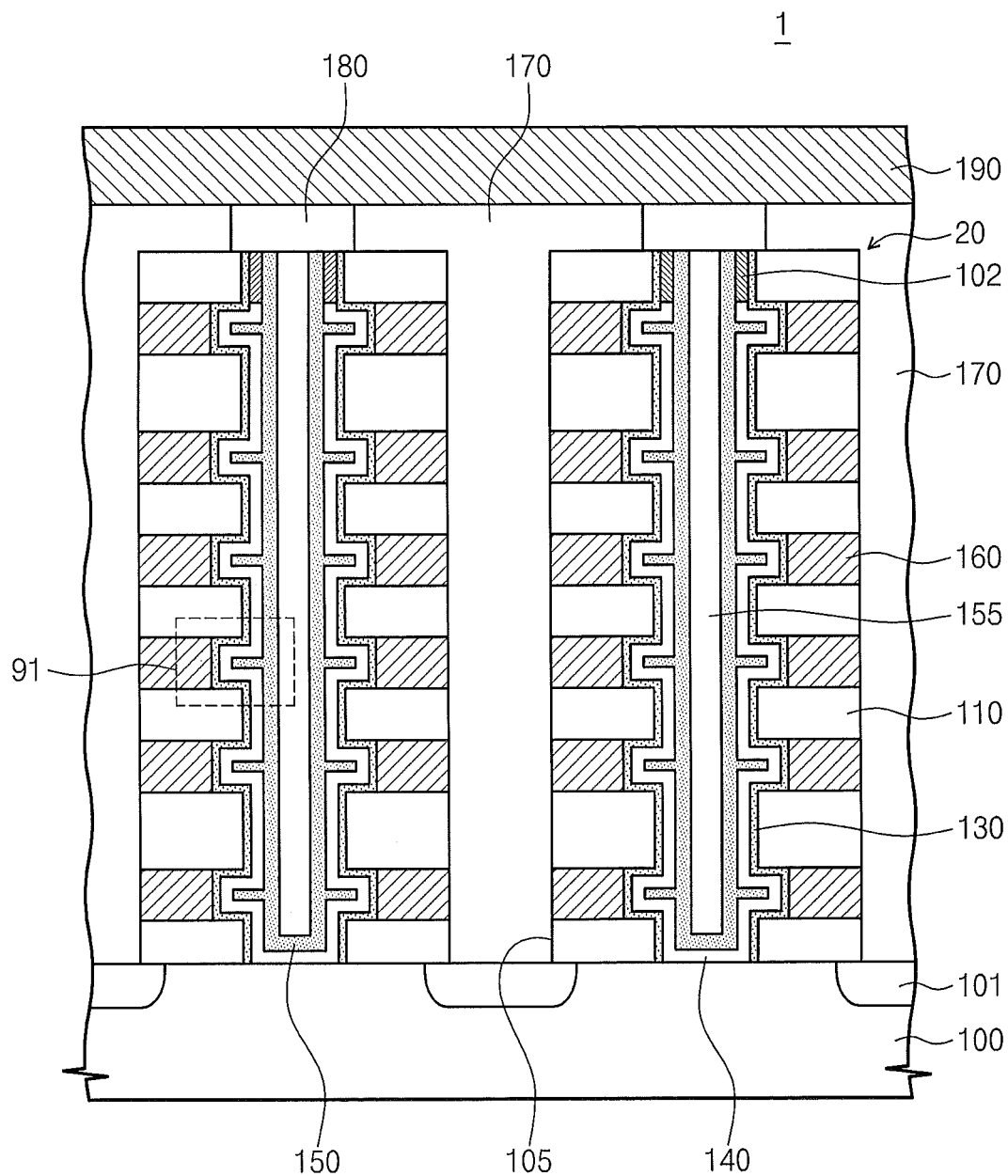

Referring to FIG. 5J, the interlayered insulating layer 170 may be formed on the substrate 100, and the bit line 190 may be formed on the interlayered insulating layer 170 to be electrically connected to the drain electrode 102. For example, the formation of the interlayered insulating layer 170 may include depositing a silicon oxide layer on the substrate 100 to fill the trench 105 and cover the gate stack 20. The plug 180 may be formed through the interlayered insulating layer 170 to be connected to the drain electrode 102, and the bit line 190 may be formed on the interlayered insulating layer 170 to be connected to the plug 180. The bit line 190 may extend to cross the gates 160 or along the left-right direction. In some embodiments, the formation of the interlayered insulating layer 170 may include depositing an insulating layer on the substrate 100 to cover the gate stack 20, planarizing the insulating layer to fill the trench 105, and then, depositing another insulating layer on the planarized insulating layer. As the result of the series of the processes, the first resistive memory device 1 may be fabricated to have the structure shown in FIG. 2.

FIGS. 6A through 6E are cross sections illustrating processing steps in the fabrication of a resistive memory device according to some embodiments of the inventive concept. The elements and features of this embodiment that are similar to those previously shown and described will not be described in much further detail in the interest of brevity.

Figure 6A:
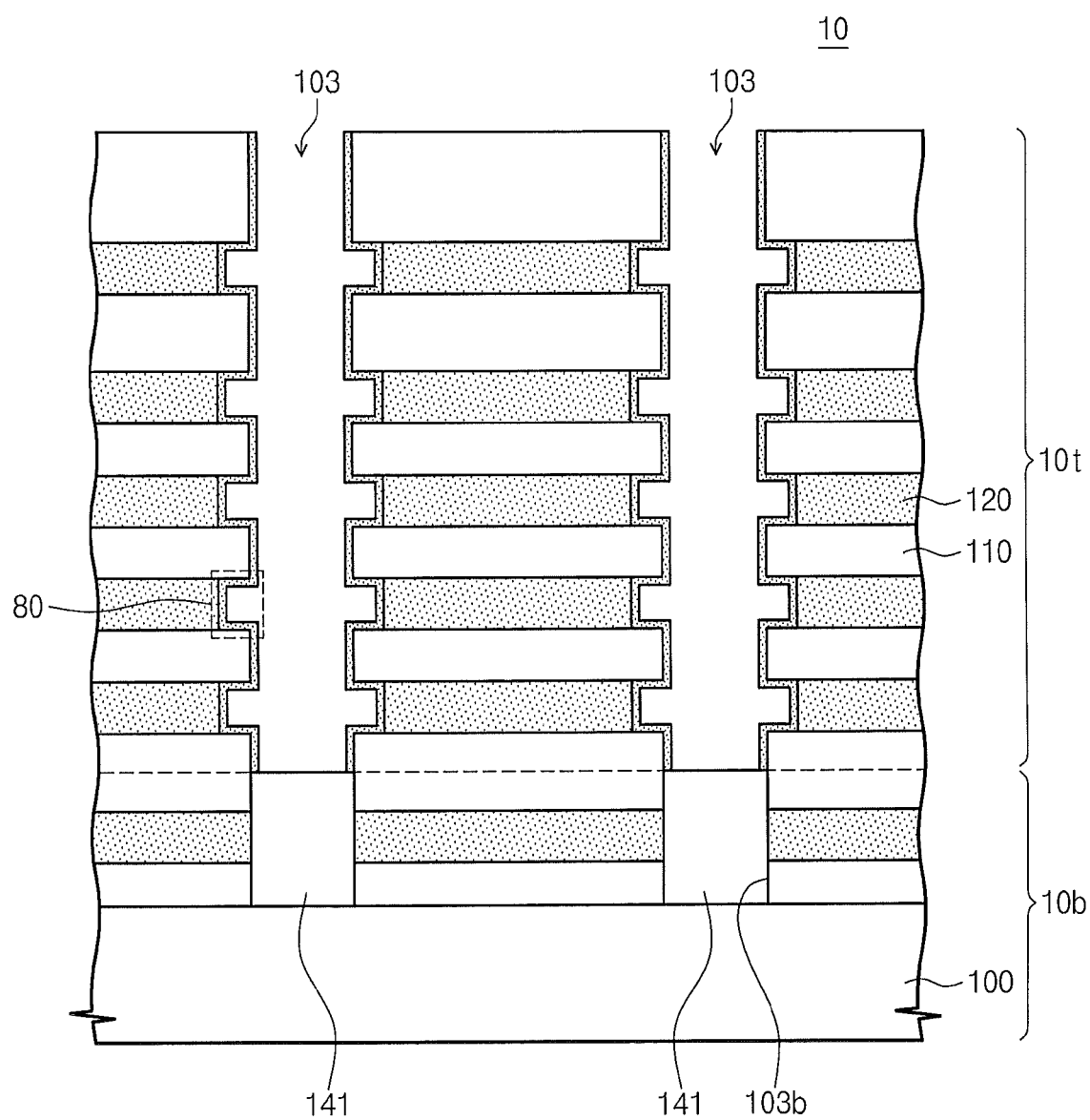
FIGS. 6A through 6E are cross sections illustrating processing steps in the fabrication of resistive memory devices according to some embodiments of the inventive concept.

Referring to FIG. 6A, the vertical hole 103 may be formed through the mold stack 10, and a first semiconductor layer 141 may be formed on a bottom of the vertical hole 103. The first semiconductor layer 141 may be formed by epitaxially growing or depositing a silicon layer from or on the substrate 100 exposed by the vertical hole 103. The first semiconductor layer 141 may be a single-crystalline or poly-crystalline silicon layer, which may be undoped or be doped to have the same conductivity type as the substrate 100 (e.g., P-type). The first semiconductor layer 141 may be formed to cover sidewalls of the lowermost one of the sacrificial mold layers 120. Thereafter, the sacrificial mold layers 120 may be recessed to form the alcove 80 between the insulating mold layers 110, and the gate insulating layer 130 may be formed to cover conformally the inner surface of the vertical hole 103. The gate insulating layer 130 may be formed by depositing and etching a silicon oxide layer.

In some embodiments, the mold stack 10 may be formed through two different processes. For example, a bottom stack 10b including two insulating mold layers 110 and the sacrificial mold layer 120 therebetween may be formed on the substrate 100, and a bottom hole 103b may be formed to expose the substrate 100 through the bottom stack 10b, and then, the first semiconductor layer 141 may be formed to fill the bottom hole 103b. The first semiconductor layer 141 may be formed by a silicon-epitaxial process or a silicon deposition process. Thereafter, the insulating mold layers 110 and the sacrificial mold layers 120 may be alternatingly stacked on the bottom stack 10b to form a top stack 10t, and the vertical hole 103 may be formed to expose the first semiconductor layer 141 through the top stack 10t, and then, the sacrificial mold layers 120 exposed by the vertical hole 103 may be laterally recessed to form the alcoves 80.

Figure 6B:
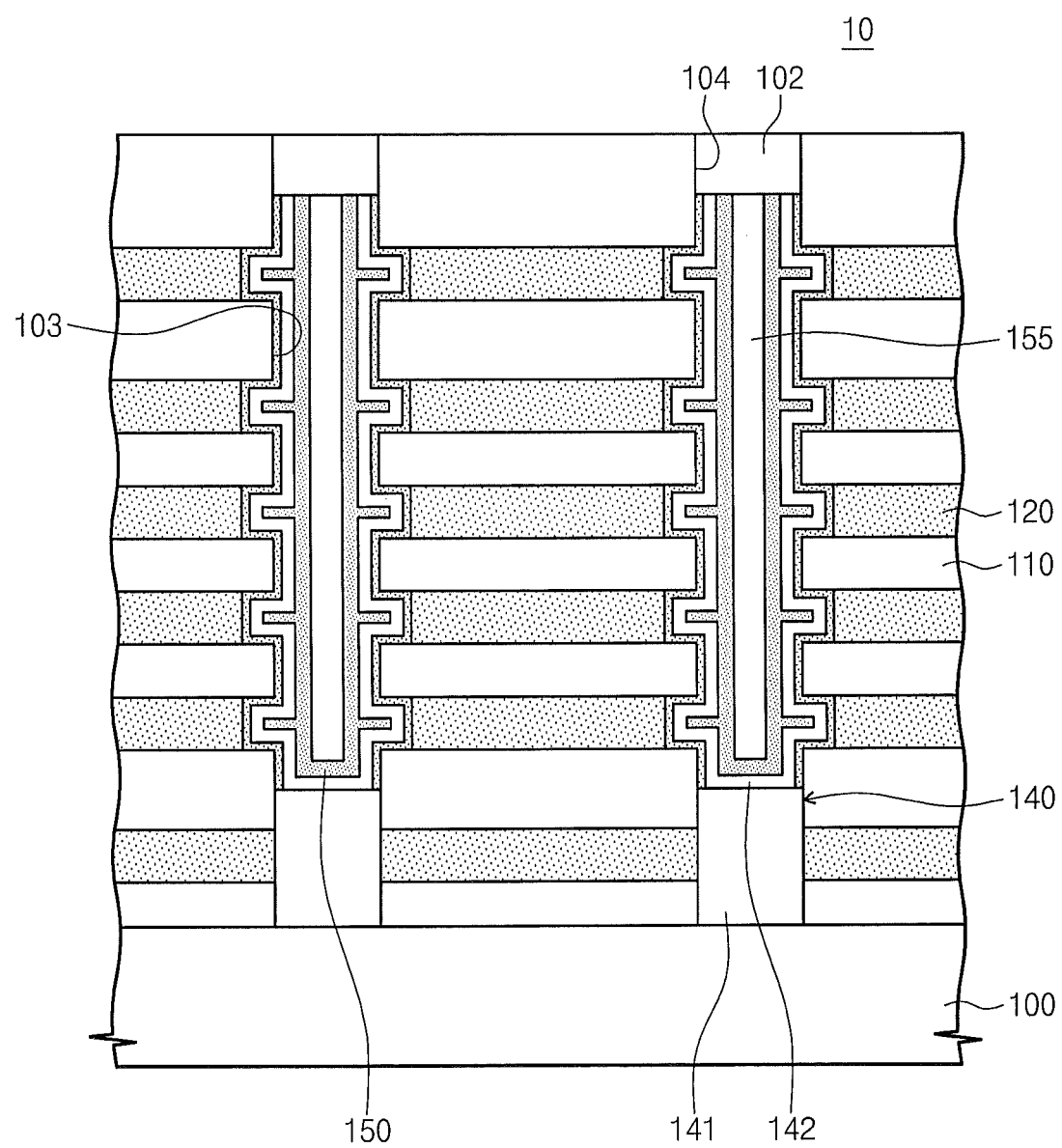

Referring to FIG. 6B, a second semiconductor layer 142, the variable resistance layer 150, and the insulating gap-fill layer 155 may be formed in the vertical hole 103. The second semiconductor layer 142 may be shaped like a cup with a closed bottom and an open top and be connected to the first semiconductor layer 141. The variable resistance layer 150 may be shaped like a cup, whose inner space is filled with the insulating gap-fill layer 155. The drain electrode 102 may be formed in the top portion of the vertical hole 103. The second semiconductor layer 142 may be formed of the same material as the first semiconductor layer 141. The first and second semiconductor layers 141 and 142 may constitute the channel 140. The formation of the drain electrode 102 may include etching top portions of the channel 140, the variable resistance layer 150, and the insulating gap-fill layer 155 to form holes 104, and filling the holes 104 with a doped silicon layer. In some embodiments, as shown in FIG. 5I, the drain electrode 102 may be formed by doping the top portion of the channel 140 with impurities.

Figure 6C:
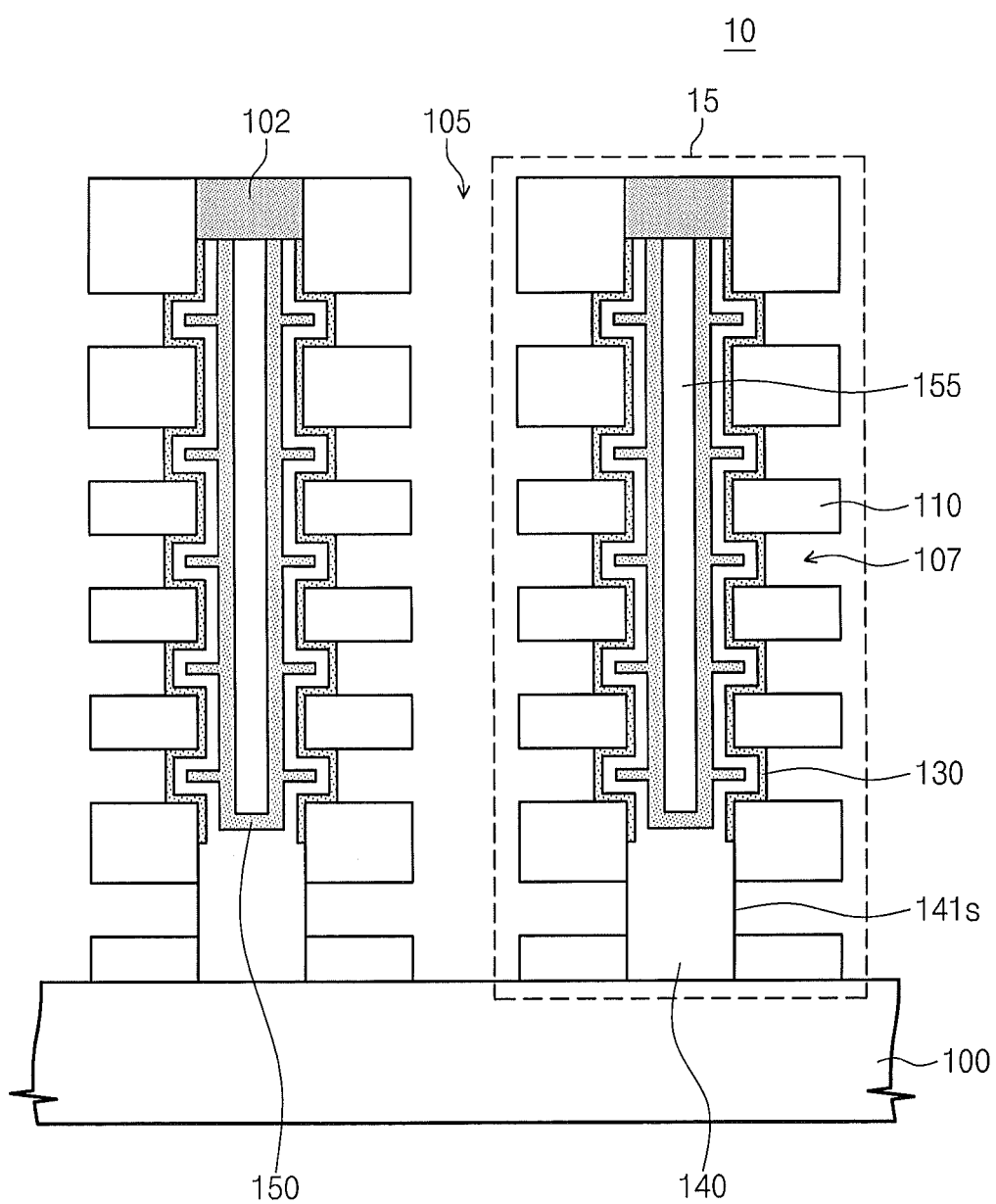

Referring to FIG. 6C, the trench 105 may be formed to expose the substrate 100 through the mold stack 10, and the sacrificial mold layers 120 exposed by the trench 105 may be removed to form the mold wing 15. According to some embodiments, the spaces 107 may be formed to expose partially the channel 140 and the gate insulating layer 130. For example, a lower side surface 141s of the channel 140 may be exposed by the spaces 107.

Figure 6D:
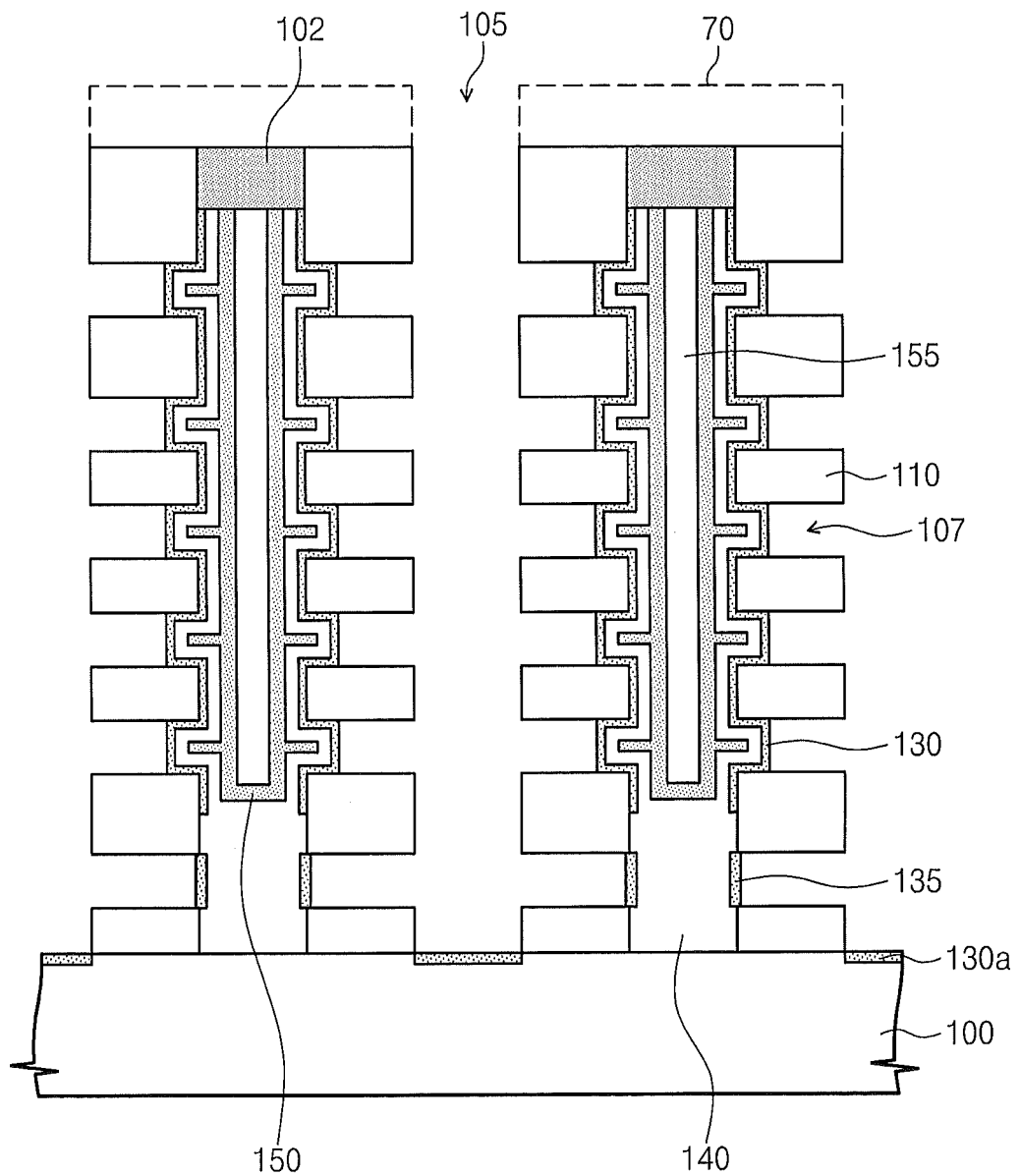

Referring to FIG. 6D, a second gate insulating layer 135 may be formed on the exposed side surface 141s of the channel 140. For example, the second gate insulating layer 135 may be formed by thermally oxidizing the exposed side surface 141s of the channel 140. During the thermal oxidation, the substrate 100 exposed by the trench 105 may also be oxidized to form an insulating layer 130a. Since the drain electrode 102 may be covered with a mask 70 for forming the trench 105, and thus, the insulating layer may not be formed on the drain electrode 102.

Figure 6E:
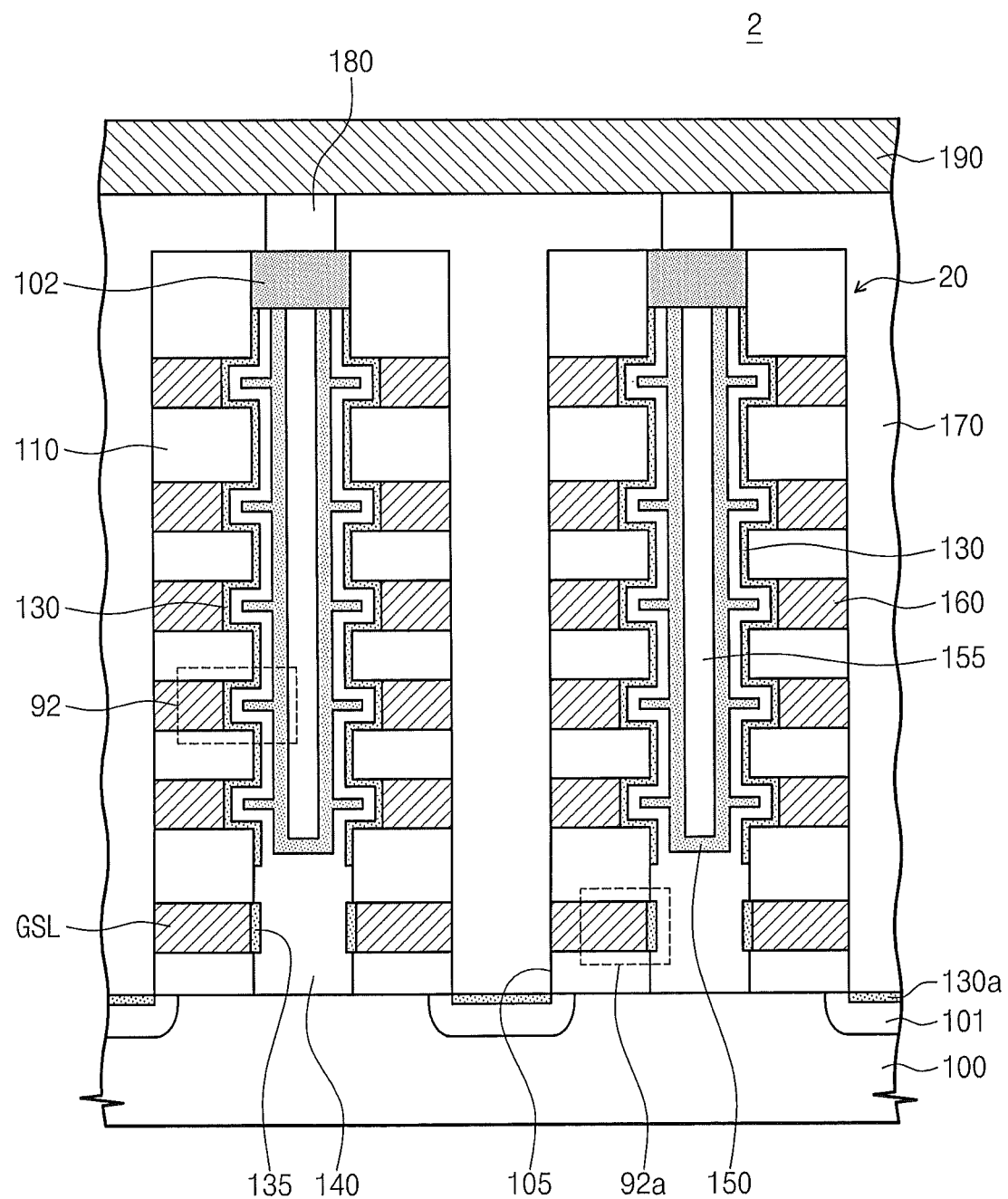

Referring to FIG. 6E, a second resistive memory device 2 may be formed using the same or similar process as that described with reference to FIGS. 5H through 5J. A cell 92 may be substantially the same as the cell 91 of FIG. 3A.

According to some embodiments, in a cross section, the variable resistance layer 150 may be laterally overlapped with the gates 160, except the lowermost layer as the ground selection line GSL. In other words, the variable resistance layer 150 may not be provided on the ground selection line GSL. Accordingly, for a cell 92a associated with the ground selection line GSL, the island-shaped second gate channel 135 may be locally provided between the gate 160 and the channel 140, unlike other cells 93.

The channel 140 may have a hybrid structure including the bulk portion and the cup-shaped portion that are connected to each other. Here, the bulk portion may refer to a portion overlapped with the lowermost gate 160. According to some embodiments, possibility of the gate insulating layer 130 and 135 being inserted into the top surface of the substrate 100 may be reduced, and thus, it may be possible to prevent a current flowing between the common source electrode 101 and the channel 140 from decreasing.

Figure 7A:
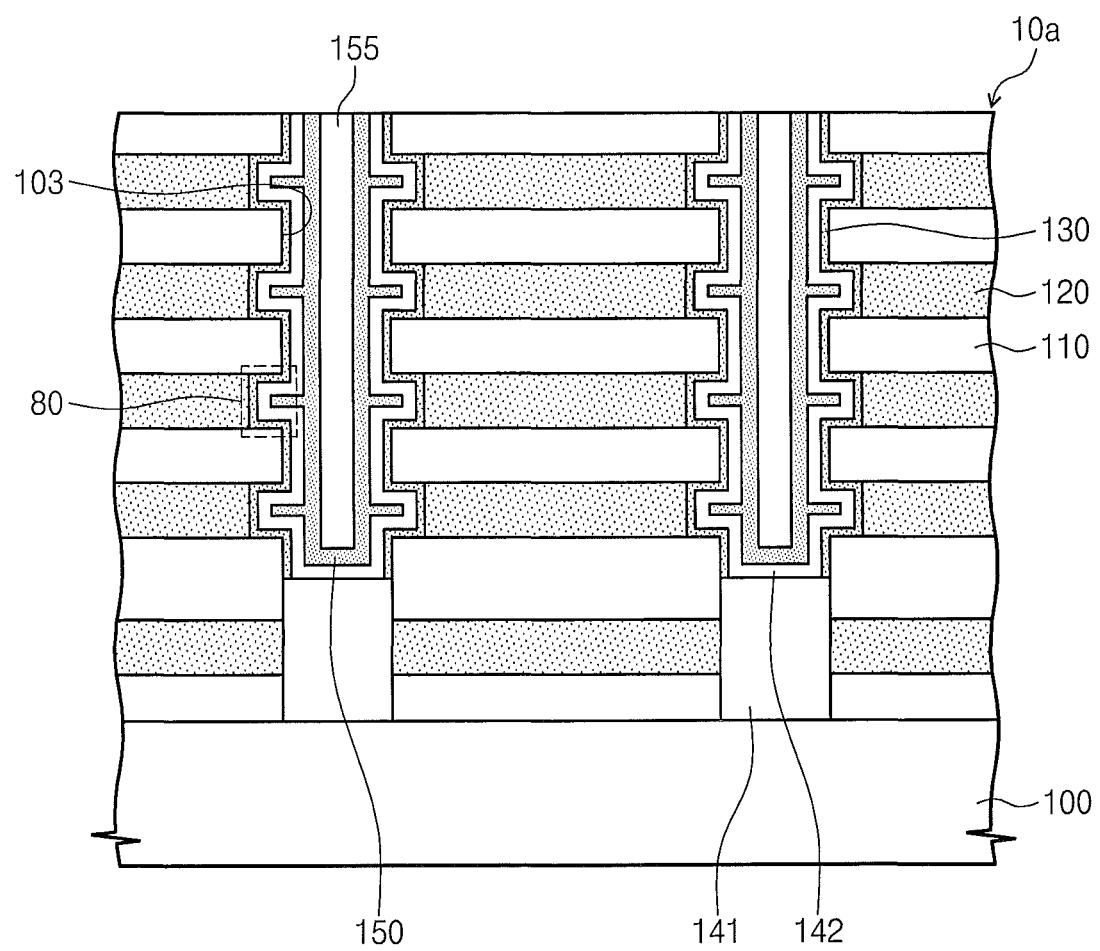
FIGS. 7A through 7E are cross sections illustrating processing steps in the fabrication of resistive memory devices according to some embodiments of the inventive concept.

FIGS. 7A through 7E are cross sections illustrating processing steps in the fabrication of a resistive memory device according to some embodiments of the inventive concept. Referring to FIG. 7A, a first mold stack 10a may be formed using the same or similar process as that described with reference to FIGS. 6A and 6B. For example, the insulating mold layers 110 and the sacrificial mold layers 120 may be alternatingly stacked on the substrate 100 to form the first mold stack 10a, and then, the vertical hole 103 may be formed through the first mold stack 10a. The first semiconductor layer 141 may be formed in the vertical hole 103 using an epitaxial growth or deposition process. The first semiconductor layer 141 may be connected to the substrate 100. The sacrificial mold layers 120 exposed by the vertical hole 103 may be laterally recessed to form the alcoves 80. The gate insulating layer 130, the channel 140, and the insulating gap-fill layer 155 may be formed in the vertical hole 103 with the alcove 80. The channel 140 may be connected to the first semiconductor layer 141.

Figure 7B:
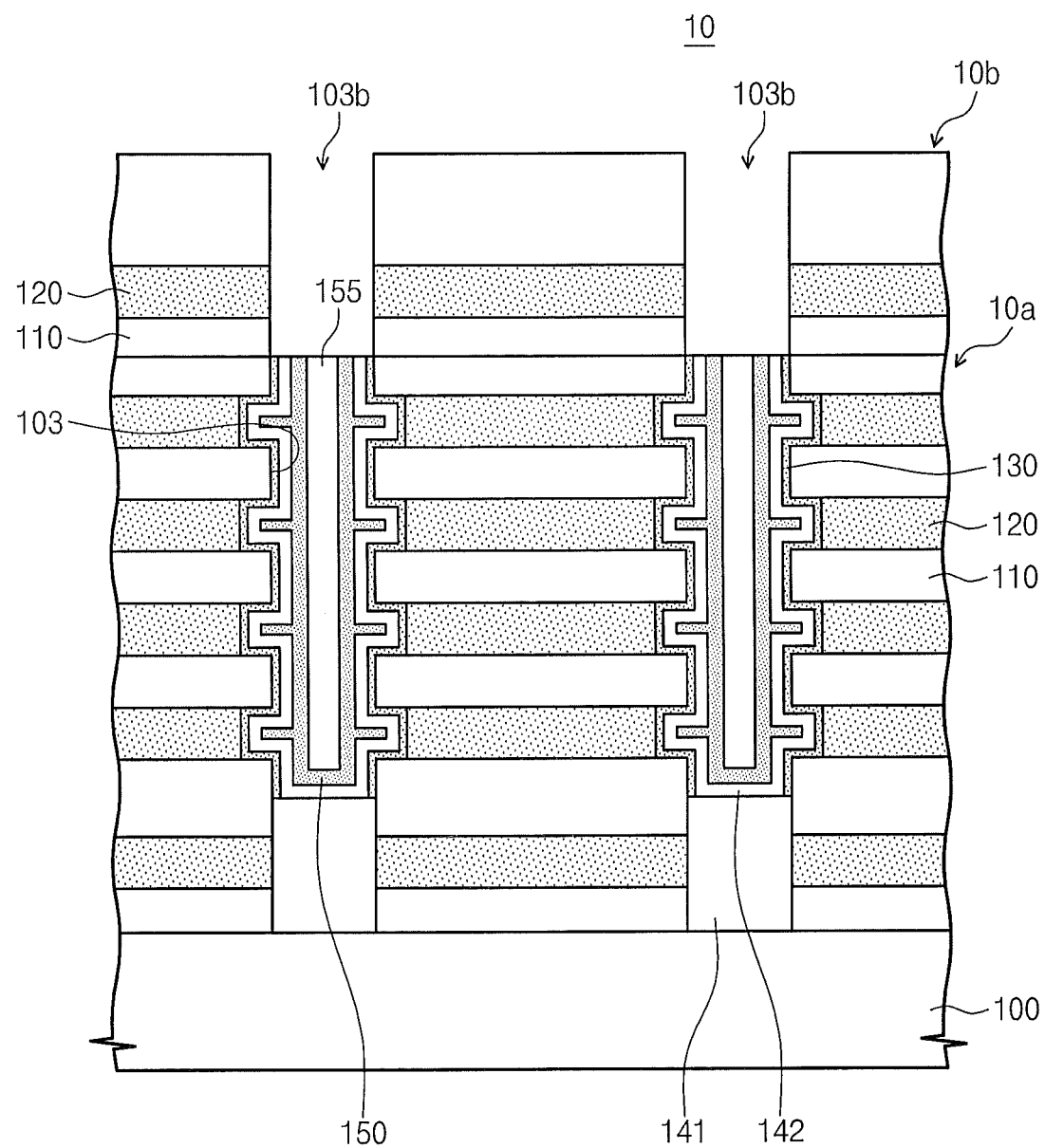

Referring to FIG. 7B, the second mold stack 10b including the insulating mold layers 110 and the sacrificial mold layer 120 therebetween may be formed on the first mold stack 10a, and the second vertical hole 103b may be formed through the second mold stack 10b. The second vertical hole 103b may be formed to expose at least the channel 140. The first and second mold stacks 10a and 10b may be stacked in such a way that the second vertical hole 103b is vertically aligned with the vertical hole 103, thereby forming the mold stack 10.

Figure 7C:
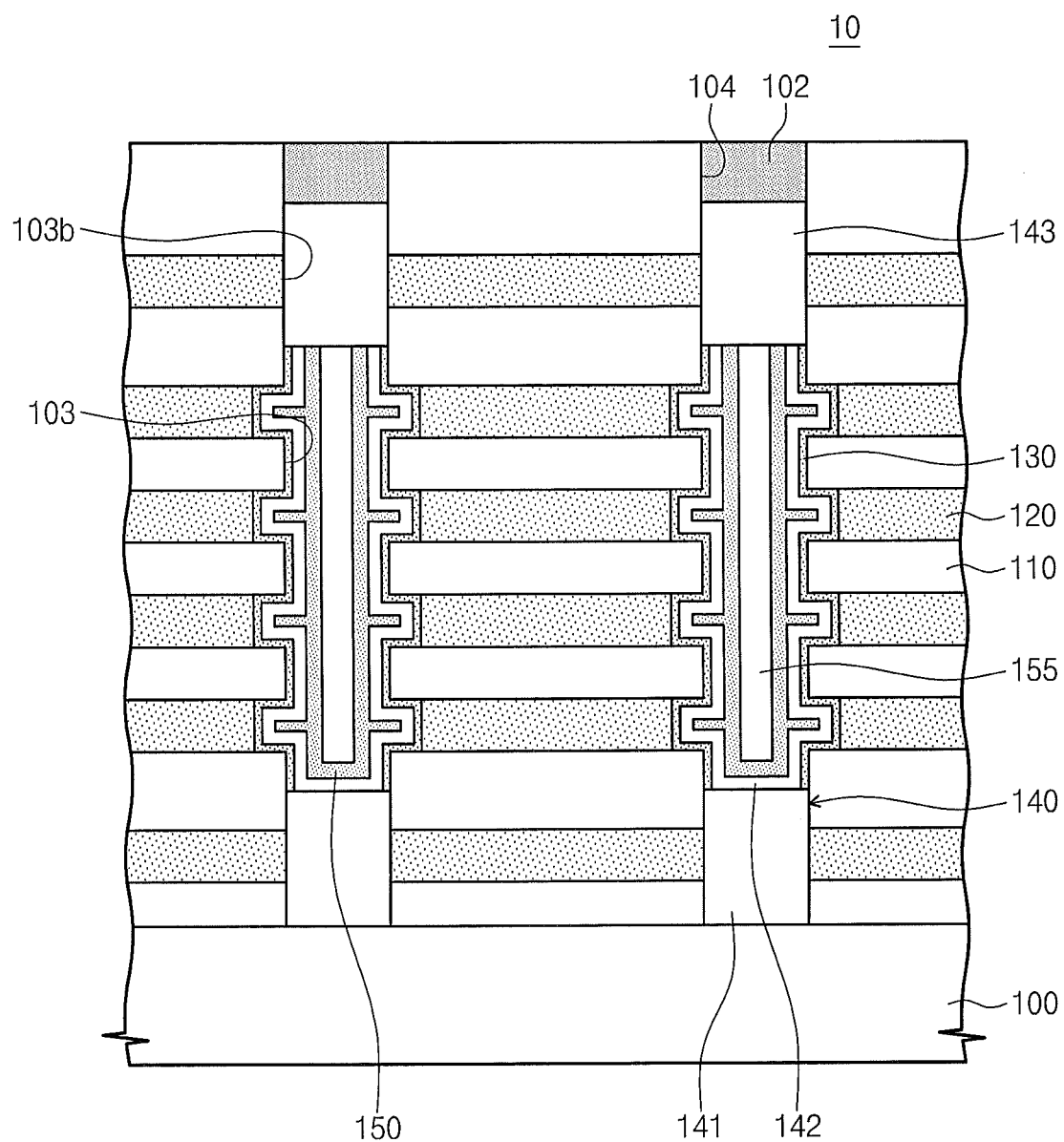

Referring to FIG. 7C, the second vertical hole 103b may be filled with a third semiconductor layer 143. The third semiconductor layer 143 may be connected to the second semiconductor layer 142. In some embodiments, the first, second, and third semiconductor layers 141, 142, and 143 may be connected to each other to constitute the channel 140. The first and third semiconductor layers 141 and 143 may be formed to have a bulk structure, while the second semiconductor layer 142 may be shaped like a cup with bracket-shaped portions. Impurities may be injected into a top portion of the third semiconductor layer 143 to form the drain electrode 102. In some embodiments, the formation of the drain electrode 102 may include removing a portion of the third semiconductor layer 143 to form the holes 104 and filling the holes 104 with a doped silicon layer.

Figure 7D:
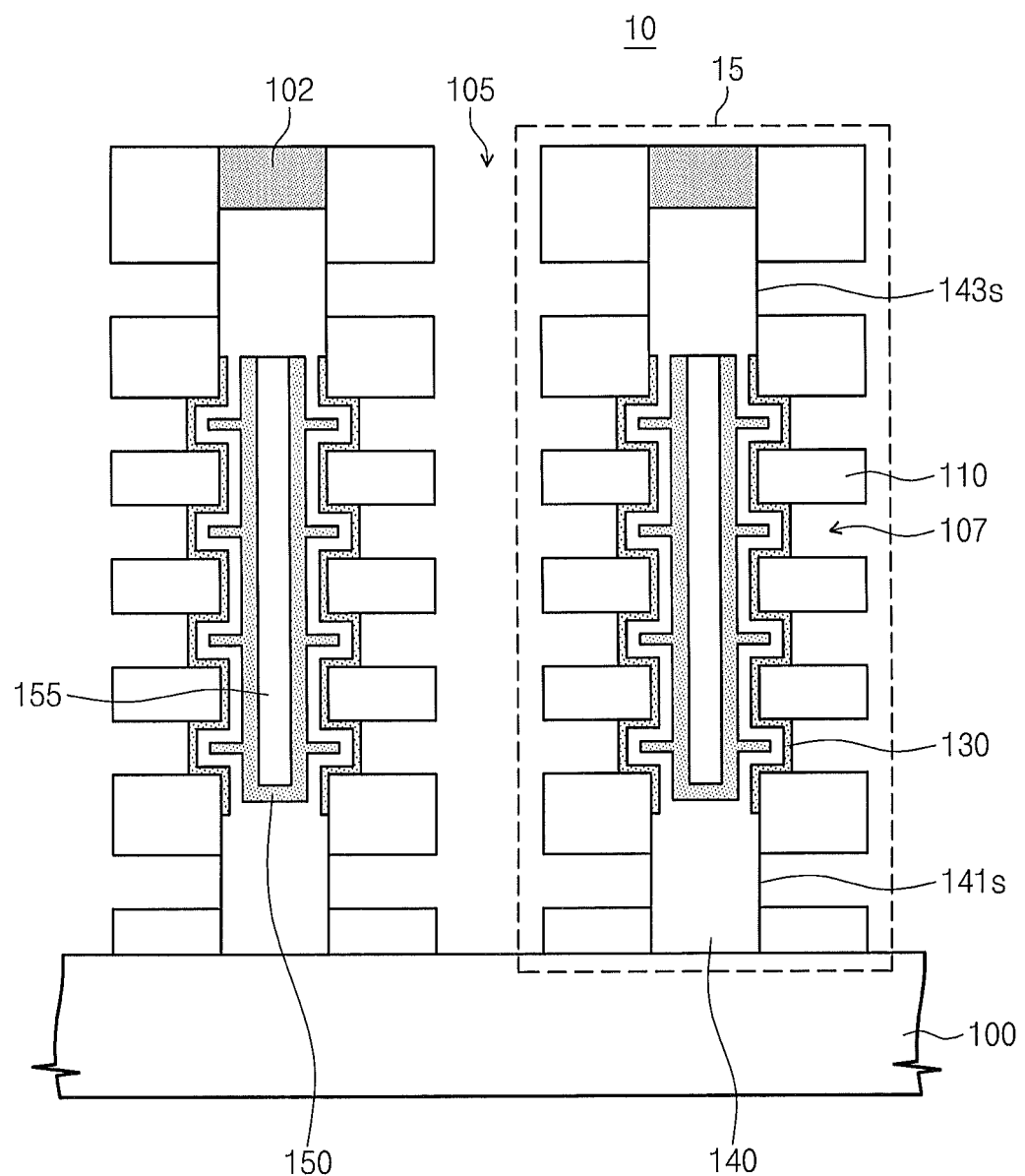

Referring to FIG. 7D, the mold stack 10 may be patterned to form the trench 105, and the sacrificial mold layers 120 may be selectively removed to form the mold wing 15 defining the spaces 107 between the insulating mold layers 110. The spaces 107 may be formed to expose at least partially side surfaces of the channel 140 and the gate insulating layer 130. For example, the lower and upper side surfaces 141s and 143s of the channel 140 may be exposed by the spaces 107. A thermal treatment may be performed to the exposed side surfaces 141s and 143s of the channel 140.

Figure 7E:
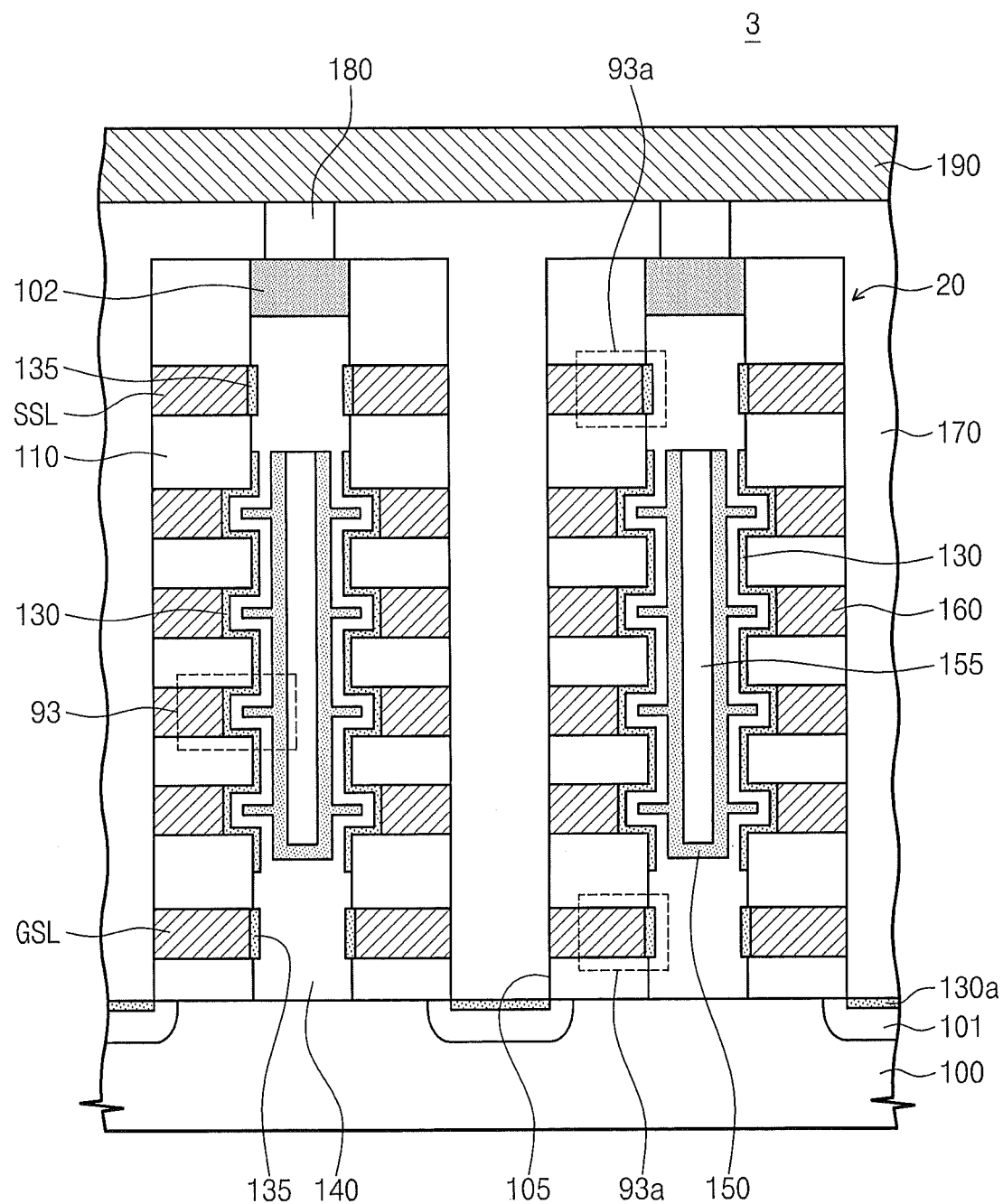

Referring to FIG. 7E, as the result of the thermal treatment, the second gate insulating layer 135 may be formed on the exposed side surfaces 141s and 143s of the channel 140. The second gate insulating layer 135 may be formed of oxide. During the thermal treatment, the top surface of the substrate 100 may be oxidized to form the insulating layer 130a. Next, a third resistive memory device 3 may be fabricated using the same or similar process as that described with reference to FIGS. 5H through 5J. A cell 93 may be substantially the same as the cell 91 of FIG. 3A.

According to some embodiments, the variable resistance layer 150 may be laterally overlapped with all of the gates 160 in a cross section, except the lowermost and uppermost layers of the gates 160. In other words, the variable resistance layer 150 may not be provided on the ground selection line GSL and the string selection line SSL. Accordingly, for cells 93a associated with the ground and string selection lines GSL and SSL, the island-shaped second gate channel 135 may be locally provided between the gate 160 and the channel 140, unlike other cells 93.

The channel 140 may have a hybrid structure including the bulk portions, which are overlapped with the lowermost and uppermost layers of the gates 160, respectively, and the cup-shaped portion vertically connecting the bulk portions.

Figure 8A:
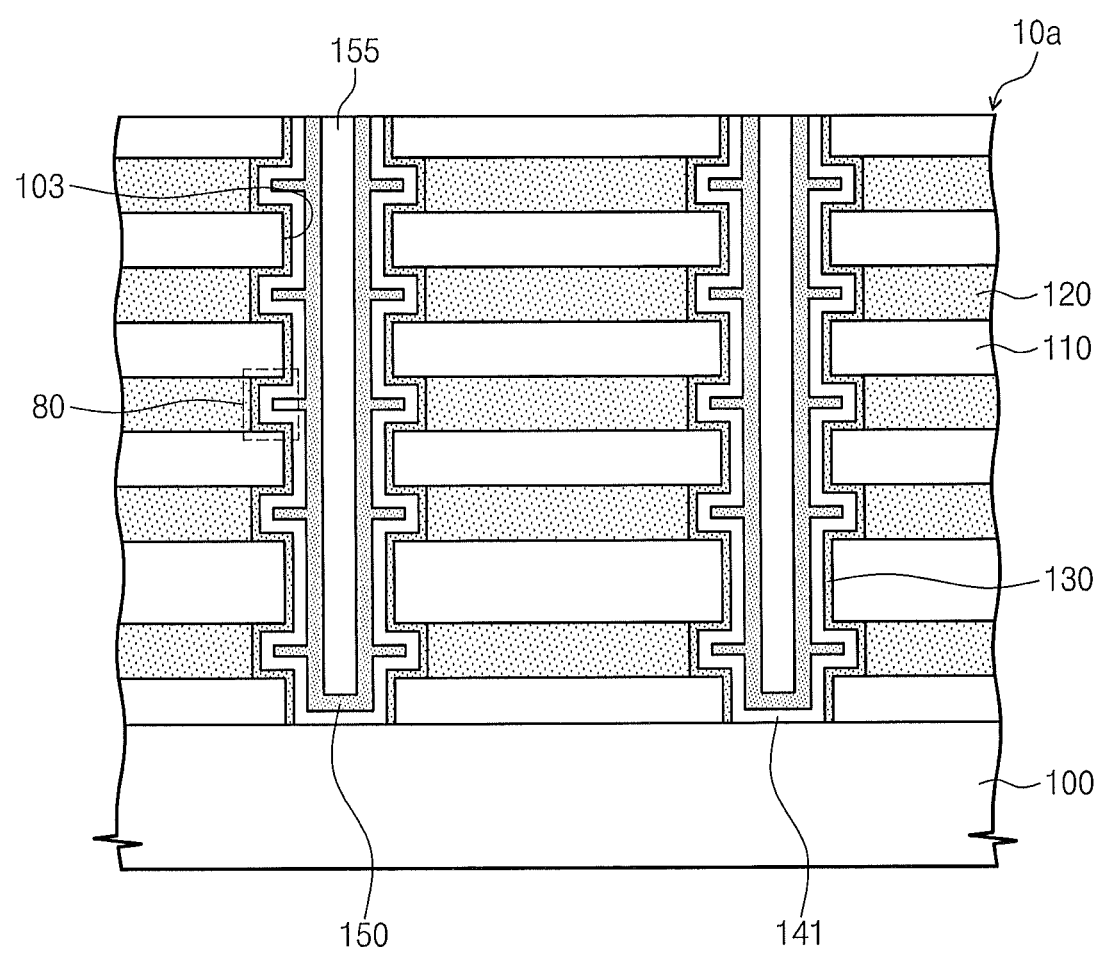
FIGS. 8A through 8E are cross sections illustrating processing steps in the fabrication of a resistive memory device according to some embodiments of the inventive concept.

FIGS. 8A through 8E are cross sections illustrating processing steps in the fabrication of a resistive memory device according to some embodiments of the inventive concept. As illustrated in FIG. 8A, the first mold stack 10a may be formed using the same or similar process as that described with reference to FIGS. 5A through 5E. For example, the insulating mold layers 110 and the sacrificial mold layers 120 may be alternatingly stacked on the substrate 100 to form the first mold stack 10a, and then, the vertical hole 103 with the alcoves 80 may be formed through the first mold stack 10a. The first semiconductor layer 141 may be formed in the vertical hole 103 to be connected to the substrate 100, and the variable resistance layer 150 filled with the insulating gap-fill layer 155 may be formed in the vertical hole 103 with the first semiconductor layer 141.

Figure 8B:
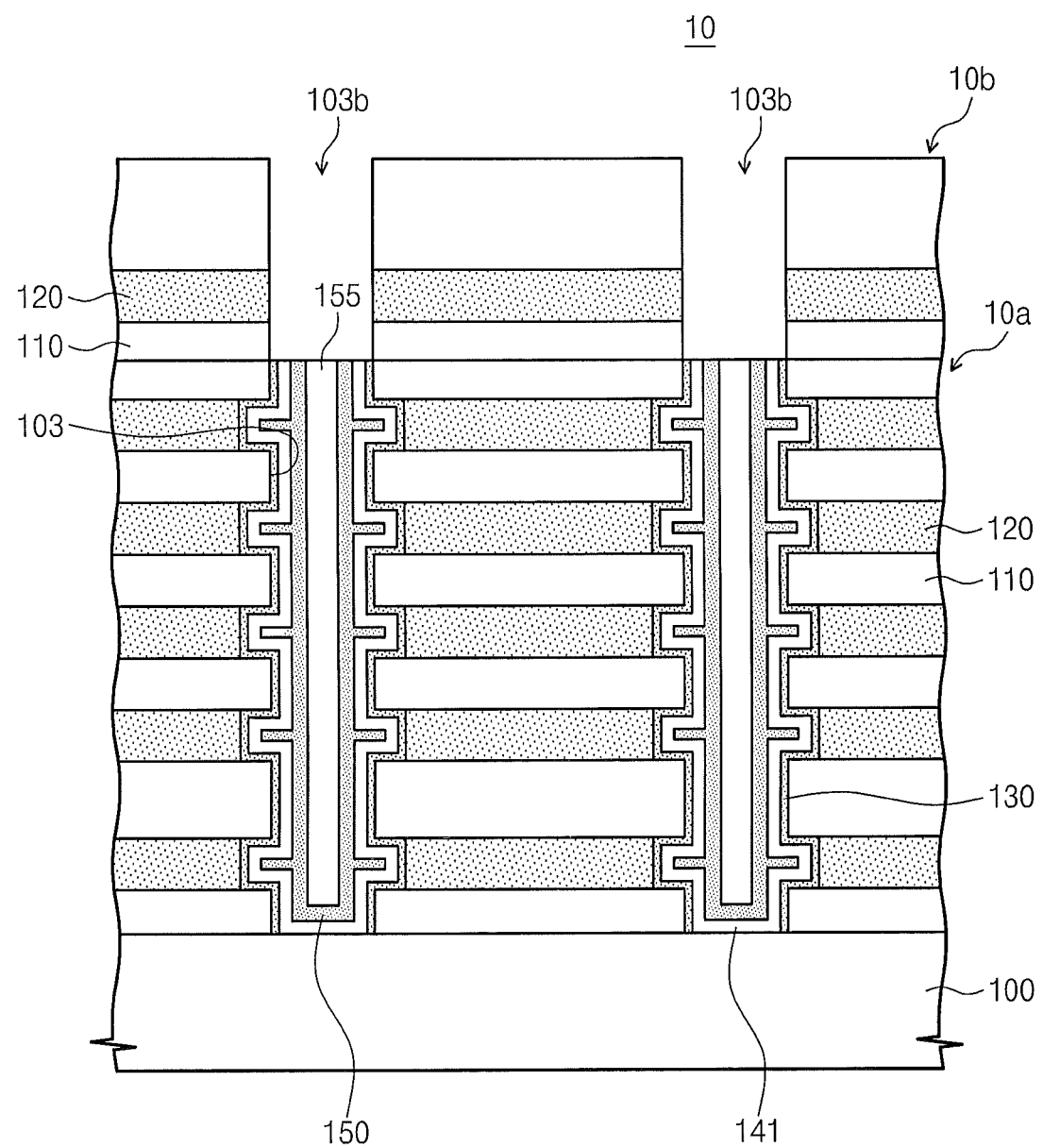

Referring to FIG. 8B, the second mold stack 10b including the insulating mold layers 110 and the sacrificial mold layer 120 therebetween may be formed on the first mold stack 10a, and the second vertical hole 103b may be formed through the second mold stack 10b. The second vertical hole 103b may be formed to expose at least partially the first semiconductor layer 141. The first and second mold stacks 10a and 10b may be stacked in such a way that the second vertical hole 103b is vertically aligned with the vertical hole 103, thereby forming the mold stack 10.

Figure 8C:
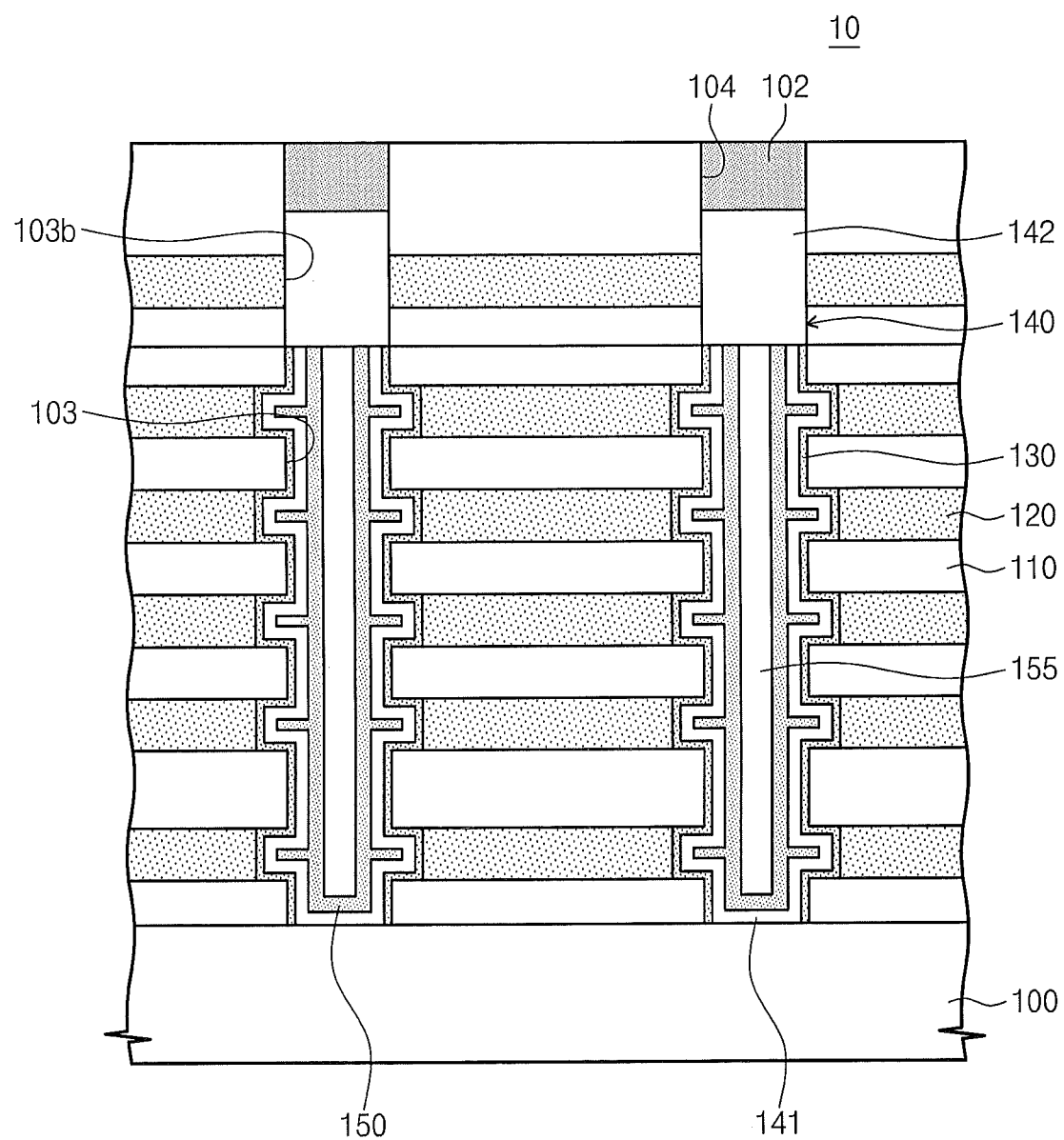

Referring to FIG. 8C, the second vertical hole 103b may be filled with the second semiconductor layer 142. The second semiconductor layer 142 may be connected to the first semiconductor layer 141. In some embodiments, the first and second semiconductor layers 141 and 142 may be connected to each other, thereby constituting the channel 140. In some embodiments, the second semiconductor layer 142 may be formed to have a bulk structure, while the first semiconductor layer 141 may be shaped like a cup with bracket-shaped portions. Impurities may be injected into a top portion of the second semiconductor layer 142 to form the drain electrode 102. In some embodiments, the formation of the drain electrode 102 may include removing a portion of the second semiconductor layer 142 to form the holes 104 and filling the holes 104 with a doped silicon layer.

Figure 8D:
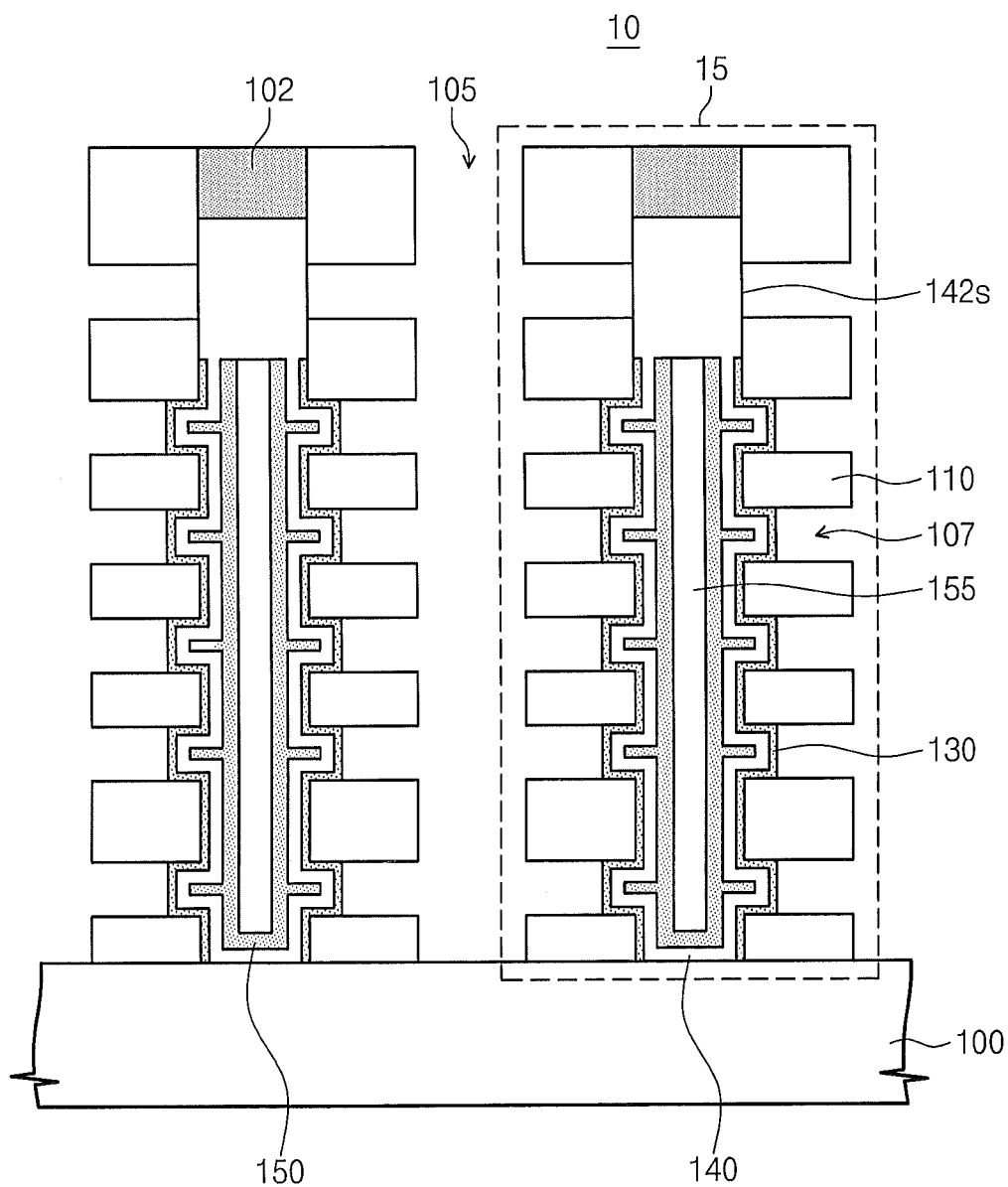

Referring to FIG. 8D, the mold stack 10 may be patterned to form the trench 105, and the sacrificial mold layers 120 may be selectively removed to form the mold wing 15 defining the spaces 107 between the insulating mold layers 110. The spaces 107 may be formed to expose at least partially side surfaces of the channel 140 and the gate insulating layer 130. For example, an upper side surface 142s of the channel 140 may be exposed by the spaces 107. A thermal treatment may be performed to the exposed upper side surface 142s of the channel 140.

Figure 8E:
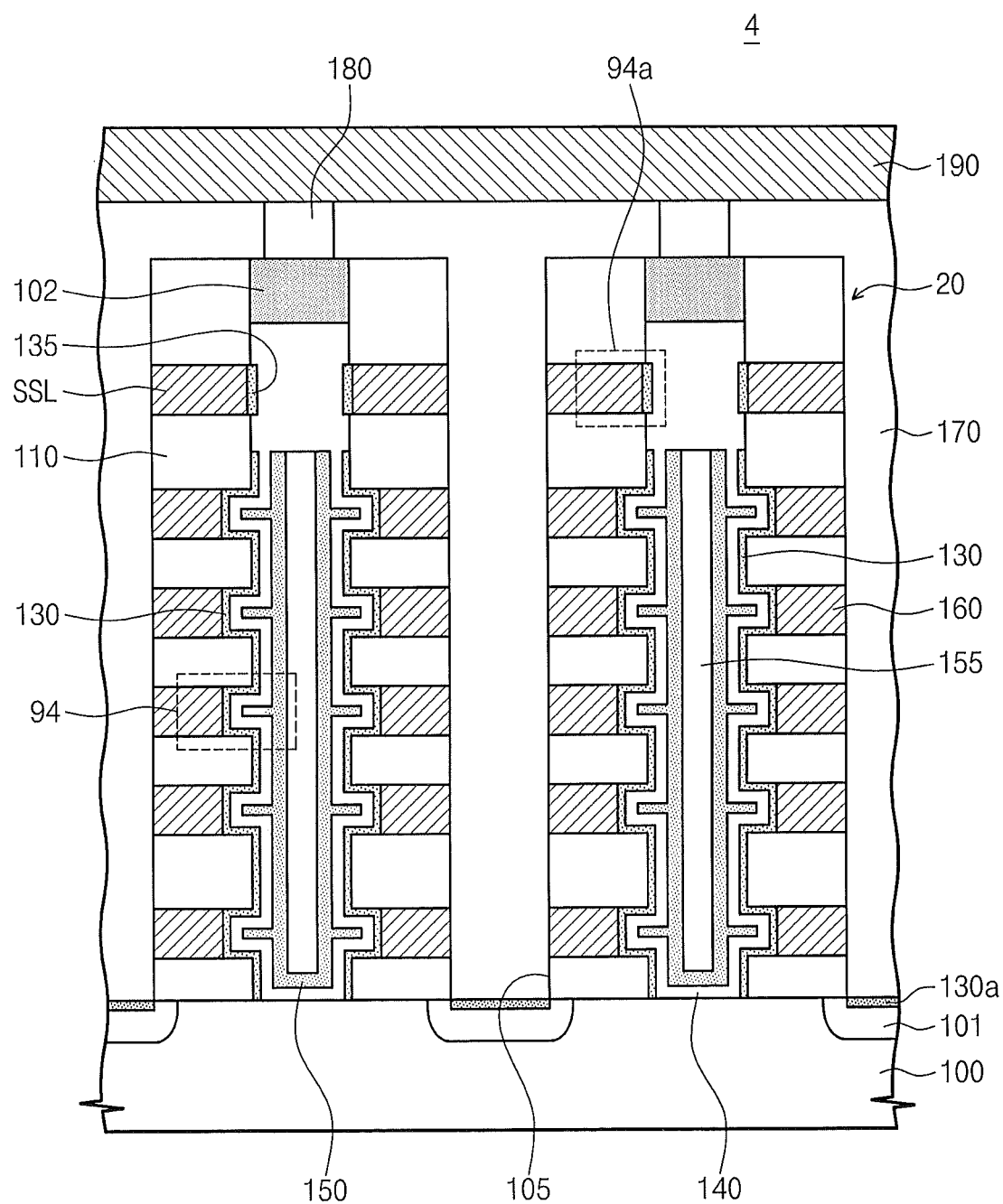

Referring to FIG. 8E, as the result of the thermal treatment, the second gate insulating layer 135 may be formed on the exposed upper side surface 142s of the channel 140. During the thermal treatment, the top surface of the substrate 100 may be oxidized to form the insulating layer 130a. Next, a fourth resistive memory device 4 may be fabricated using the same or similar process as that described with reference to FIGS. 5H through 5J. A cell 94 may be substantially the same as the cell 91 of FIG. 3A.

According to some embodiments, the variable resistance layer 150 may be laterally overlapped with all of the gates 160 in a cross section, except the uppermost layer of the gates 160. In other words, the variable resistance layer 150 may not be provided on the string selection line SSL. Accordingly, for a cell 94a associated with the string selection line SSL, the island-shaped second gate channel 135 may be locally provided between the gate 160 and the channel 140, unlike other cells 94.

The channel 140 may have a hybrid structure including the bulk portion, which is overlapped with the uppermost layer of the gates 160, and the cup-shaped portion provided below the bulk portion.

Figure 9A:
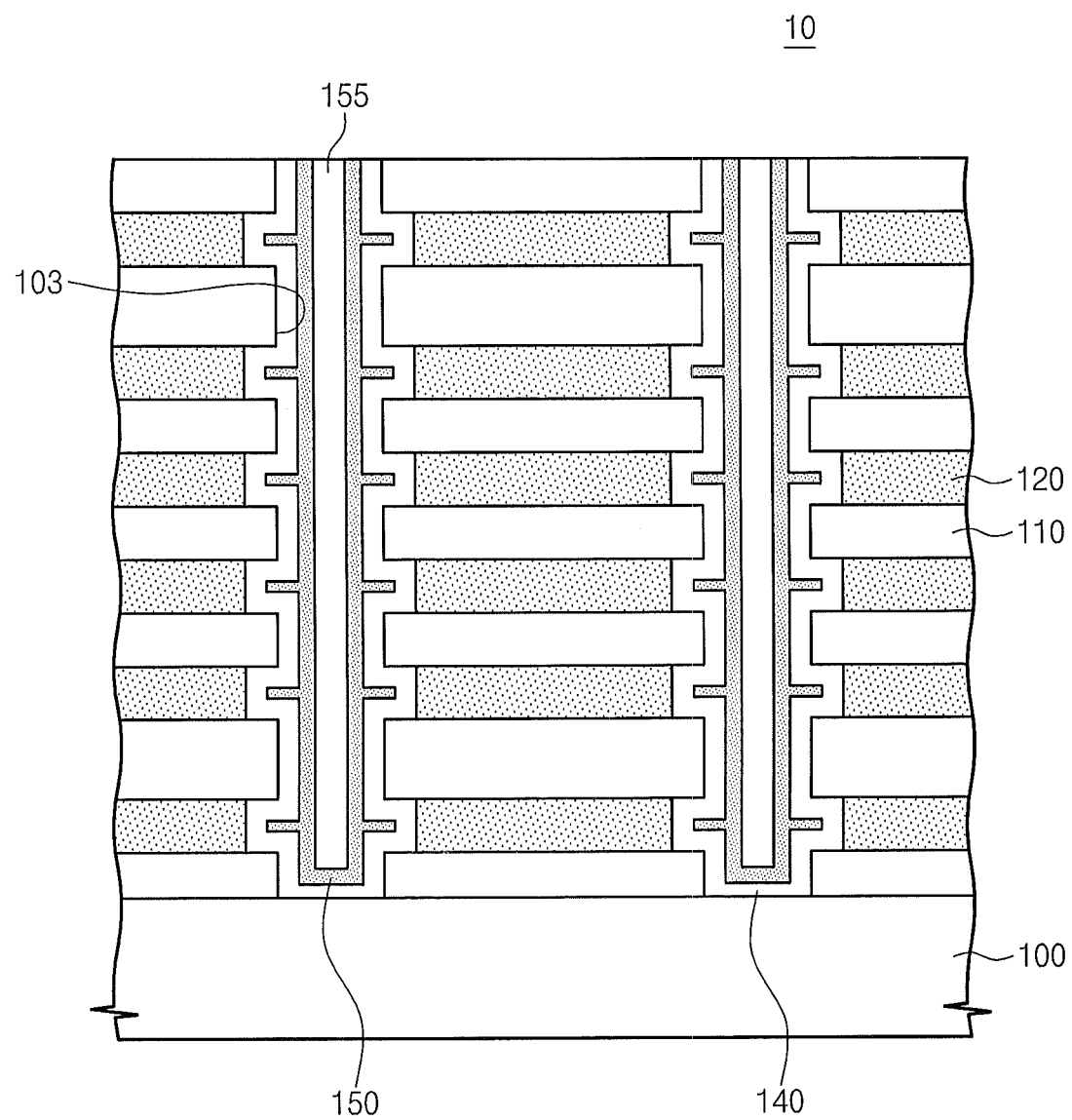
FIGS. 9A through 9D are cross sections illustrating processing steps in the fabrication of resistive memory devices according to some embodiments of the inventive concept.

FIGS. 9A through 9D are cross sections illustrating processing steps in the fabrication of a resistive memory device according to yet other some embodiments of the inventive concept. FIG. 9E is an enlarged cross section illustrating a portion of a memory cell of a resistive memory device according to some embodiments of the inventive concept. Referring to FIG. 9A, the mold stack 10 including the channel 140 and the variable resistance layer 150 may be formed using the same or similar process as that described with reference to FIGS. 5A through 5E. According to some embodiments, the gate insulating layer 130 of FIG. 5E may not be formed in the vertical hole 103.

Figure 9B:
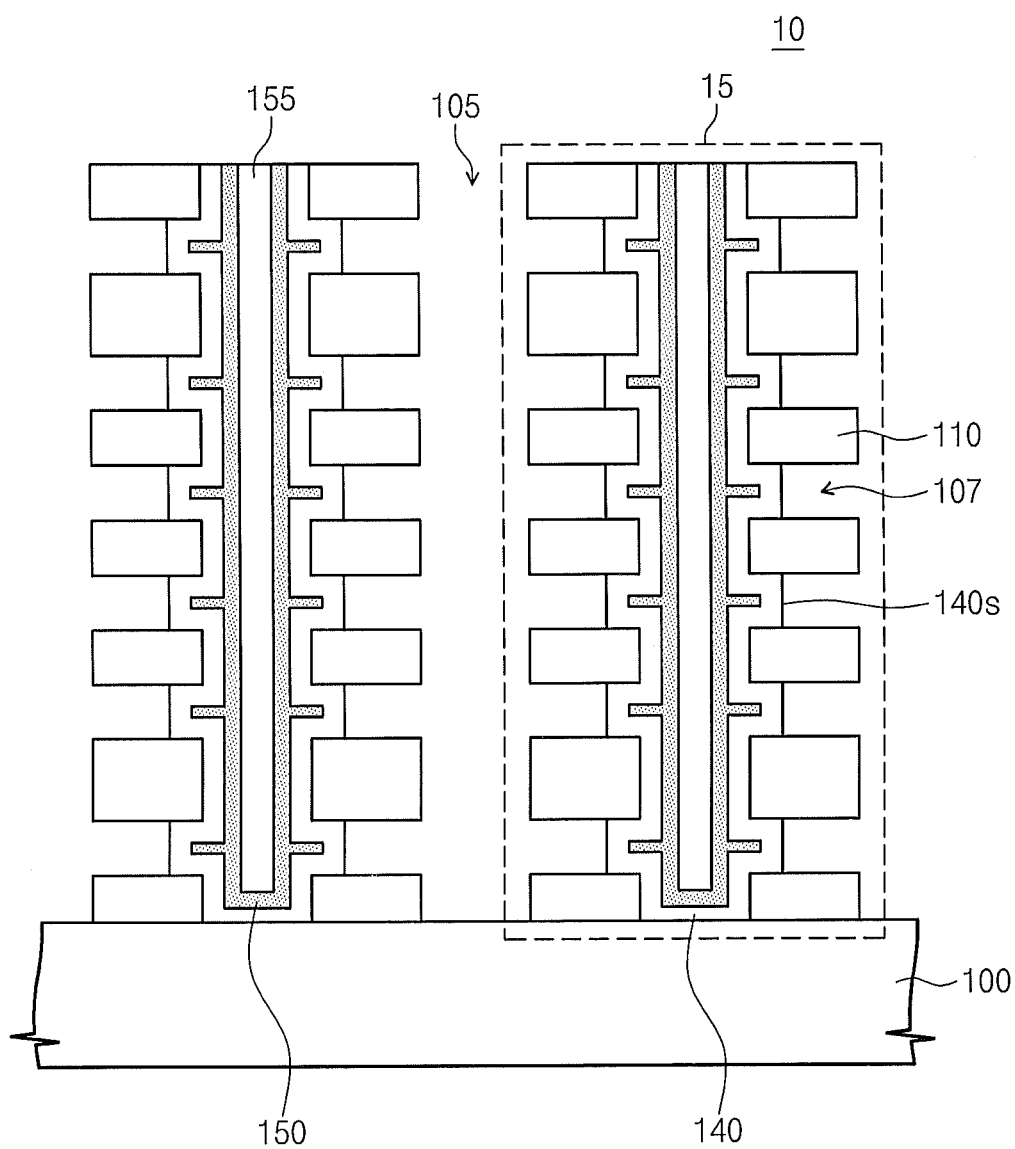

Referring to FIG. 9B, the process may be performed in the same or similar manner as that described with reference to FIGS. 5F and 5G. Accordingly, the trench 105 may be formed through the mold stack 10 to expose the substrate 100, and then, the sacrificial mold layers 120 exposed by the trench 105 may be removed to form the mold wing 15. According to the present embodiment, the spaces 107 may be formed to expose a side surface 140s of the channel 140.

Figure 9C:
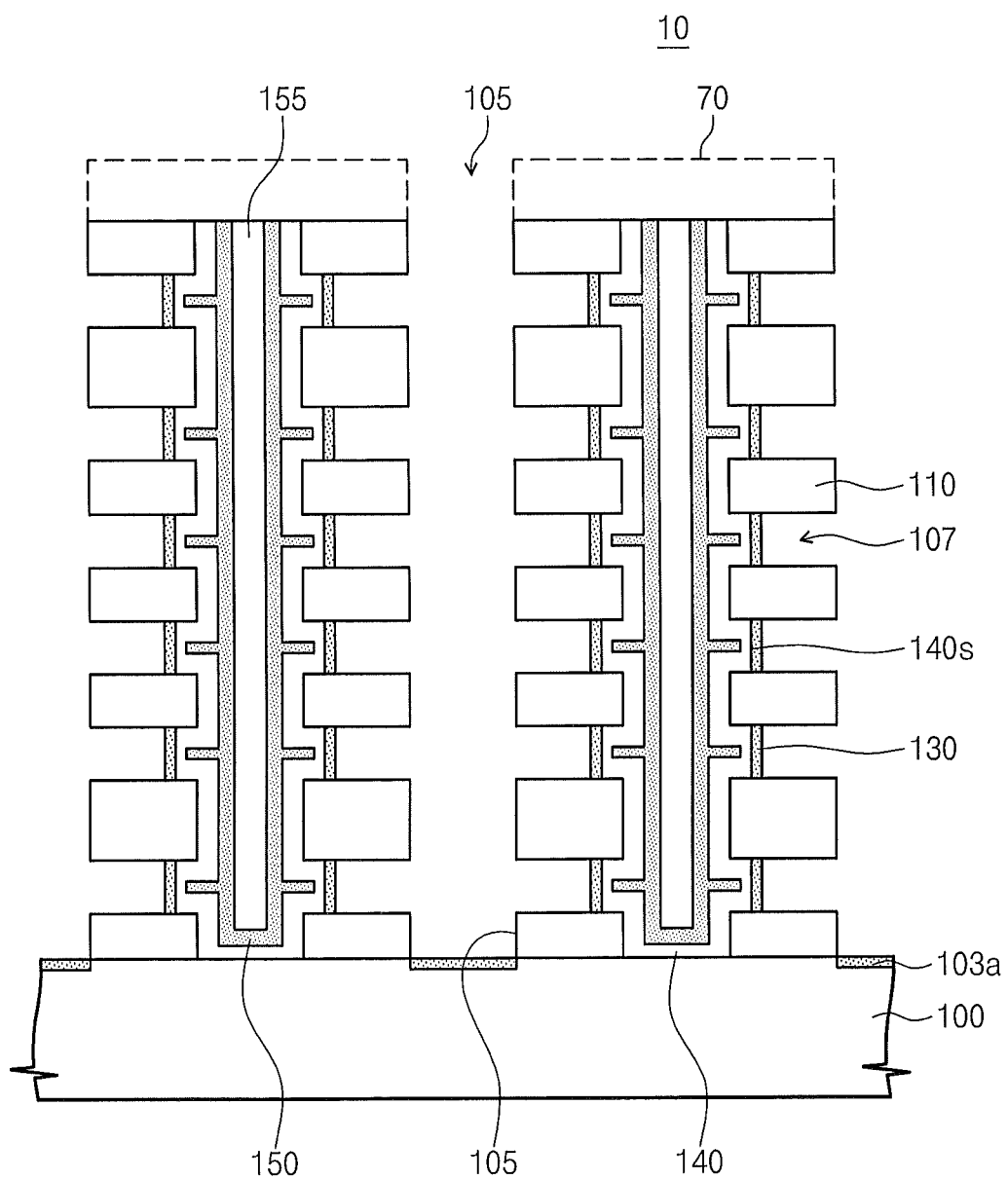

Referring to FIG. 9C, the exposed side surface 140s of the channel 140 may be oxidized to form the gate insulating layer 130. For example, the gate insulating layer 130 may be formed by performing a thermal treatment process oxidizing the exposed side surface 140s of the channel 140 in gas atmosphere containing oxygen. In other words, the gate insulating layer 130 may be a thermal oxide layer. Since the gate insulating layer 130 results from a chemical reaction between silicon atoms in the channel 140 and oxygen atoms, silicon atoms of the channel 140 may be consumed. Accordingly, the channel 140 may have a non-uniform thickness, as will be described with reference to FIG. 9E. During the thermal treatment process, the substrate 100 exposed by the trench 105 may be oxidized to form the insulating layer 130a. Since the top surface of the channel 140 may be covered with a mask

70 for forming the trench 105, and thus, the insulating layer may not be formed on the channel 140.

Figure 9D:
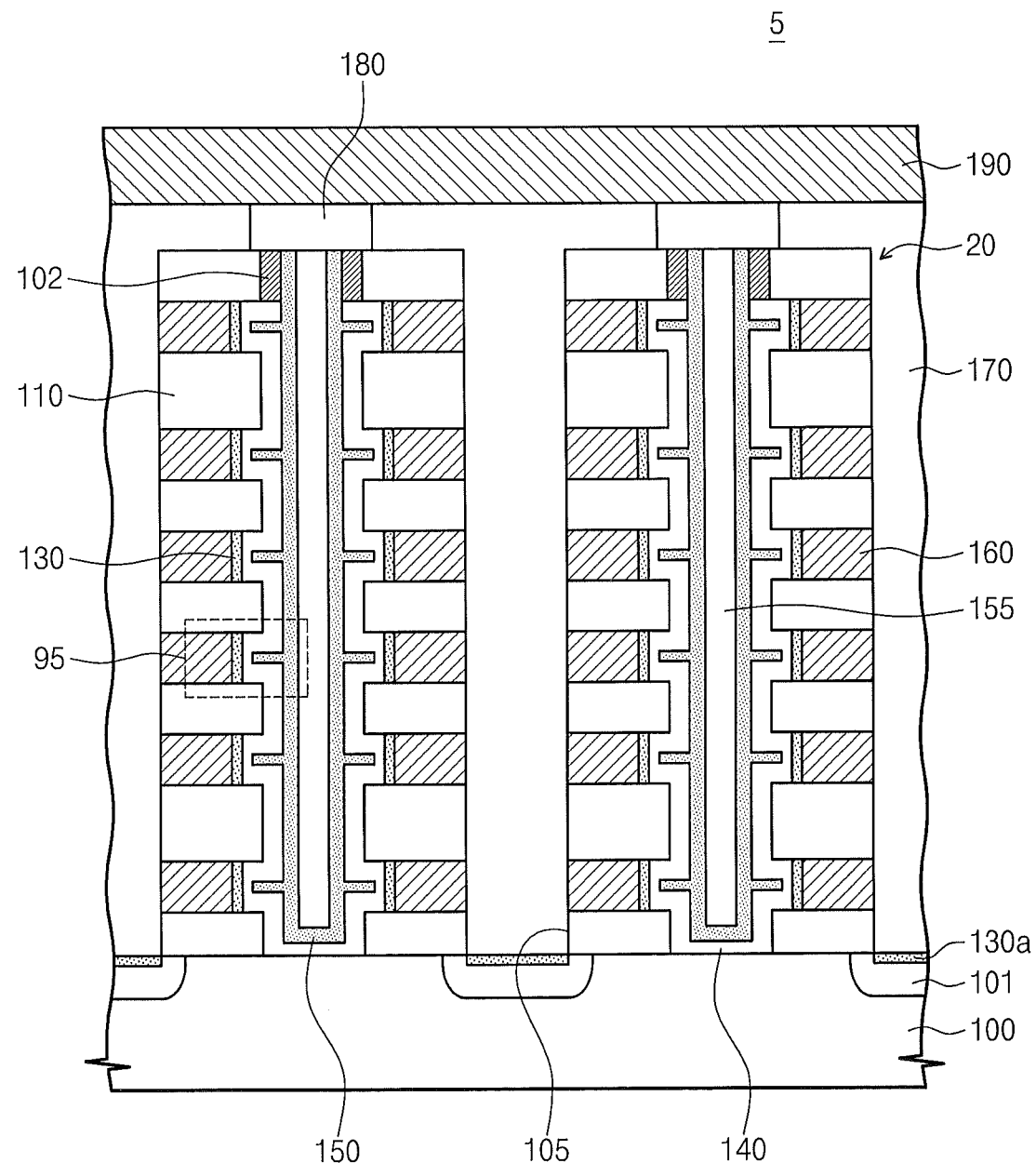
Figure 9E:
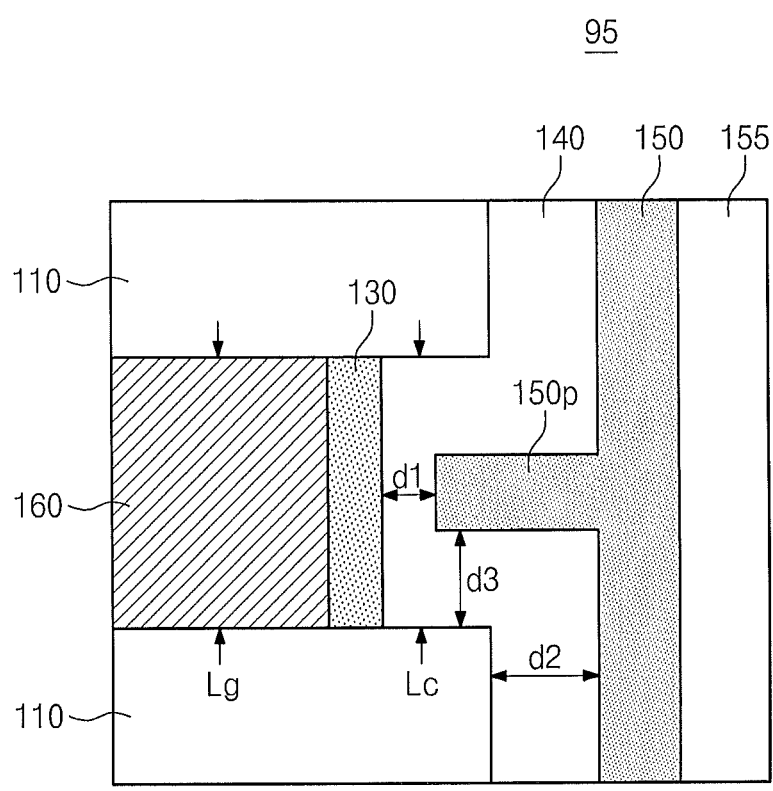
FIG. 9E is an enlarged cross section illustrating a portion of a memory cell of a resistive memory device according to some embodiments of the inventive concept.

Referring to FIG. 9D, a fifth resistive memory device 5 may be fabricated using the same or similar process as that described with reference to FIGS. 5H through 5J. According to some embodiments, a cell 95 may include the island-shaped gate insulating layer 130, which may be locally confined between the gate 160 and the channel 140.

Referring to FIG. 9E, since the gate insulating layer 130 is confined between the gate 160 and the channel 140, the length Lc of the channel 140 facing the gate 160 may be substantially equivalent to the thickness Lg of the gate 160. Further, since the gate insulating layer 130 is formed by consuming the channel 140, the channel 140 may have a non-uniform thickness along its extension direction. For example, a portion of the channel 140 facing the gate 160 may have a first thickness d1, another portion of the channel 140 facing the insulating mold layer 110 may have a second thickness d2 that is greater than the first thickness d1, and other portion of the channel 140 located between the insulating mold layer 110 and the protrusion 150p may have a third thickness d3 that is substantially equivalent or similar to the second thickness d2.

As shown in FIG. 9D, the gate insulating layer 130 may be formed spaced apart from or over the top surface of the substrate 100. Accordingly, an electric current can flow between the common source electrode 101 and the channel 140 without disturbance.

FIGS. 10A through 10D are cross sections illustrating processing' steps in the fabrication of a resistive memory device according to some embodiments of the inventive concept. FIG. 10E is an enlarged cross section illustrating a portion of a memory cell of a resistive memory device according to some embodiments of the inventive concept.

Figure 10A:
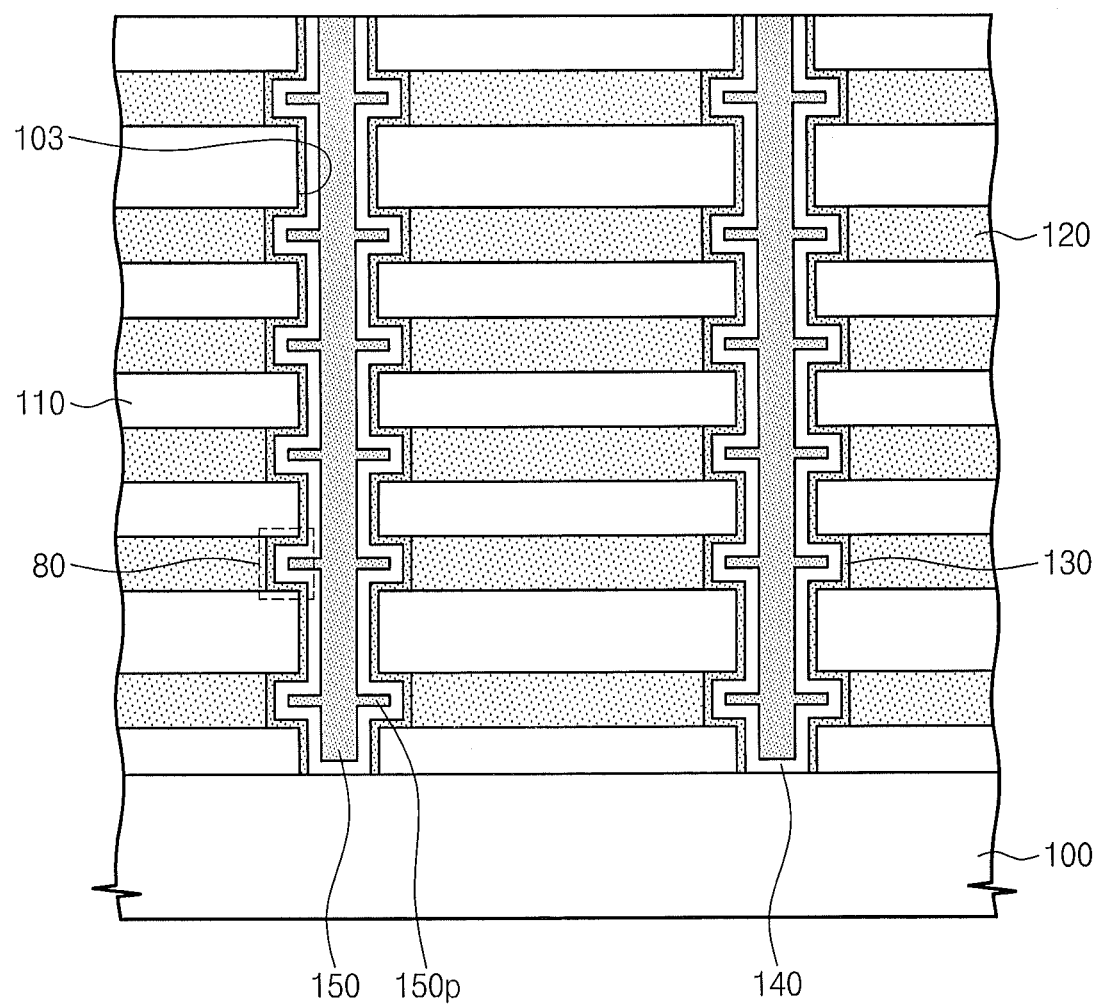
FIGS. 10A through 10D are cross sections illustrating processing steps in the fabrication of resistive memory devices according to some embodiments of the inventive concept.

Referring to FIG. 10A, the gate insulating layer 130, the channel 140, and the variable resistance layer 150 may be formed in the vertical hole 103 that is formed to penetrate the mold stack 10. According to some embodiments, the variable resistance layer 150 may include portions vertically extending along the vertical hole 103 and the protrusion 150p inserted into the alcove 80.

Figure 10B:
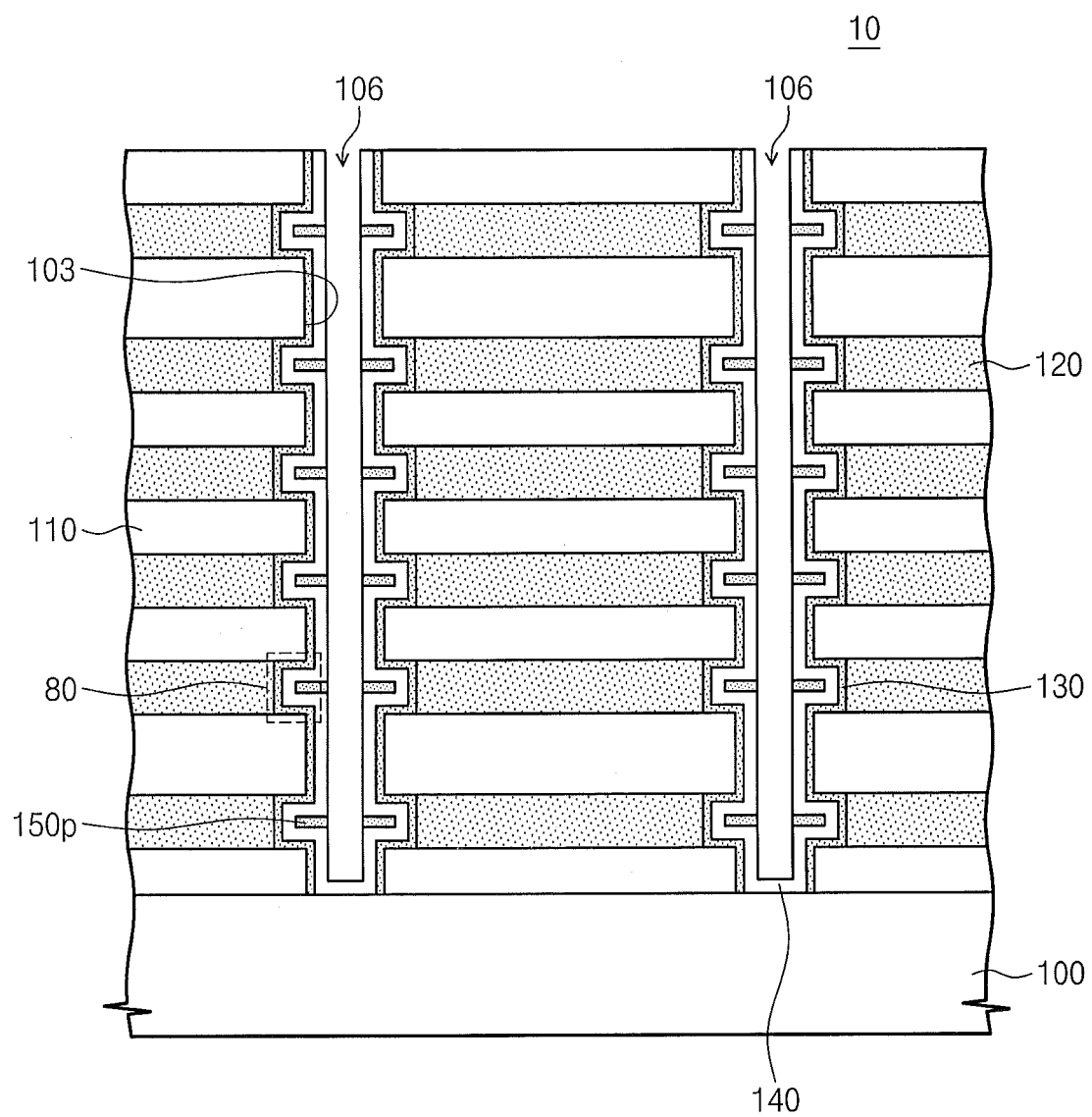

Referring to FIG. 10B, the variable resistance layer 150 may be etched to remain the protrusion 150p. For example, the variable resistance layer 150 may be anisotropically etched using etchant capable of selectively removing transition metal oxide. In these embodiments, the vertical portion of the variable resistance layer 150 may be removed to form an internal hole 106 in the vertical hole 103. In some embodiments, the internal hole 106 may be formed to expose the channel 140. Since the protrusion 150p is inserted into the alcove 80, it may not be etched in the anisotropic etching step.

Figure 10C:
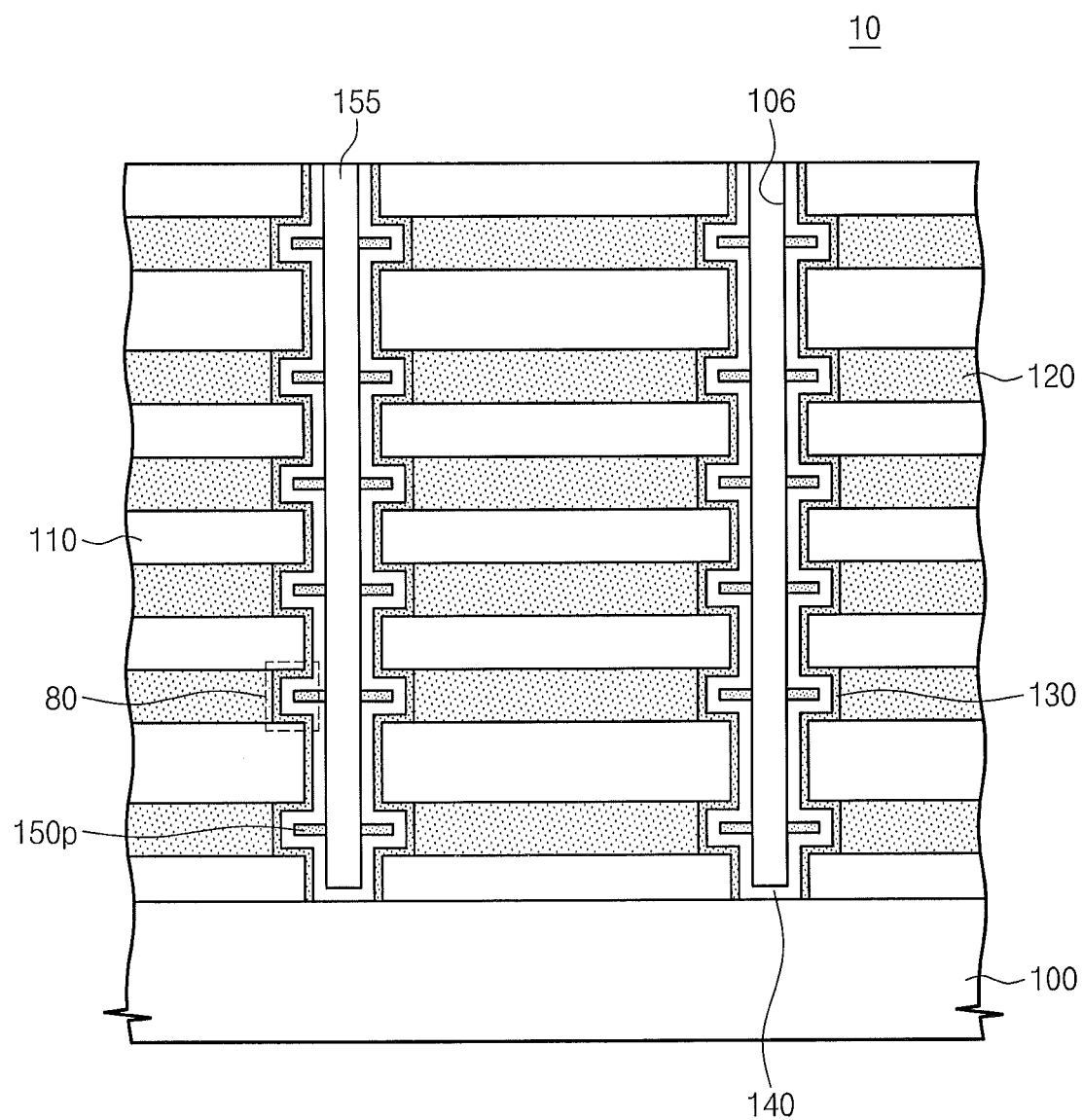

Referring to FIG. 10C, the internal hole 106 may be filled with the insulating gap-fill layer 155. The formation of the insulating gap-fill layer 155 may include depositing and planarizing a silicon oxide layer. According to some embodiments, the protrusion 150p (hereinafter, referred as to the variable resistance layer) may be surrounded by the channel 140 and the insulating gap-fill layer 155. For example, the protrusion 150p may be formed to have an island shape.

Figure 10D:
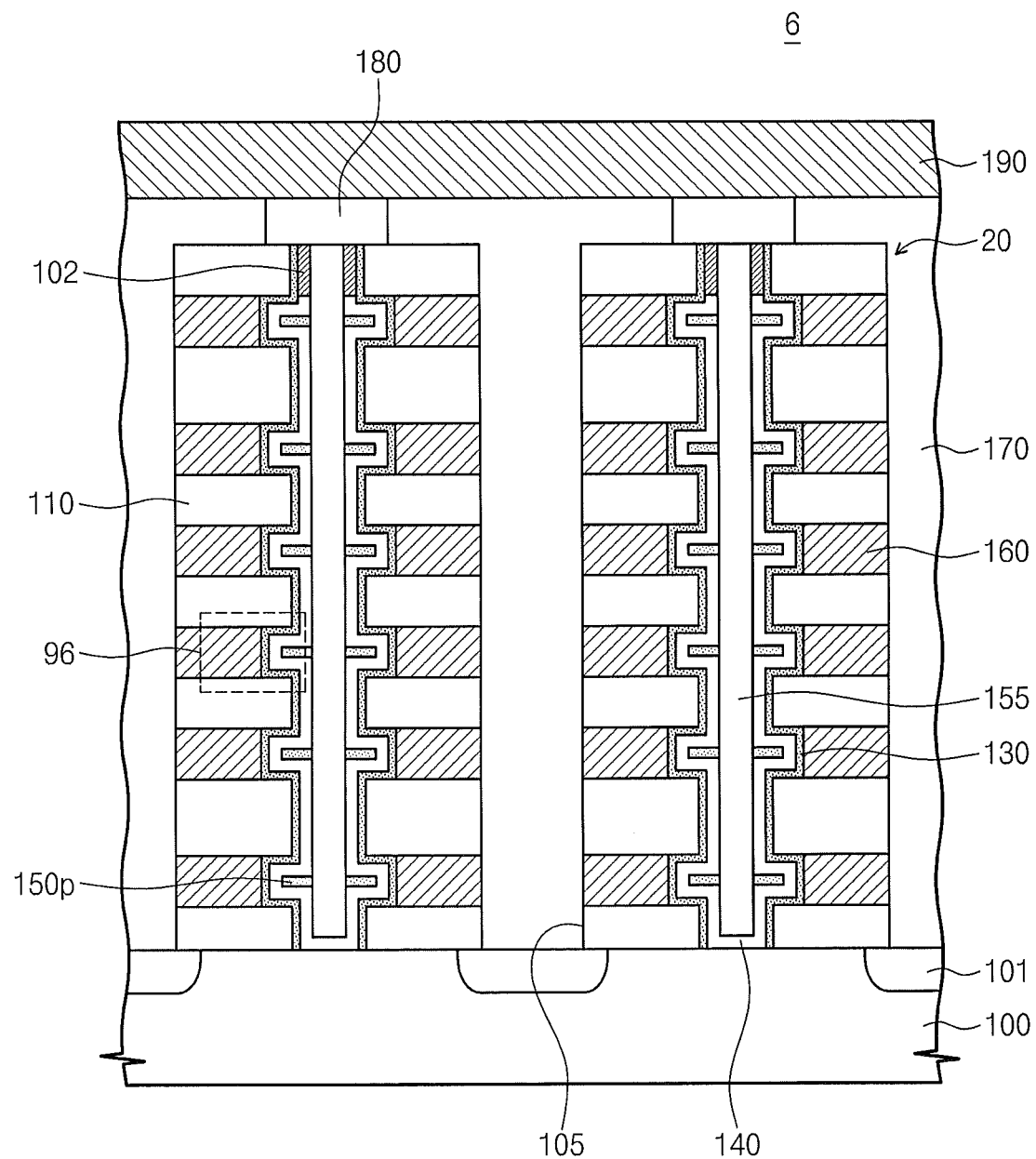
Figure 10E:
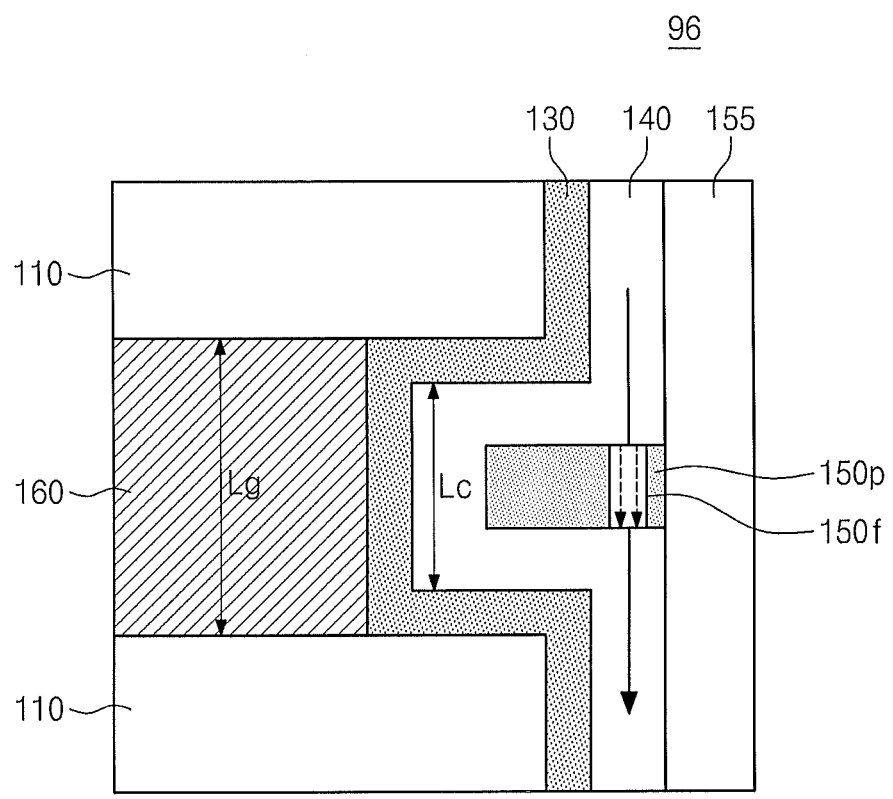
FIG. 10E is an enlarged cross section illustrating a portion of a memory cell of a resistive memory device according to some embodiments of the inventive concept.

Referring to FIG. 10D, the interlayered insulating layer 170 may be formed on the substrate 100 to fill the trench 105, the plug 180 may be formed through the interlayered insulating layer 170 to be connected to the drain electrode 102, and the bit line 190 may be formed on the interlayered insulating layer 170 to be electrically connected to the drain electrode 102 through the plug 180. In some embodiments, the interlayered insulating layer 170, the plug 180, and the bit line 190 may be formed using the same or similar process as that described with reference to FIGS. 5F through 5J. A sixth resistive memory device 6 may be fabricated. According to some embodiments, the sixth resistive memory device 6 may include the variable resistance layer 150p that is formed to have an island shape and is associated with a corresponding one of the gates 160.

Referring to FIG. 10E, as previously described with reference to FIG. 4B, the filament 150f may be produced in the variable resistance layer 150p. Due to the presence of the filament 150f, a current flow (solid arrow) may be vertically formed through the variable resistance layer 150p. A length Lc of the channel 140 that is overlapped with the gate 160 may be shorter than the thickness Lg of the gate 160.

FIGS. 11A through 11D are cross sections illustrating processing steps in the fabrication of a resistive memory device according to some embodiments of the inventive concept. FIG. 11E is an enlarged cross section illustrating a portion of a memory cell of a resistive memory device according to some embodiments of the inventive concept.

Figure 11A:
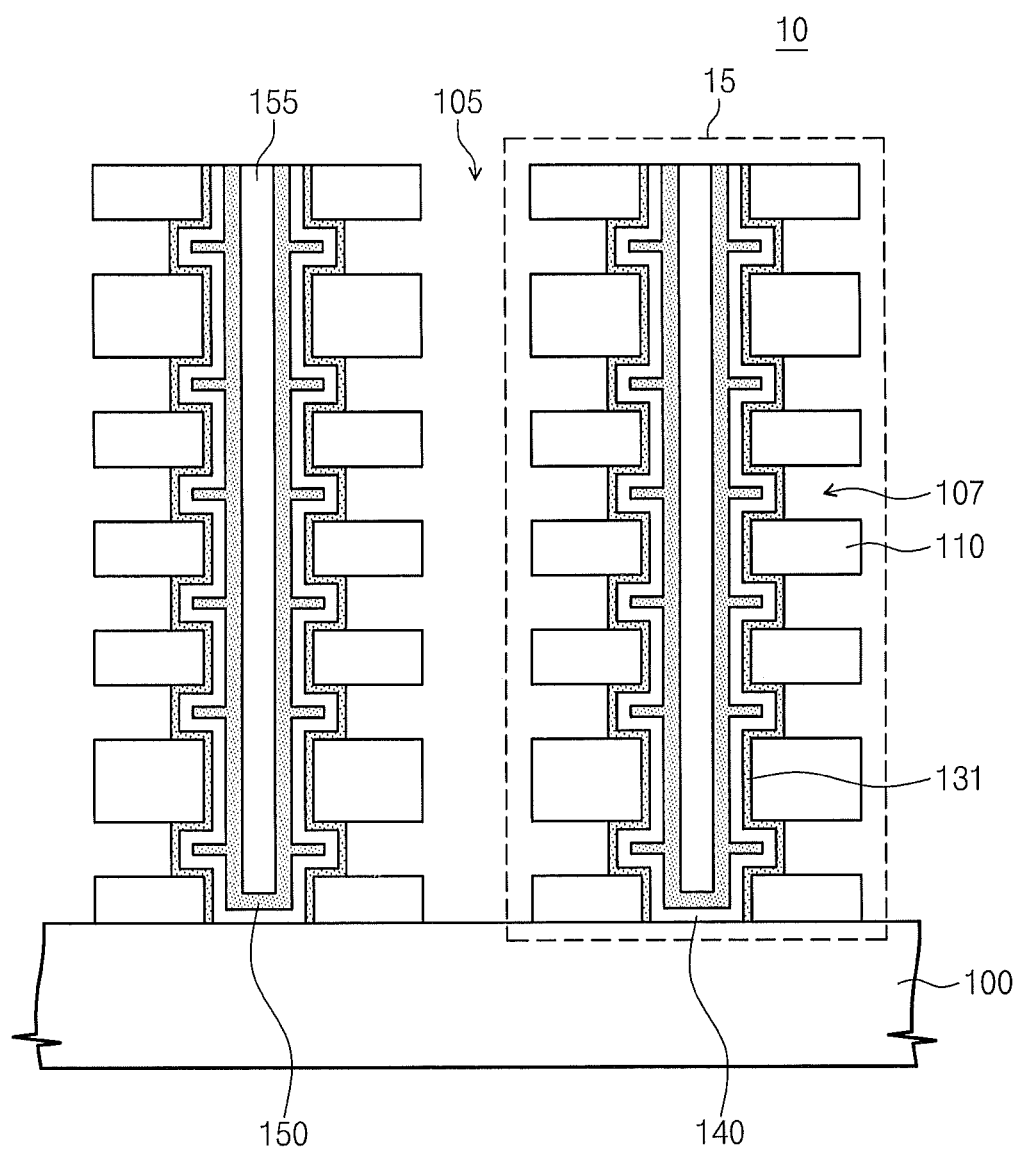
FIGS. 11A through 11D are cross sections illustrating processing steps in the fabrication of resistive memory devices according to some embodiments of the inventive concept.

Referring to FIG. 11A, the mold wing 15 may be formed on the substrate 100 through the same or similar process as that described with reference to FIGS. 5A through 5G. The spaces 107 may expose the gate insulating layer 131 (hereinafter, referred as to the first gate insulating layer).

Figure 11B:
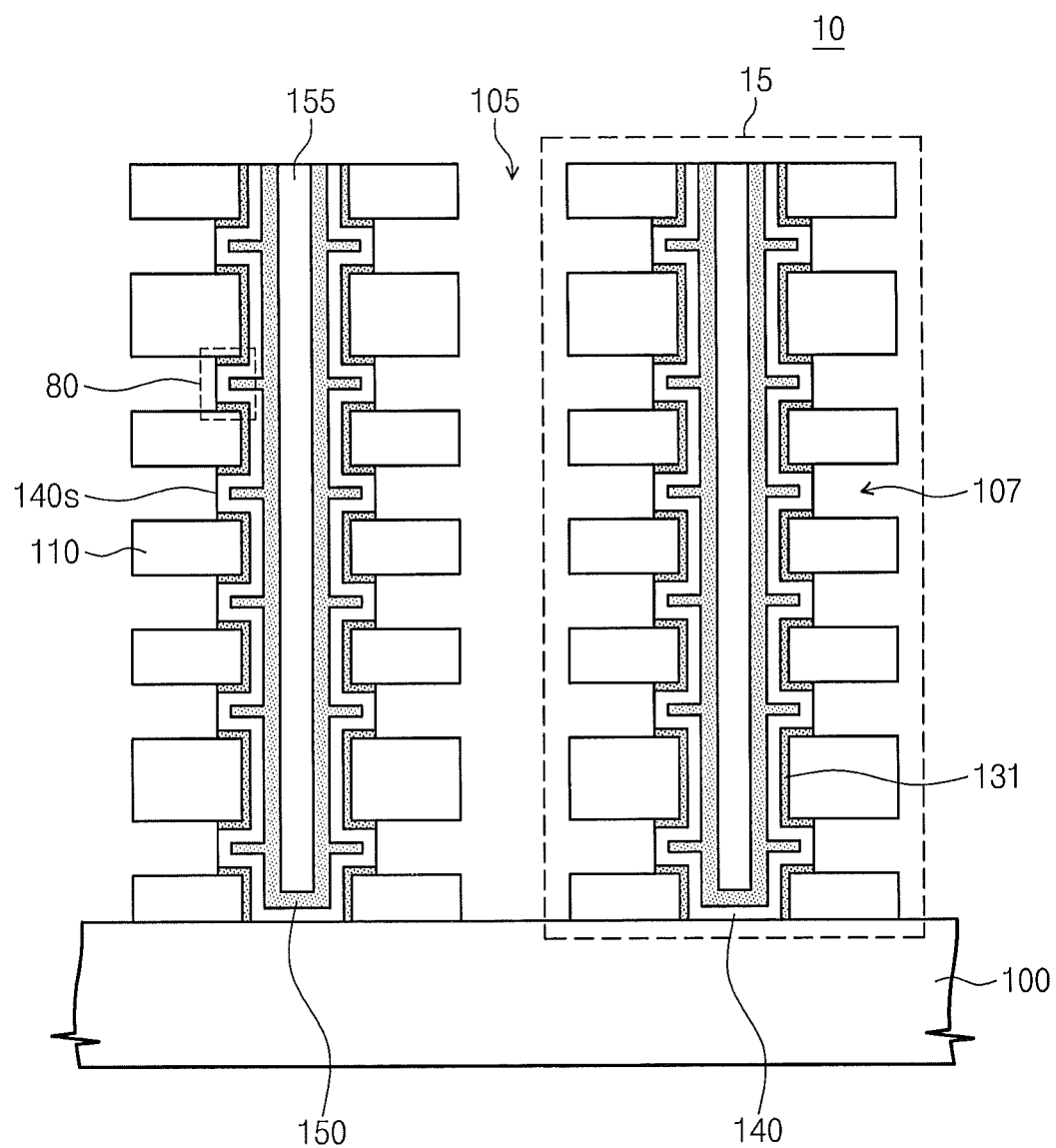

Referring to FIG. 11B, the first gate insulating layer 131 exposed by the spaces 107 may be selectively removed. For example, etchant, such as hydrofluoric acid (HF), may be supplied through the trench 105 to etch the first gate insulating layer 131. Accordingly, the side surface 140s of the channel 140 may be exposed through the alcove 80. The first gate insulating layer 130 may not be extended and be cut in the alcove 80. In the case where the first gate insulating layer 131 and the insulating mold layer 110 include the same material (e.g., silicon oxide), the insulating mold layer 110 may be partially etched during the removal of the first gate insulating layer 131. However, if the first gate insulating layer 131 is much thinner than the insulating mold layer 110, an etch amount of the insulating mold layer 110 may be too small to be neglected.

Figure 11C:
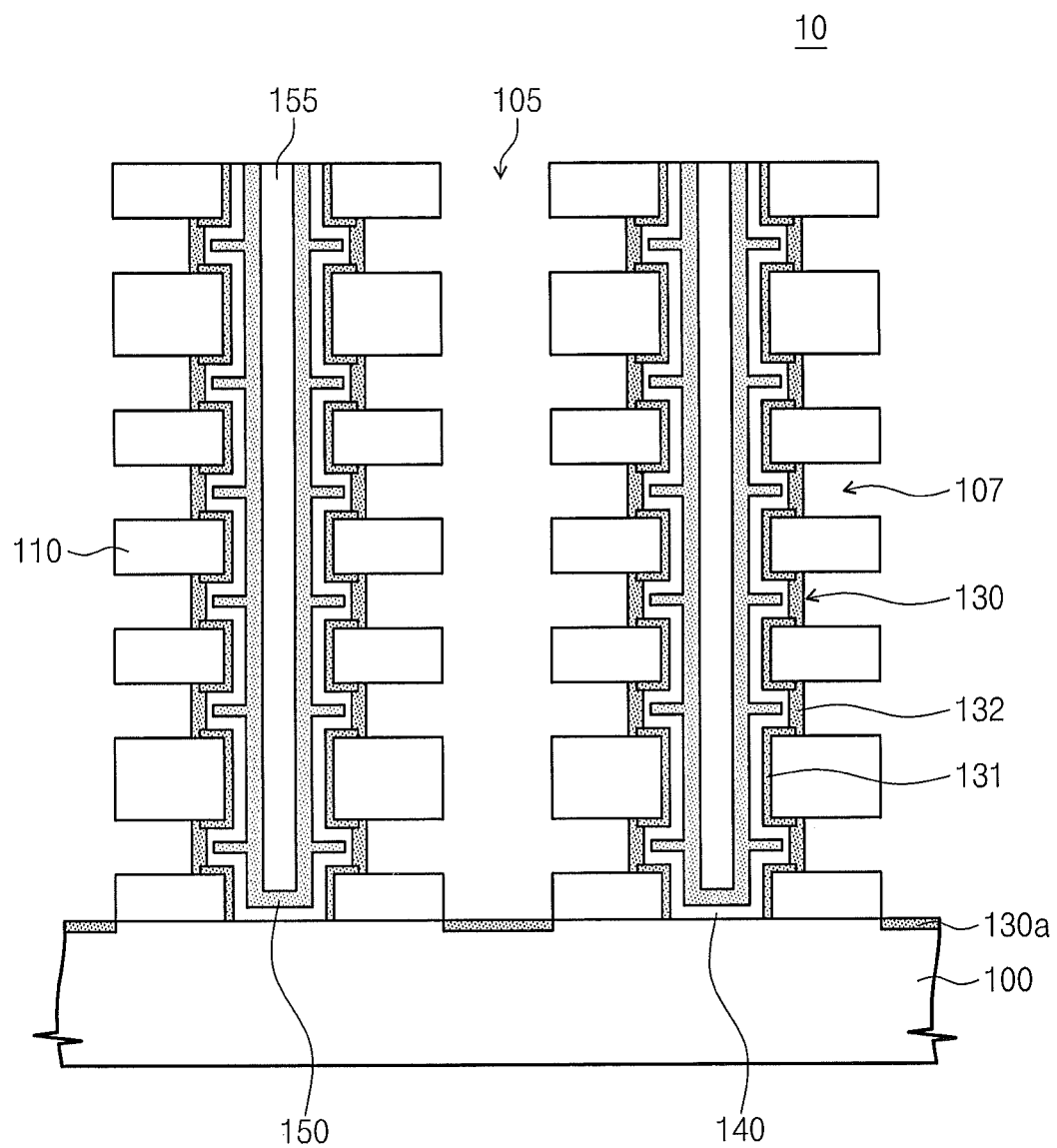

Referring to FIG. 11C, a thermal treatment process may be performed to oxidize the exposed side surface 140s of the channel 140. As the result of the thermal treatment process, a portion of the channel 140 may be oxidized to form a second gate insulating layer 132. A consumption amount of the channel 140 may be changed depending on a condition of the thermal treatment process. Thicknesses of the first and second gate insulating layers 131 and 132 may be controlled by adjusting the consumption amount of the channel 140. The second gate insulating layer 132 may connect divided portions of the first gate insulating layer 131 to each other, and this makes it possible to form the gate insulating layer 130 with a continuously extending profile. During the formation of the second gate insulating layer 132, the substrate 100 exposed by the trench 105 may be oxidized to form the insulating layer 130a.

Figure 11D:
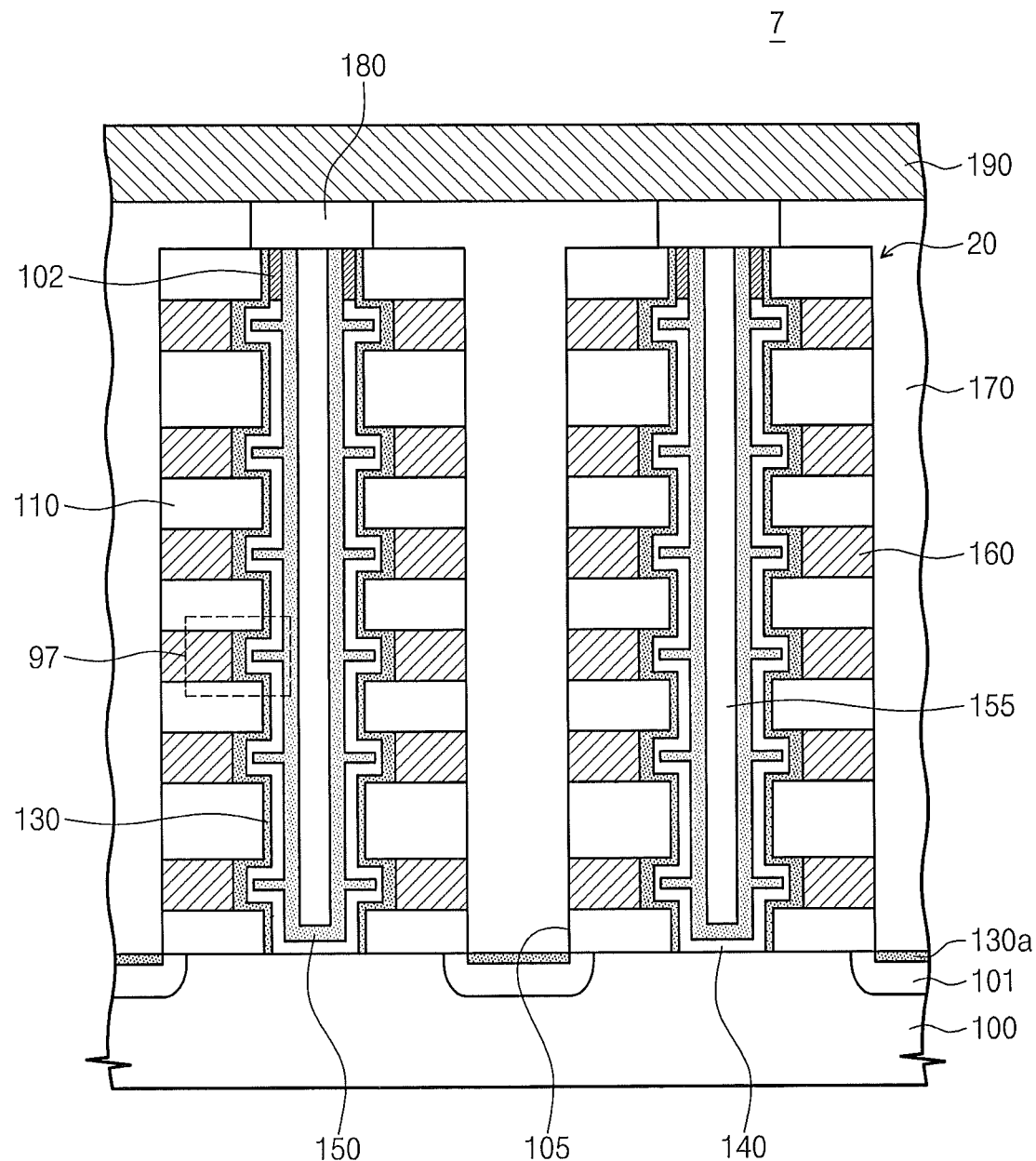
Figure 11E:
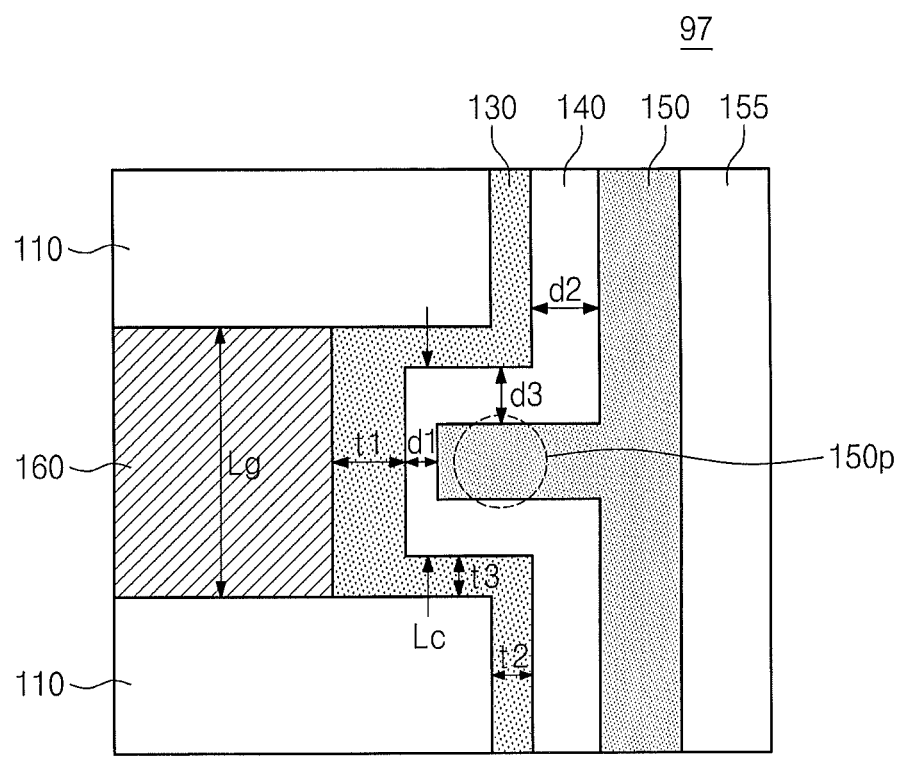
FIG. 11E is an enlarged cross section illustrating a portion of a memory cell of a resistive memory device according to some embodiments of the inventive concept.

Referring to FIG. 11D, a seventh resistive memory device 7 may be fabricated through the same or similar process as that described with reference to FIGS. 5H through 5J. According to some embodiments, the seventh resistive memory device 7 may include a cell 97, in which at least one of the gate insulating layer 130 and the channel 140 has a thickness varying along its extension direction.

Referring to FIG. 11E, as described with reference to FIG. 11C, the second gate insulating layer 132 may be formed by consuming the channel 140. Accordingly, the consumed portion of the channel 140 may have a smaller thickness than that of other portions. For example, a portion of the channel 140 facing the gate 160 may have a first thickness d1, another portion of the channel 140 facing the insulating mold layer 110 may have a second thickness d2 that is greater than the first thickness d1, and other portion of the channel 140 located between the insulating mold layer 110 and the protrusion 150p may have a third thickness d3 that is substantially equivalent or similar to the second thickness d2. The length Lc of the channel 140 adjacent to the gate 160 may be shorter than the thickness Lg of the gate 160.

As discussed with reference to FIG. 11C, the thickness of the second gate insulating layer 132 may be changed depending on a process condition of the thermal treatment process. Accordingly, the gate insulating layer 130 may have a thickness varying along its extending direction. For example, a portion of the gate insulating layer 130 adjacent to the gate 160 may have a first thickness t1, another portion of the gate insulating layer 130 facing the insulating mold layer 110 may have a second thickness t2, and other portion of the gate insulating layer 130 between the protrusion 150p and the insulating mold layer 110 may have a third thickness t3. In some embodiments, the second and third thicknesses t2 and t3 of the gate insulating layer 130 may be substantially equivalent or similar to each other. The first thickness t1 of the gate insulating layer 130 may be dependent on a consumption amount of the channel 140. For example, in the case where the consumption amount of the channel 140 is large, the first thickness t1 may be greater than the second thickness t2 and/or the third thickness t3. According to the present embodiment, the first thickness t1 of the gate insulating layer 130 may be controlled to be in a desired range by adjusting a process condition of the thermal treatment process.

Since the third thickness t3 of the gate insulating layer 130 is smaller than the first thickness t1 thereof, it is possible to reduce a vertical space between the insulating mold layers 110 and preserve an electric isolation property of the gate insulating layer 130. The reduced vertical space between the insulating mold layers 110 makes it possible to decrease a height of the gate stack 20, and thus, the seventh resistive memory device 7 can be fabricated to have a reduced height.

FIGS. 12A through 12D are cross sections illustrating processing steps in the fabrication of a resistive memory device according to some embodiments of the inventive concept. FIG. 12E is an enlarged cross section illustrating a portion of a memory cell of a resistive memory device according to some embodiments of the inventive concept.

Figure 12A:
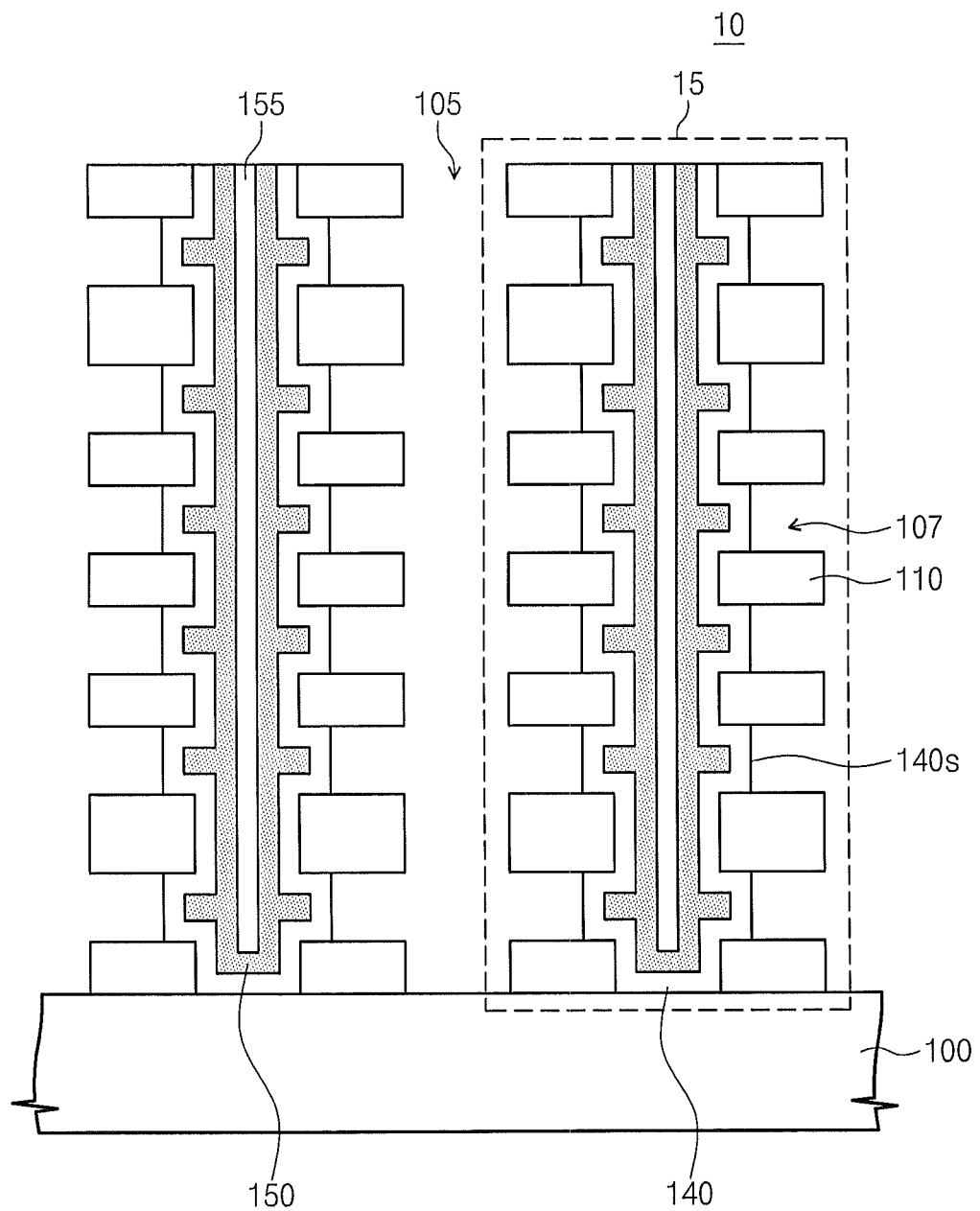
FIGS. 12A through 12D are cross sections illustrating processing steps in the fabrication of resistive memory devices according to some embodiments of the inventive concept.

Referring to FIG. 12A, the mold wing 15 may be formed through the same or similar process as that described with reference to FIGS. 9A and 9B. The side surface 140s of the channel 140 may be exposed through the spaces 107. According to some embodiments, as shown in FIG. 5E, the gate insulating layer 130 covering the channel 140 may not be formed.

Figure 12B:
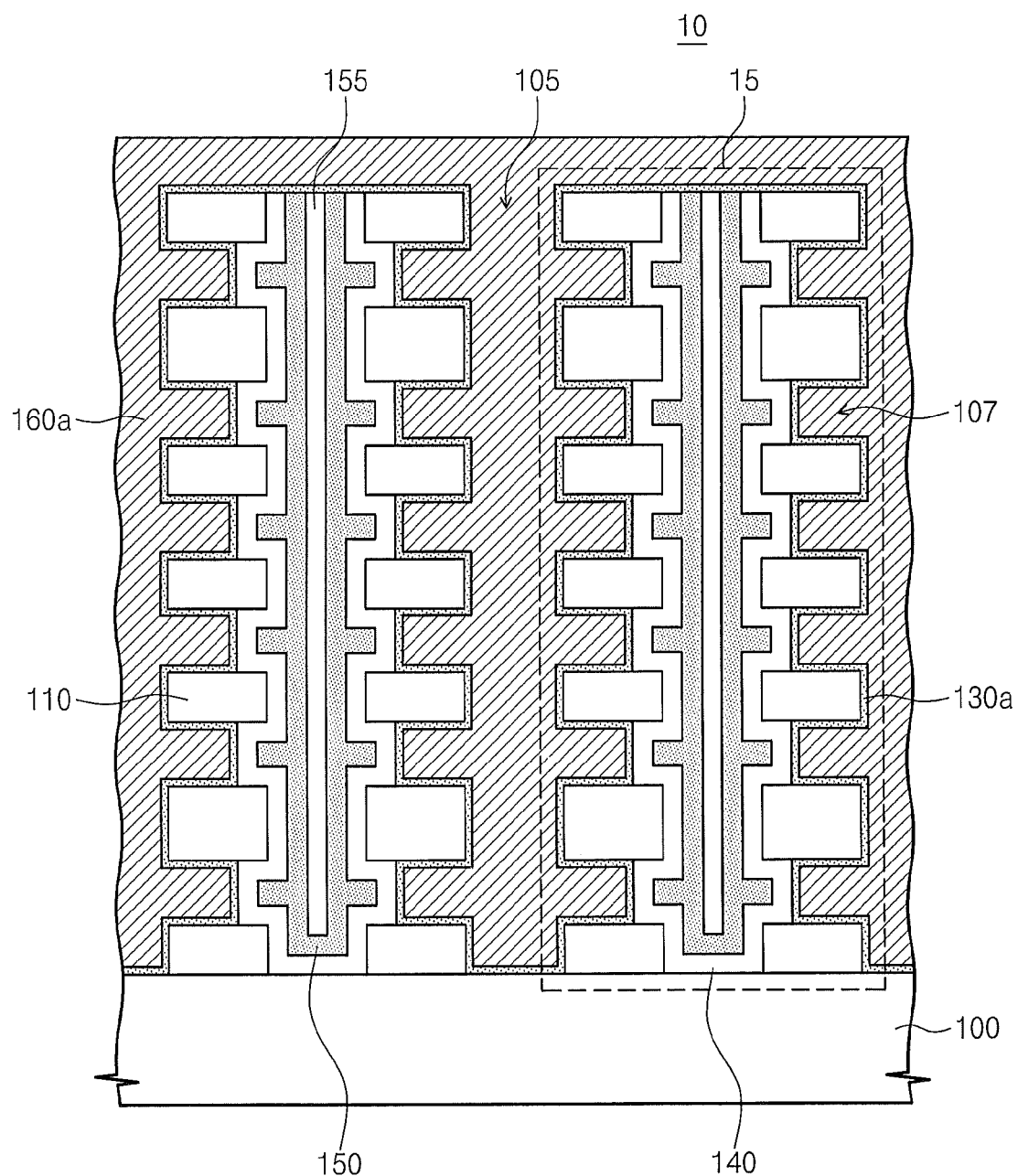

Referring to FIG. 12B, the insulating layer 130a may be formed to cover the mold wing 15, and then, the conductive layer 160a may be formed to cover the mold wing 15. The insulating layer 130a may be formed by depositing a silicon oxide layer, and thus, it may cover conformally the mold wing 15. The insulating layer 130a may cover continuously the insulating mold layer 110, the channel 140, and the substrate 100.

Figure 12C:
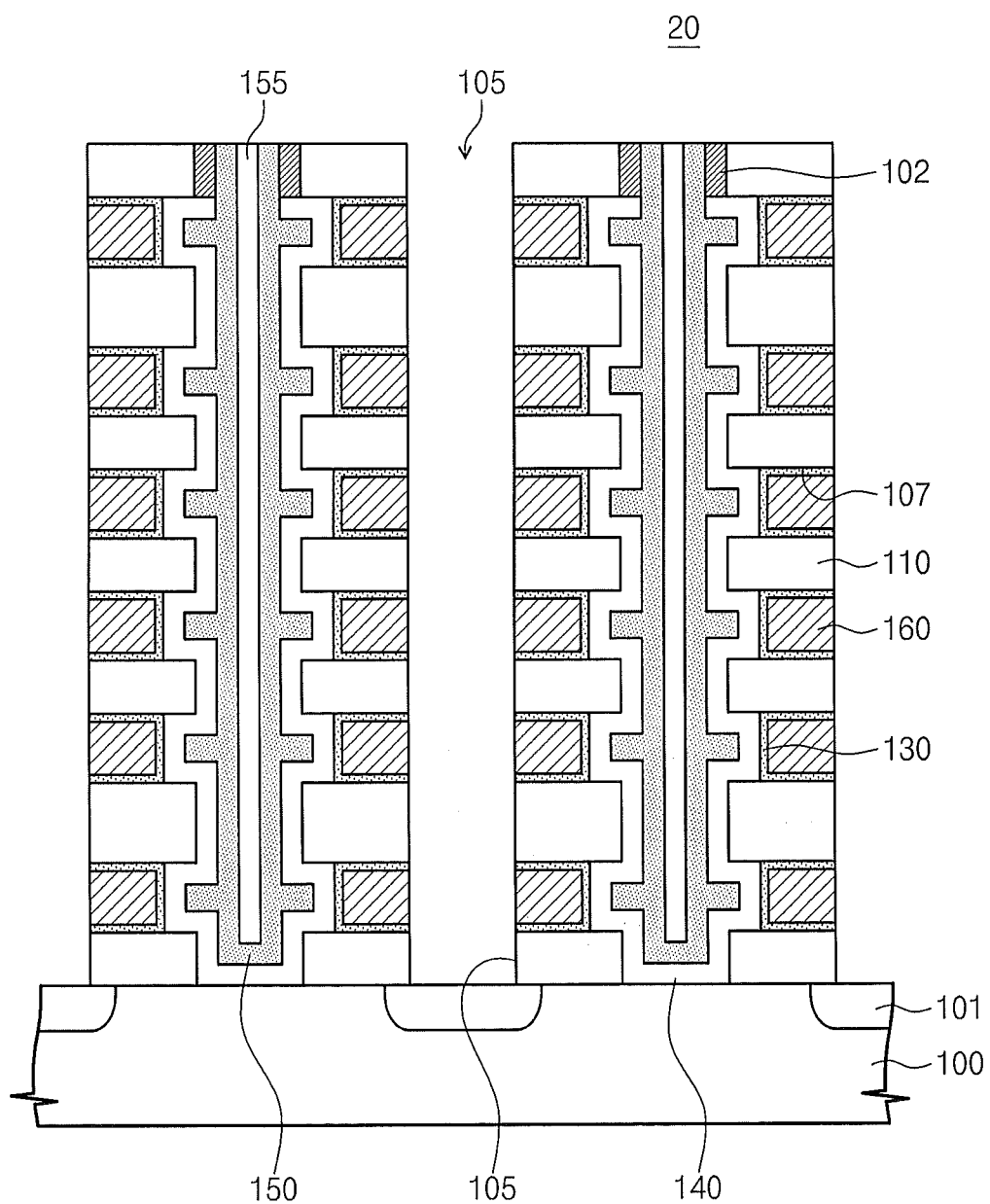

Referring to FIG. 12C, the conductive layer 160a may be planarized and anisotropically etched to form the gate stack 20. In some embodiments, the gate stack 20 may include the gates 160, each of which fills the corresponding one of the spaces 107. The insulating layer 130a may be partially etched to form the gate insulating layer 130 covering inner surfaces of the spaces 107. In some embodiments, the insulating layer 130a may not be etched. Ion implantation process may be performed to form the common source electrode 101 in the substrate 100 and to form the drain electrode 102 in the top portion of the channel 140.

Figure 12D:
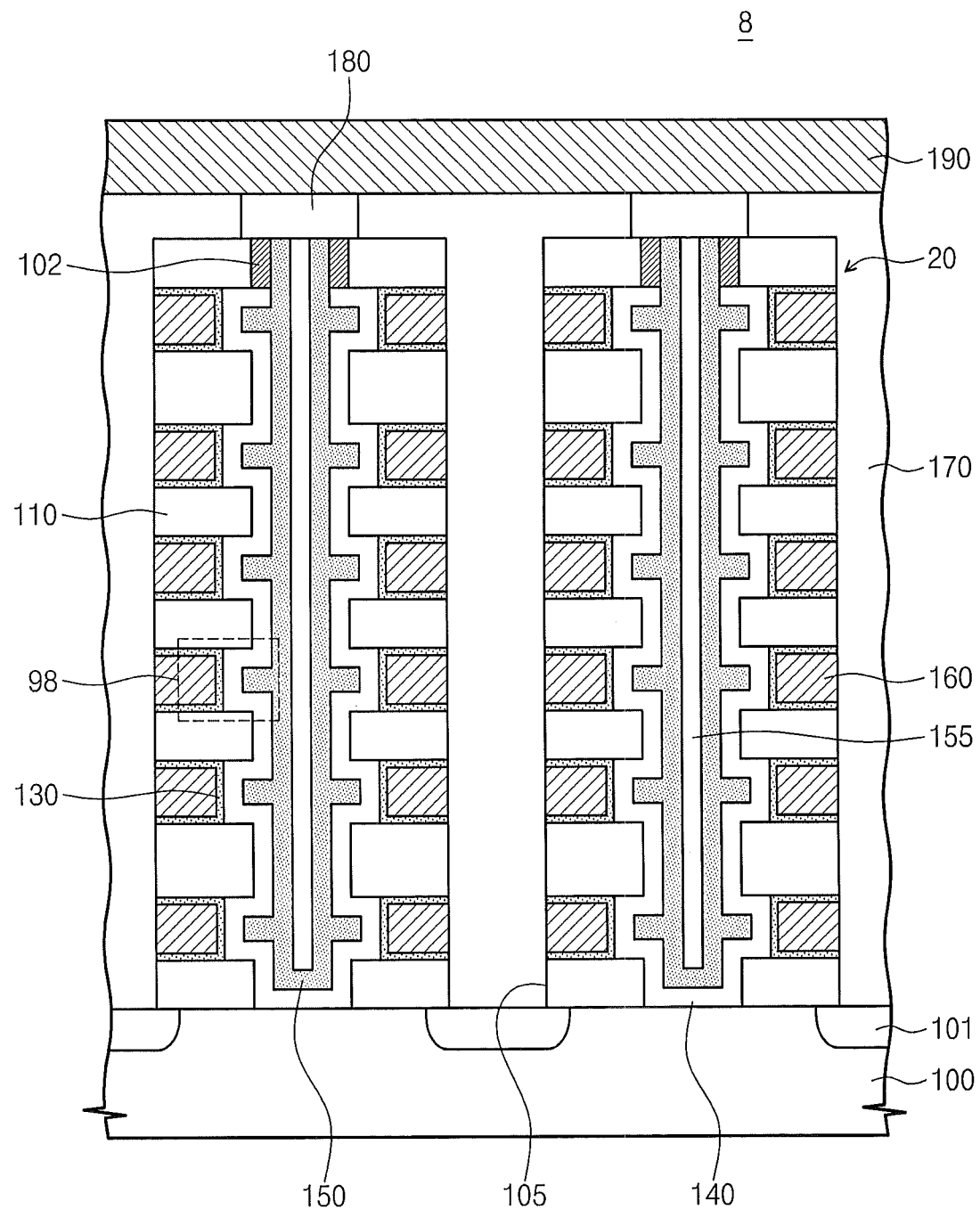
Figure 12E:
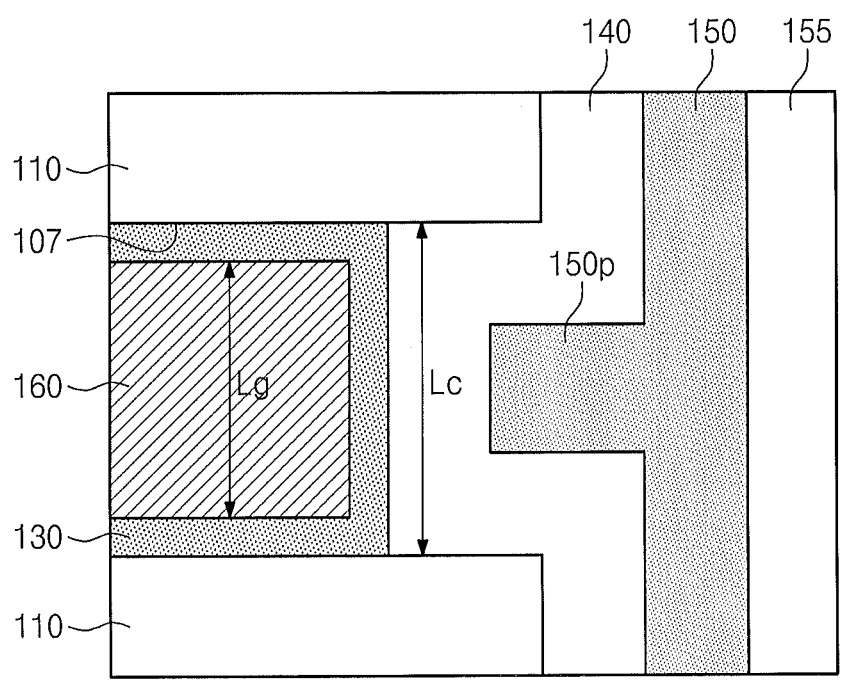
FIG. 12E is an enlarged cross section illustrating a portion of a memory cell of a resistive memory device according to some embodiments of the inventive concept.

Referring to FIG. 12D, an eighth resistive memory device 8 may be fabricated by the same or similar process as that described with reference to FIG. 5J. According to some embodiments, a cell 98 may include the gate insulating layer 130 that is formed to cover top and bottom surfaces of the gate 160 and a side surface of the gate 160 facing the channel 140. In other words, the gate insulating layer 130 of the cell 98 may include a bracket shaped portion covering the gate 160.

Referring to FIG. 12E, the gate insulating layer 130 may be disposed in the space 107 or between the gate 160 and the insulating mold layer 110. Accordingly, the length Lc of the channel 140 facing the gate 160 may be greater than a thickness Lg of the gate 160.

FIGS. 13A through 13D are cross sections illustrating processing steps in the fabrication of a resistive memory device according to some embodiments of the inventive concept. FIG. 13E is an enlarged cross section illustrating a portion of a memory cell of a resistive memory device according to some embodiments of the inventive concept.

Figure 13A:
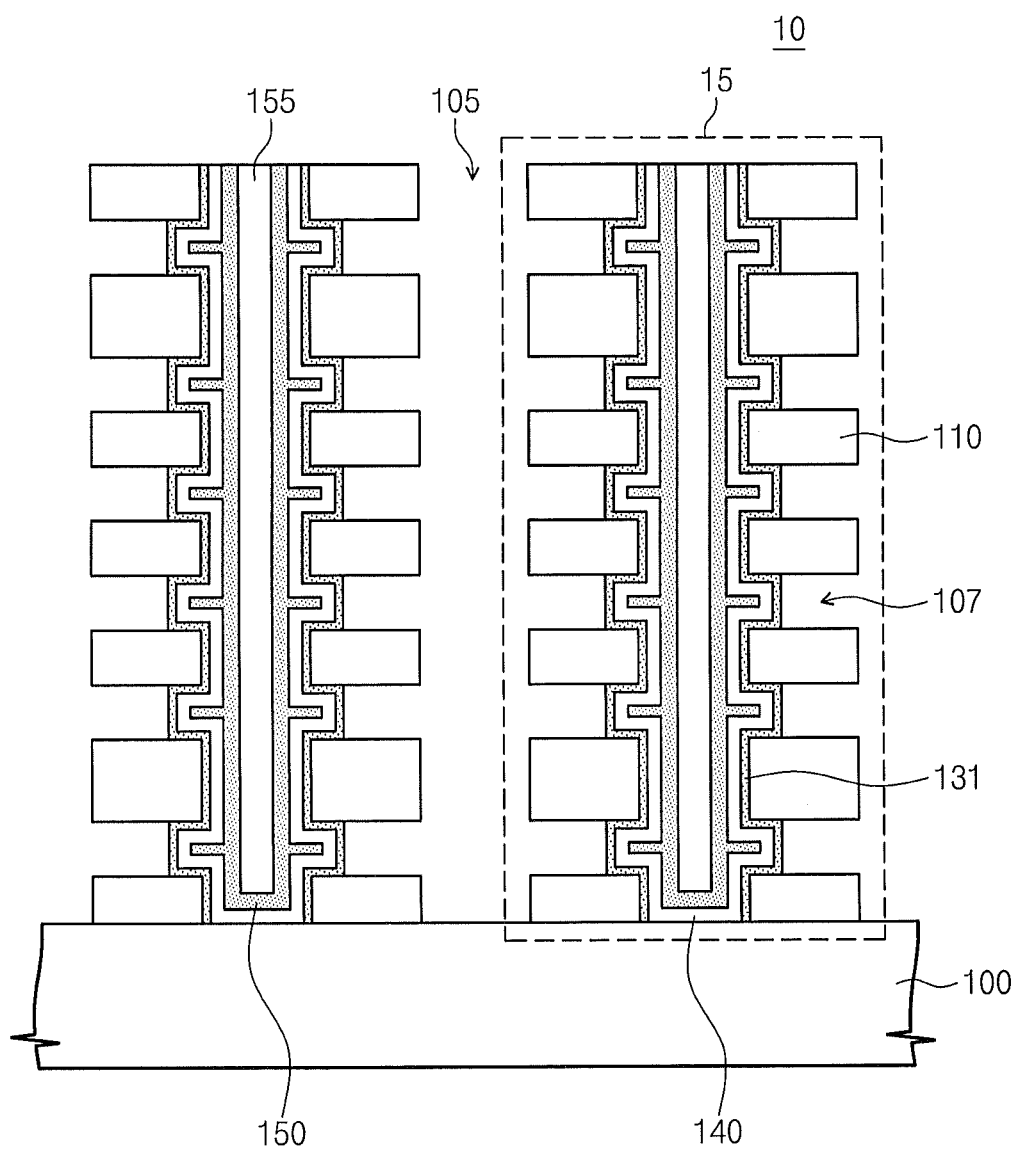
FIGS. 13A through 13D are cross sections illustrating processing steps in the fabrication of resistive memory devices according to some embodiments of the inventive concept.

Referring to FIG. 13A, the mold wing 15 may be formed on the substrate 100 through the same or similar process as that described with reference to FIGS. 5A through 5G. The spaces 107 may expose the gate insulating layer 131 (hereinafter, referred as to the first gate insulating layer).

Figure 13B:
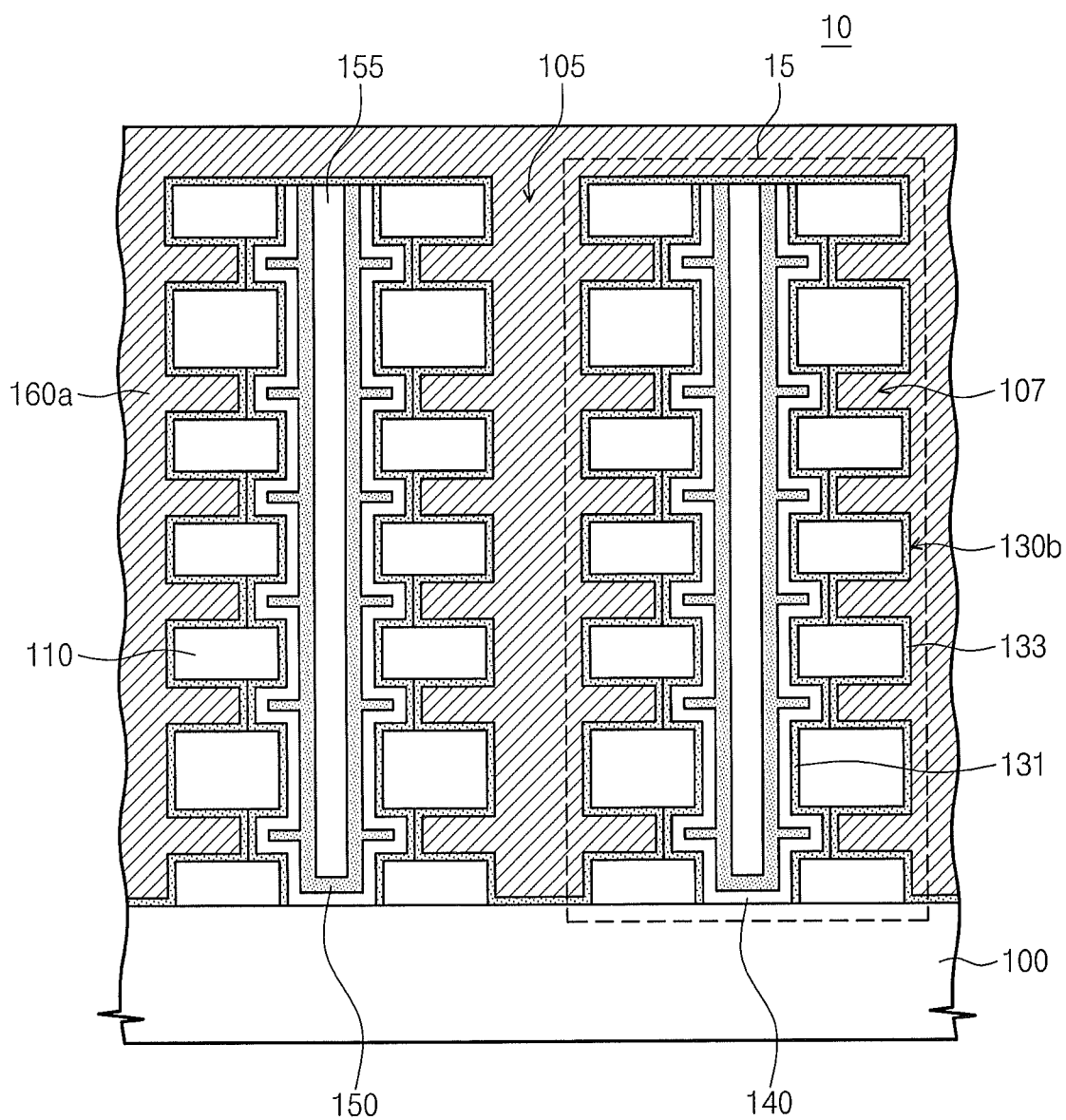

Referring to FIG. 13B, a second gate insulating layer 133 may be formed to surround the mold wing 15, and the conductive layer 160a may be formed to cover the mold wing 15. The second gate insulating layer 133 may be formed by depositing a silicon oxide layer. In some embodiments, the second gate insulating layer 133 may be formed to cover the insulating mold layers 110, the first gate insulating layer 131, and the substrate 100 continuously. According to some embodiments, a composite insulating layer 130b including the first and second gate insulating layers 131 and 133 may be formed.

Figure 13C:
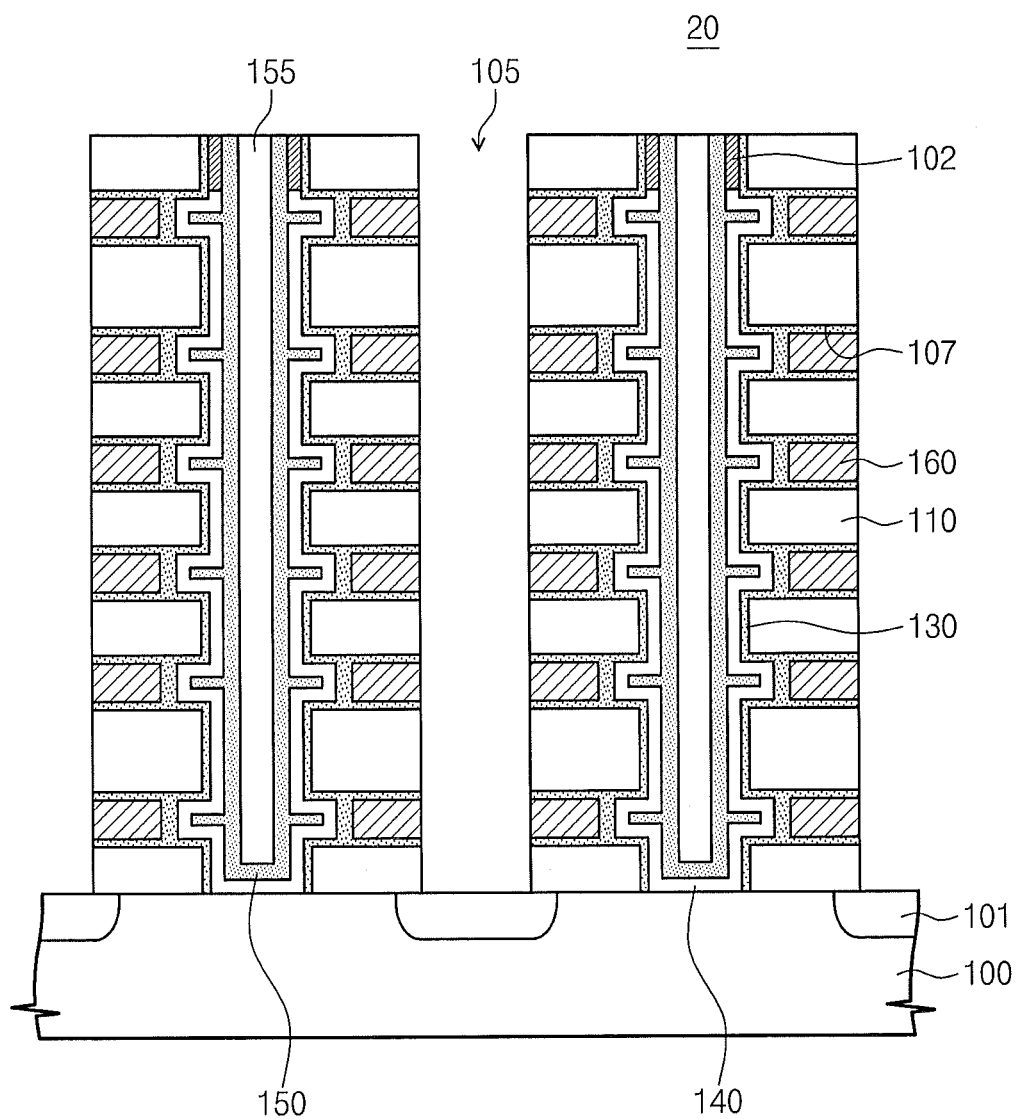

Referring to FIG. 13C, the conductive layer 160a may be planarized and anisotropically etched to form the gate stack 20. In some embodiments, the gate stack 20 may include the gates 160, each of which fills the corresponding one of the spaces 107. The composite insulating layer 130b may be partially etched to form the gate insulating layer 130 covering the inner surface of the space 107. In some embodiments, the composite insulating layer 130b may not be etched. Ion implantation process may be performed to form the common source electrode 101 in the substrate 100 and to form the drain electrode 102 in the top portion of the channel 140.

Figure 13D:
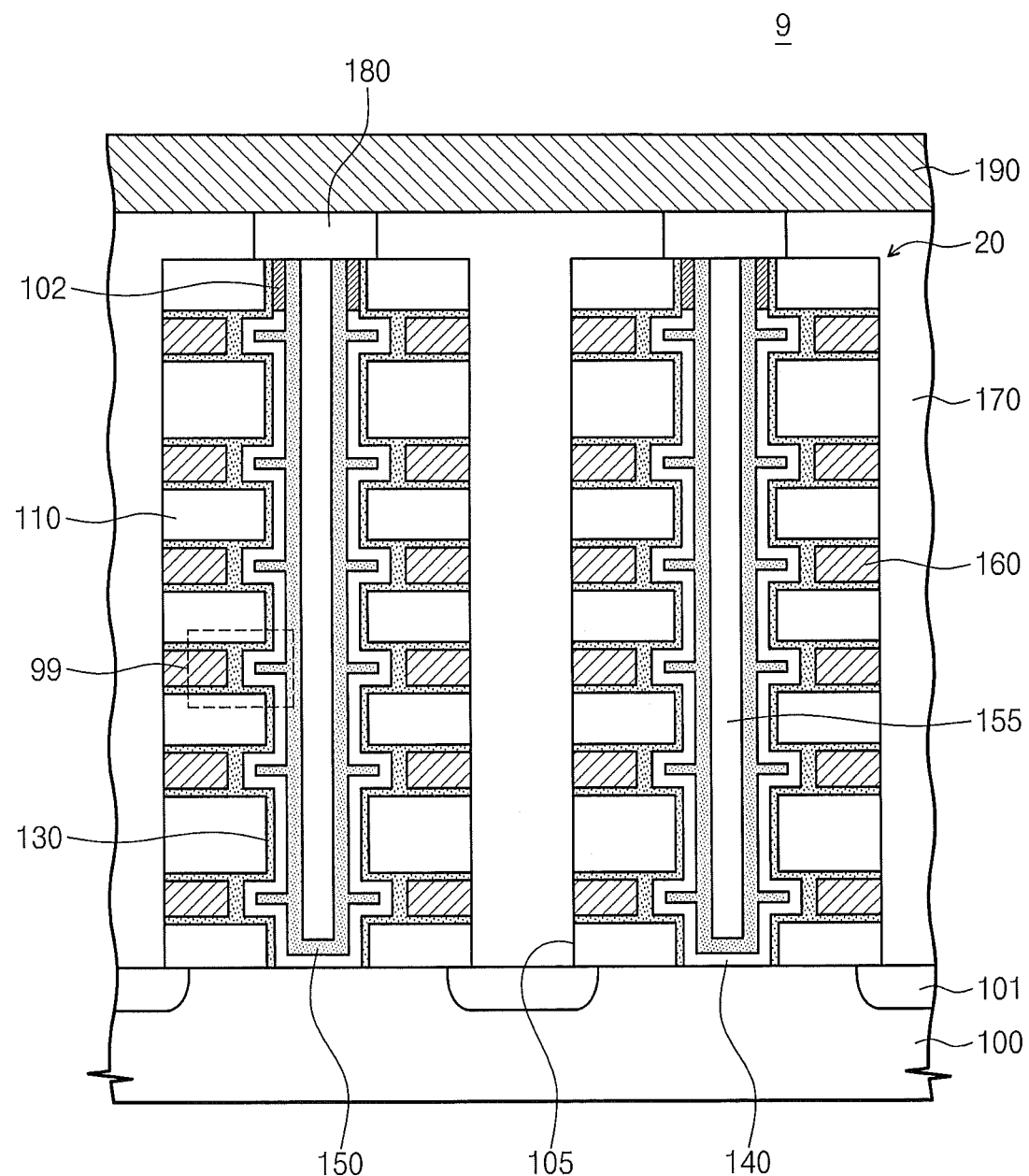
Figure 13E:
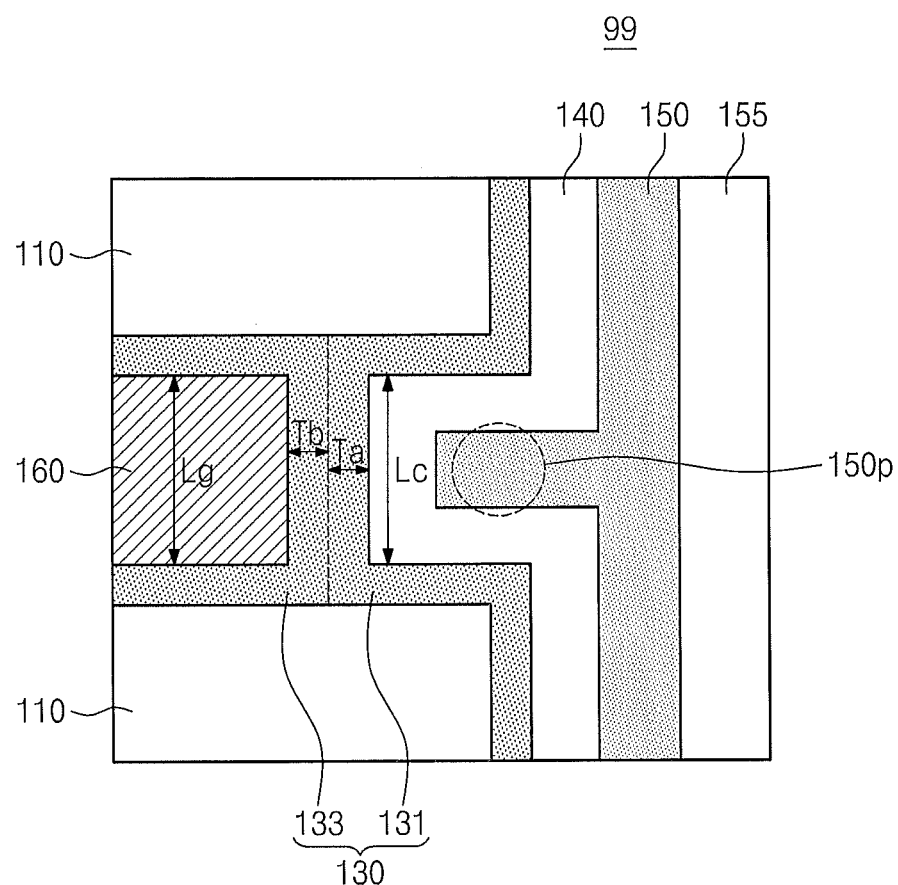
FIG. 13E is an enlarged cross section illustrating a portion of a memory cell of a resistive memory device according to some embodiments of the inventive concept.

Referring to FIG. 13D, the interlayered insulating layer 170 may be formed on the substrate 100 to fill the trench 105, the plug 180 may be formed through the interlayered insulating layer 170 to be connected to the drain electrode 102, and the bit line 190 may be formed on the interlayered insulating layer 170 to be electrically connected to the drain electrode 102 through the plug 180. As the result of the series of the processes, a ninth resistive memory device 9 can be fabricated.

Referring to FIG. 13E, a cell 99 may include the gate insulating layer 130 with the first and second gate insulating layers 131 and 133. The first gate insulating layer 131 may have a bracket-shaped portion located adjacent to the channel 140 to have the first thickness Ta. The second gate insulating layer 133 may have a bracket-shaped portion covering or facing the top and bottom surfaces of the gate 160 and the side surface of the gate 160 facing the channel 140 and having the second thickness Tb. According to some embodiments, since the first and second gate insulating layers 131 and 133 are in contact with each other between the gate 160 and the channel 140, the gate insulating layer 130 can be formed to have a desired thickness. In other words, the total thickness of the gate insulating layer 130 between the gate 160 and the channel 140 may be given by Ta+Tb.

The length Lc of the channel 140 that is overlapped with the gate 160 may be the same as or different from the thickness Lg of the gate 160. For example, in the case where the first thickness Ta and the second thickness Tb are equivalent or similar to each other, the length Lc of the channel 140 may be equivalent or similar to the thickness Lg of the gate 160. In the case where the first thickness Ta is larger than the second thickness Tb, the length Lc of the channel 140 may be shorter than the thickness Lg of the gate 160.

Figure 14A:
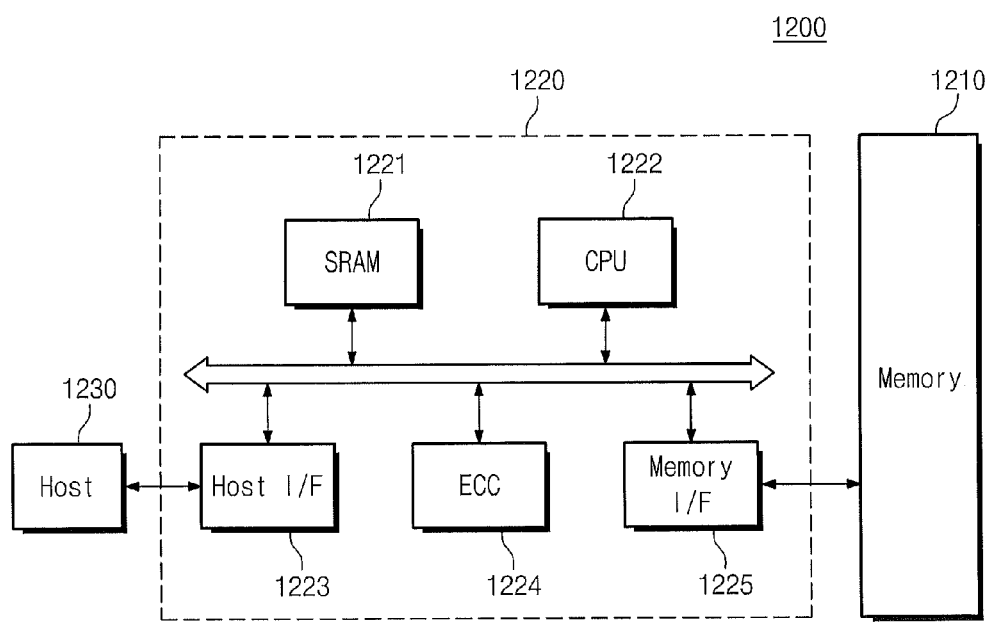
FIG. 14A is a block diagram of a memory card including a resistive memory device according to some embodiments of the inventive concept.
Figure 14B:
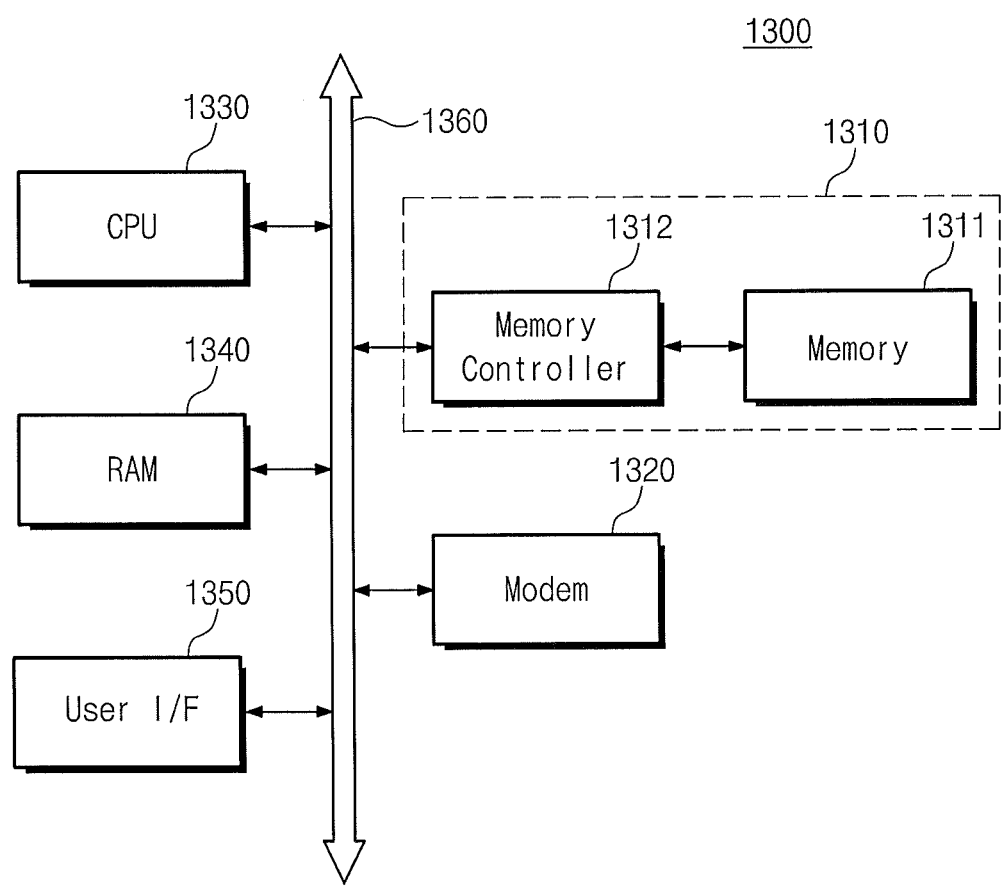
FIG. 14B is a block diagram of an information processing system including a resistive memory device according to some embodiments of the inventive concept.

FIG. 14A is a block diagram of a memory card including a resistive memory device according to some embodiments of the inventive concept. FIG. 14B is a block diagram of an information processing system including a resistive memory device according to some embodiments of the inventive concept.

Referring to FIG. 14A, a memory card 1200 may include a host 1230, a memory device 1210, and a memory controller 1220 controlling data exchanges therebetween. The memory device 1210 may include at least one of the resistive memory devices 1-9 according to some embodiments of the inventive concept. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. The processing unit 1222 may perform general control operations for data exchange of the memory controller 1220.

Referring to FIG. 14B, information processing system 1300 may be realized using a memory system 1310 including at least one of the resistive memory devices 1-9 according to some embodiments of the inventive concept. For instance, the information processing system 1300 may be a mobile device and/or a computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured substantially identical to the memory card 1200 described with respect to FIG. 14A. Data processed by the CPU 1330 and/or input from the outside may be stored in the memory system 1310.

In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the inventive concept.

According to some embodiments of the inventive concept, the variable resistance layer may include a protrusion crossing a vertically extending channel. In the case where an electric field is applied to the protrusion, an electric path can be produced therein. Accordingly, a bipolar switching operation can be achieved by changing a direction of applied electric field, and a resistive memory device can be operated with a reduced current, compared with unipolar switching devices. In addition, since electric field can be uniformly applied to the protrusion of the variable resistance layer, it is possible to improve electric characteristics of the device. Further, the gate insulating layer and the channel can be formed to have desired thicknesses, and thus, it is possible to improve electric characteristics of the device and scale down the device.

While some embodiments of the inventive concepts have been particularly shown and described, it will be understood by one of ordinary skill in the art that variations in form and detail may be made therein without departing from the spirit and scope of the attached claims.

What is claimed is:

1. A resistive memory device, comprising:
   a gate stack including mold insulating layers and gates vertically stacked on a substrate;
   a channel penetrating the gate stack in a vertical direction and electrically connected to the substrate;
   a gate insulating layer provided between the channel and the gates; and
   a variable resistance layer on the channel, wherein the variable resistance layer comprises:
   a vertical layer extending on the channel in the vertical direction; and
   a protrusion extending toward a sidewall of the gate from the vertical layer in a horizontal direction, the sidewall of the gate facing the channel;
   wherein the gates in the gate stack define an alcove, the alcove being formed by recessing the gate in the horizontal direction; and
   wherein the protrusion of variable resistance layer extends towards the alcove in the horizontal direction and overlaps with at least one of the gates in the horizontal direction.

2. The device of claim 1, wherein the channel comprises:
   a first channel portion extending on the mold insulating layer in the vertical direction to be overlapped with the protrusion in the vertical direction;
   a second channel portion extending on the gate in the vertical direction to be overlapped with the gate in the horizontal direction, the second channel portion being located in the alcove; and
   a third channel portion provided in the alcove to connect the first channel portion with the second channel portion along the horizontal direction,
   wherein the channel extends continuously along the vertical direction in the gate stack.

3. The device of claim 2, wherein the vertical layer of the variable resistance layer extends along the first channel portion in the vertical direction; and
   wherein the protrusion of the variable resistance layer is inserted into the alcove to have a length greater than a thickness of the first channel portion.

4. The device of claim 2:
   wherein the vertical layer of the variable resistance layer extends on the first channel portion in the vertical direction; and
   wherein the protrusion of the variable resistance layer is not inserted into the alcove and has a length that is equivalent to or smaller than a thickness of the first channel portion.

5. The device of claim 2, wherein the second channel portion has a thickness smaller than each of thicknesses of the first and third channel portions.

6. The device of claim 2, wherein the gate has a length greater than a length of the second channel portion.

7. The device of claim 2, wherein the gate insulating layer has a continuous structure comprising:
a first gate insulating layer disposed between a side surface of the insulating layer and the first channel portion;
a second gate insulating layer disposed in the alcove and between the gate and the second channel portion; and
a third gate insulating layer disposed in the alcove to connect the first gate insulating layer with the second gate insulating layer in the horizontal direction.

8. The device of claim 7, wherein the second gate insulating layer has a thickness greater than each thickness of the first and third gate insulating layers.

9. The device of claim 2, wherein the gate insulating layer has an island shaped structure inserted between the gate and the second channel portion.

10. The device of claim 1:
wherein the variable resistance layer comprises a plurality of protrusions configured to be inserted into the alcove; and
wherein the protrusions are discontinuously arranged on the channel in the vertical direction.

11. A resistive memory device, comprising:
a gate stack including mold insulating layers and gates vertically stacked on a substrate;
a channel penetrating the gate stack in a vertical direction and electrically connected to the substrate;
a gate insulating layer provided between the channel and the gates; and
a variable resistance layer on the channel,
wherein the variable resistance layer comprises:
a vertical layer extending on the channel in the vertical direction; and
a protrusion extending from the vertical layer in a horizontal direction;
wherein the gates in the gate stack define an alcove, the alcove being formed by recessing the gate in the horizontal direction;
wherein the variable resistance layer extends towards the alcove in the horizontal direction and overlaps with at least one of the gates in the horizontal direction;
wherein the channel comprises:
a first channel portion extending on the mold insulating layer in the vertical direction to be overlapped with the protrusion in the vertical direction;
a second channel portion extending on the gate in the vertical direction to be overlapped with the gate in the horizontal direction, the second channel portion being located in the alcove; and
a third channel portion provided in the alcove to connect the first channel portion with the second channel portion along the horizontal direction;
wherein the channel extends continuously along the vertical direction in the gate stack; and
wherein the second channel portion has a thickness smaller than each of thicknesses of the first and third channel portions.

12. A resistive memory device, comprising:
a gate stack including mold insulating layers and gates vertically stacked on a substrate;
a channel penetrating the gate stack in a vertical direction and electrically connected to the substrate;
a gate insulating layer provided between the channel and the gates; and
a variable resistance layer on the channel,
wherein the variable resistance layer comprises:
a vertical layer extending on the channel in the vertical direction; and
a protrusion extending from the vertical layer in a horizontal direction;
wherein the gates in the gate stack define an alcove, the alcove being formed by recessing the gate in the horizontal direction;
wherein the variable resistance layer extends towards the alcove in the horizontal direction and overlaps with at least one of the gates in the horizontal direction;
wherein the channel comprises:
a first channel portion extending on the mold insulating layer in the vertical direction to be overlapped with the protrusion in the vertical direction;
a second channel portion extending on the gate in the vertical direction to be overlapped with the gate in the horizontal direction, the second channel portion being located in the alcove; and
a third channel portion provided in the alcove to connect the first channel portion with the second channel portion along the horizontal direction;
wherein the channel extends continuously along the vertical direction in the gate stack; and
wherein the gate has a length greater than a length of the second channel portion.

\* \* \* \* \*